United States Patent
Nishio et al.

(10) Patent No.: US 12,317,533 B2
(45) Date of Patent: May 27, 2025

(54) SEMICONDUCTOR DEVICE FOR POWER AMPLIFICATION

(71) Applicant: Nuvoton Technology Corporation Japan, Kyoto (JP)

(72) Inventors: Akihiko Nishio, Ishikawa (JP); Hiroyuki Doi, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/846,163

(22) PCT Filed: Feb. 17, 2023

(86) PCT No.: PCT/JP2023/005728
§ 371 (c)(1),
(2) Date: Sep. 11, 2024

(87) PCT Pub. No.: WO2023/176312
PCT Pub. Date: Sep. 21, 2023

(65) Prior Publication Data
US 2025/0113525 A1    Apr. 3, 2025

(30) Foreign Application Priority Data
Mar. 18, 2022   (JP) .................. 2022-044441

(51) Int. Cl.
*H10D 30/47*  (2025.01)
*H10D 62/85*  (2025.01)
(Continued)

(52) U.S. Cl.
CPC ....... *H10D 30/475* (2025.01); *H10D 62/8503* (2025.01); *H10D 64/111* (2025.01); *H10D 64/411* (2025.01); *H10D 84/817* (2025.01)

(58) Field of Classification Search
CPC .................................. H10D 84/817
See application file for complete search history.

(56) References Cited

U.S. PATENT DOCUMENTS

| | | |
|---|---|---|
| 2015/0270254 A1 | 9/2015 | Risbud |
| 2016/0343702 A1 | 11/2016 | Tomita et al. |
| 2017/0323878 A1 | 11/2017 | Tsumura |
| 2020/0144969 A1 | 5/2020 | Mahon et al. |
| 2022/0020872 A1 | 1/2022 | De Vleeschouwer et al. |

(Continued)

FOREIGN PATENT DOCUMENTS

| | | |
|---|---|---|
| CN | 112204751 A | 1/2021 |
| CN | 113793870 A | 12/2021 |

(Continued)

OTHER PUBLICATIONS

International Search Report dated May 9, 2023 issued in International Patent Application No. PCT/JP2023/005728, with English translation.

(Continued)

*Primary Examiner* — Grant S Withers
(74) *Attorney, Agent, or Firm* — Rimon P.C.

(57) ABSTRACT

A semiconductor device for high-frequency amplification includes a substrate; a first nitride semiconductor layer above the substrate; a two-dimensional electron gas layer; a second nitride semiconductor layer; and a source electrode, a drain electrode, and a gate electrode spaced apart from each other above the first nitride semiconductor layer. In a plan view, an active region with a two-dimensional electron gas layer includes a high-electron-mobility transistor and the resistor provided above the second nitride semiconductor layer. In the plan view, a non-active region includes a drain terminal and a gate terminal connected to the drain electrode or the gate electrode; and a first resistor terminal and a second resistor terminal connected to the resistor.

18 Claims, 43 Drawing Sheets

(51) Int. Cl.
    *H10D 64/00*    (2025.01)
    *H10D 64/27*    (2025.01)
    *H10D 84/80*    (2025.01)

(56) References Cited

U.S. PATENT DOCUMENTS

| | | |
|---|---|---|
| 2022/0310469 A1 | 9/2022 | Liao et al. |
| 2022/0352362 A1 | 11/2022 | Takeuchi |
| 2024/0096726 A1* | 3/2024 | Ma .................. H03K 17/56 |
| 2024/0243029 A1 | 7/2024 | Liao et al. |

FOREIGN PATENT DOCUMENTS

| | | | |
|---|---|---|---|
| JP | S63-299264 A | 12/1998 | |
| JP | 2006-147665 A | 6/2006 | |
| JP | 2016-219632 A | 12/2016 | |
| JP | 2021-077797 A | 5/2019 | |

OTHER PUBLICATIONS

Jun Nagayama (Connectec Japan), "Semiconductor Packaging, Aiming for 30° C. Flip Chip Bonding", EE Times Japan, Published at 9:30 on Jun. 3, 2019, [URL] https://eetimes.itmedia.co.jp/ee/articles/1906/03/news019.html, with its partial English translation.

International Preliminary Report on Patentability Chapter II (IPRP2) issued on Mar. 19, 2024 in International (PCT) Application PCT/JP2023/005728 with its English translation.

Extended European Search Report mailed on Mar. 10, 2025 for the corresponding European patent application No. 23770271.7.

\* cited by examiner

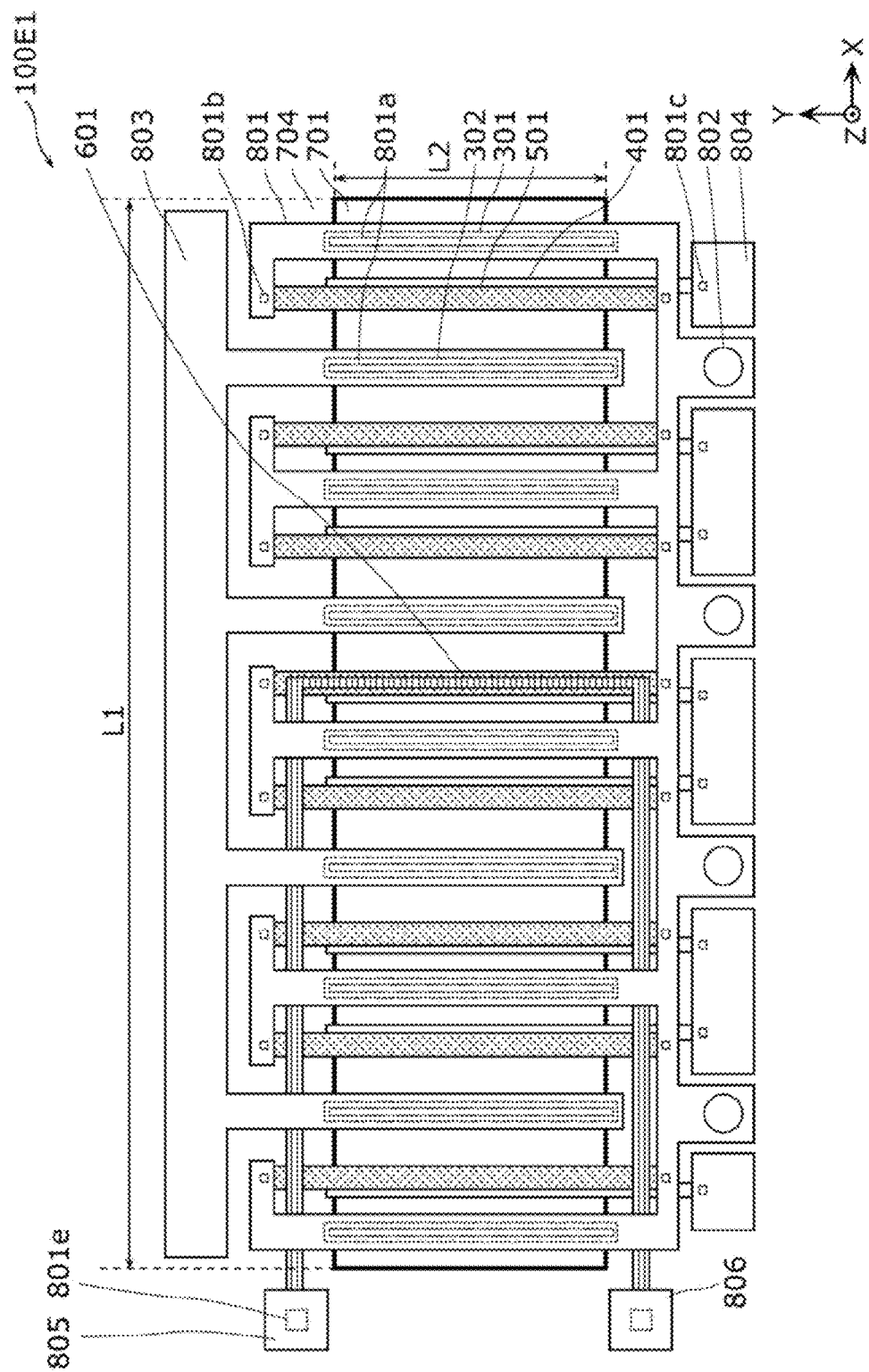

SEMICONDUCTOR DEVICE FOR POWER AMPLIFICATION

CROSS-REFERENCE TO RELATED APPLICATIONS

This application is the U.S. National Phase under 35 U.S.C. § 371 of International Patent Application No. PCT/JP2023/005728, filed on Feb. 17, 2023, which in turn claims the benefit of Japanese Patent Application No. 2022-044441, filed on Mar. 18, 2022, the entire disclosures of which Applications are incorporated by reference herein.

TECHNICAL FIELD

The present disclosure relates to a semiconductor device for power amplification.

BACKGROUND ART

A group III-V semiconductor, especially an arsenide-based semiconductor GaAs or AlGaAs or a nitride-based semiconductor GaN or AlGaN can readily form a heterostructure such as AlGaAs/GaAs or AlGaN/GaN. For a group III nitride semiconductor, a high-mobility, high-concentration electron channel (two-dimensional electron gas (2DEG)) can be generated on the GaAs side of AlGaAs/GaAs and on the GaN layer side of the AlGaN/GaN interface, by fixed electric charge due to spontaneous polarization caused by an ionic radius difference or piezoelectric polarization generated by a lattice constant difference between AlGaN and GaN, in addition to a band gap difference. A high-electron-mobility transistor (HEMT) can be made by controlling the two-dimensional electron gas as a channel. For their high-speed operation enabled by the high mobility of electrons, HEMTs are now widely used as high-frequency devices such as amplifiers and switching elements.

In recent years, commercialization of HEMTs as high-frequency amplifiers especially for cellular phone base stations has been underway, and as the generation of cellular phone communication advances, a further increase in operation frequency and further improvement in output power are called for. The increase in operation frequency and the improvement in output power lead to an increase in the quantity of heat generated from a device (e.g., a transistor) itself used as a high-frequency amplifier.

Patent Literature (PTL) 1 discloses a semiconductor device including a transistor beside which a temperature sensor is attached.

CITATION LIST

Patent Literature

[PTL 1] Japanese Unexamined Patent Application Publication No. 63-299264

SUMMARY OF INVENTION

Technical Problem

Incidentally, it is required to detect the temperature of an operating transistor with high responsiveness and control the quantity of heat generated from the transistor itself. However, in the conventional technique described in PTL 1, it is difficult to detect the temperature with high responsiveness.

In view of the above, the present disclosure provides a semiconductor device for power amplification (a semiconductor device for high-frequency amplification) capable of detecting the temperature of a transistor with high responsiveness.

Solution to Problem

A semiconductor device for power amplification according to an aspect of the present disclosure, includes: a substrate; a first nitride semiconductor layer provided above the substrate; a second nitride semiconductor layer provided above the first nitride semiconductor layer and having a band gap greater than the band gap of the first nitride semiconductor layer; a two-dimensional electron gas layer provided on the side where the first nitride semiconductor layer is present, relative to the interface between the first nitride semiconductor layer and the second nitride semiconductor layer; a source electrode and a drain electrode spaced apart from each other above the first nitride semiconductor layer, and each electrically connected to the two-dimensional electron gas layer; and a gate electrode spaced apart from the source electrode and the drain electrode and in contact with the second nitride semiconductor layer. In a plan view of the substrate, the substrate is divided into an active region including the two-dimensional electron gas layer and a non-active region without the two-dimensional electron gas layer. The active region includes: a high-electron-mobility transistor including the source electrode, the drain electrode, and the gate electrode; and a resistor for detecting a temperature provided above the second nitride semiconductor layer, and the non-active region includes: a first terminal pad connected to the drain electrode or the gate electrode; and a second terminal pad connected to the resistor.

Advantageous Effects of Invention

A semiconductor device for power amplification according to one aspect of the present disclosure can detect the temperature of a transistor with high responsiveness.

BRIEF DESCRIPTION OF DRAWINGS

FIG. 8A is a plan view illustrating a first example of a configuration of a semiconductor device for high-frequency amplification according to Variation 6 of Embodiment 1.

DESCRIPTION OF EMBODIMENTS

Embodiments of the present disclosure are described below with reference to the drawings. It should be noted that each of the embodiments described below is a preferable specific example of the present disclosure. Accordingly, the numerical values, shapes, materials, constituent elements, arrangement and connection of the constituent elements, steps (processes), order of steps (processes), and other details indicated in the embodiments described below are merely examples, and do not intend to limit the present disclosure. Thus, among the constituent elements included in the embodiments below, those not recited in any of the independent claims, which indicate the superordinate concepts of the present disclosure, are described as optional constituent elements.

In addition, the figures are schematic illustrations and are not necessarily precise depictions. Accordingly, the scales used in the figures are not necessarily the same. In the figures, substantially the same constituent elements are assigned the same reference signs, and overlapping explanations are omitted or simplified.

In the Specification, the terms "above" and "below" used to describe a configuration of a semiconductor device for high-frequency amplification do not indicate the upward direction (vertically upward) or the downward direction (vertically downward) in absolute spatial recognition, and are terms determined by a relative positional relationship based on the stacking order in a layered structure. In addition, the terms "above" and "below" are used not only when two constituent elements are spaced apart from each other and another element is present between the two constituent elements, but also when the two constituent elements are disposed in contact with each other.

In addition, in the Specification and Drawings, the X-axis, the Y-axis, and the Z-axis indicate the three axes of the right-handed three-dimensional orthogonal coordinate system. In the embodiments and variations, the stacking direction of the layers of a semiconductor device for high-frequency amplification is referred to as a Z-axis direction, and two axes parallel to a main surface of the semiconductor device for high-frequency amplification are referred to as the X-axis and the Y-axis. In addition, the term "in a/the plan view" in the Specification means that the semiconductor device for high-frequency amplification is viewed in the Z-axis direction.

In addition, in the Specification, terms each indicating a relationship between elements, such as orthogonal, parallel, and identical, terms each indicating the shape of an element, such as rectangular, numerical values, and numerical ranges are not expressions indicating strict meanings, but expressions including differences of, for example, around several percent (or around 10%).

Embodiment 1

[1-1. Configuration of Semiconductor Device for High-Frequency Amplification]

Figure 1:
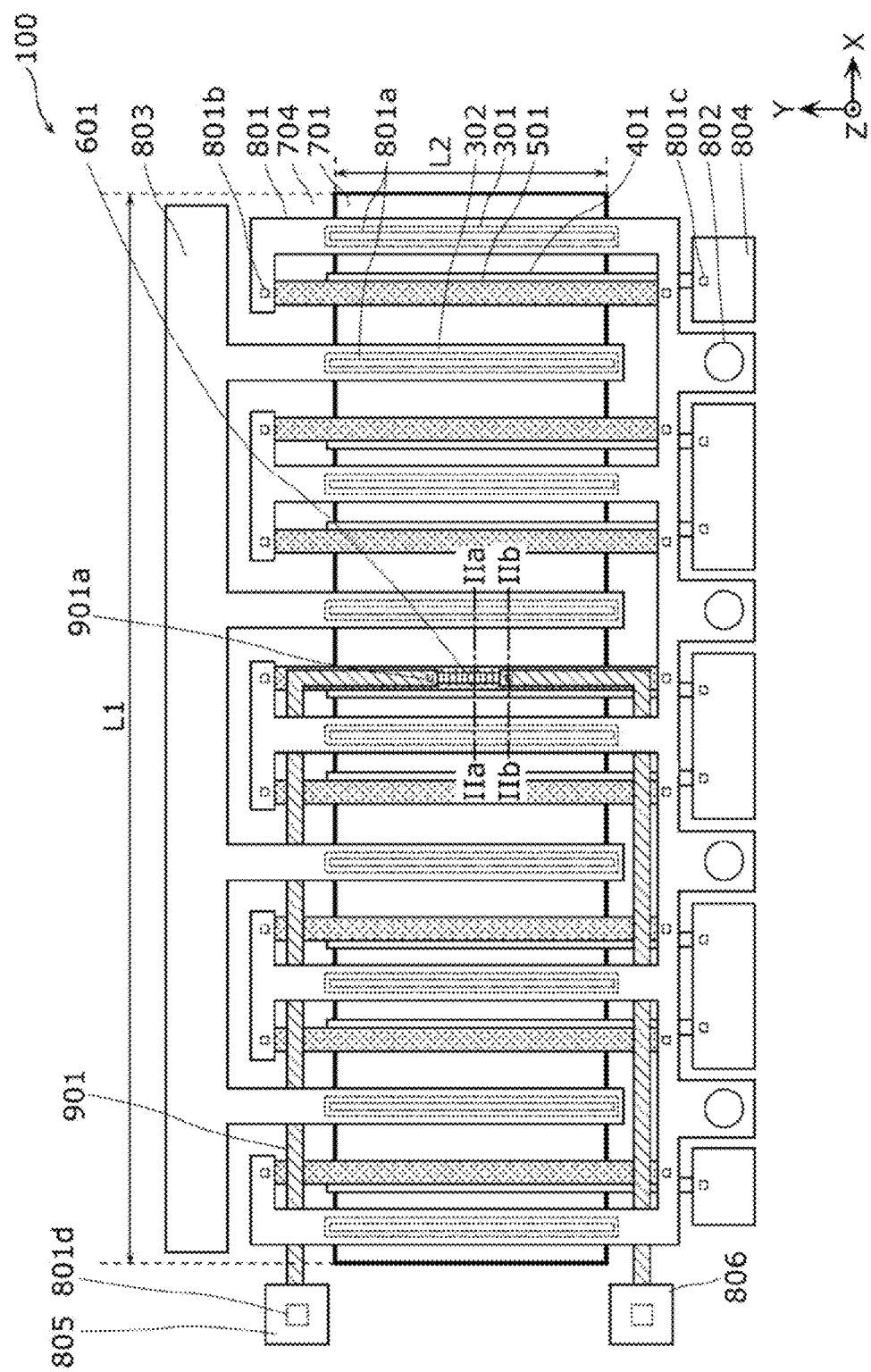
FIG. 1 is a plan view illustrating a configuration of a semiconductor device for high-frequency amplification according to Embodiment 1.
Figure 2A:
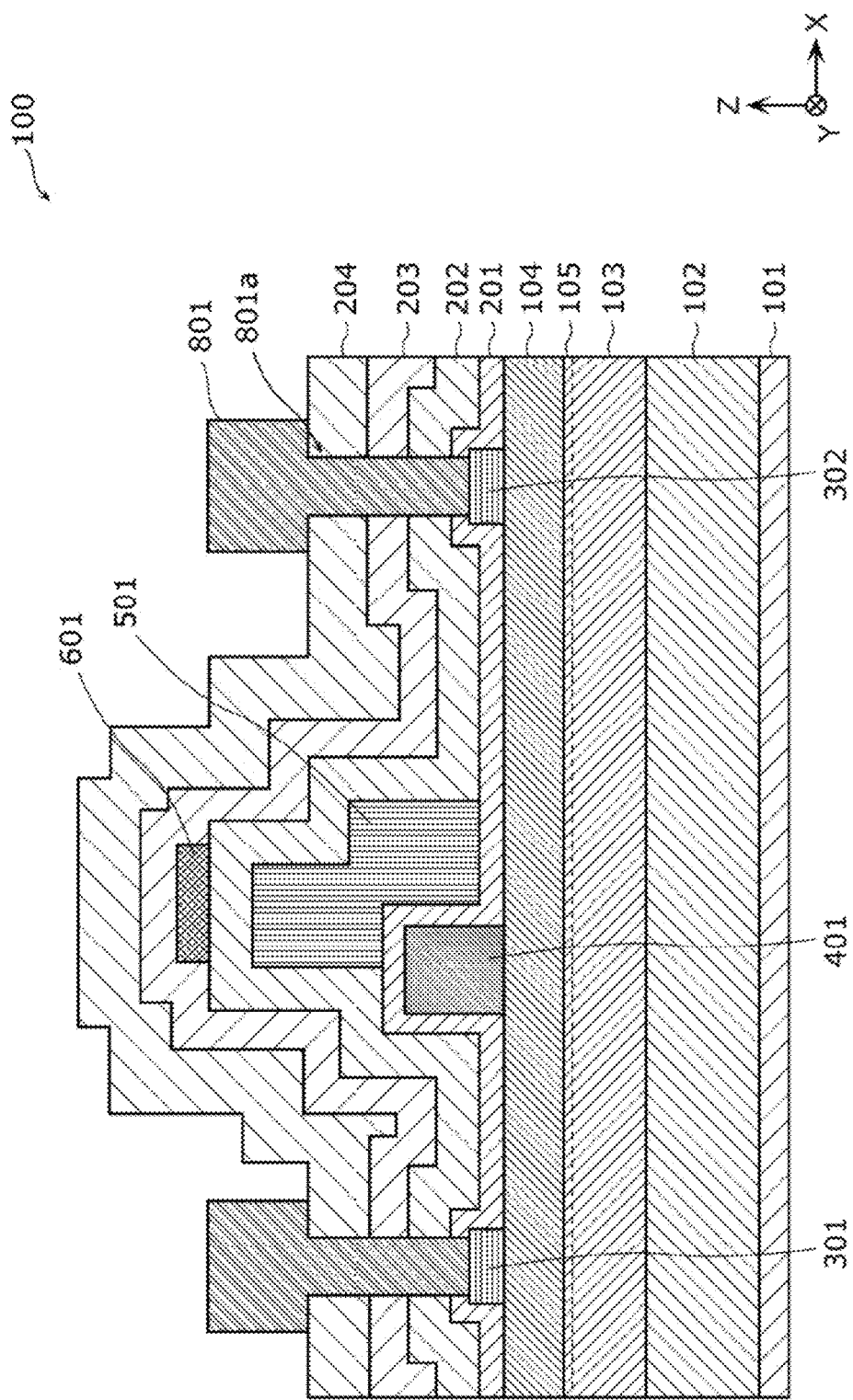
FIG. 2A is a cross-sectional view illustrating a configuration of the semiconductor device for high-frequency amplification, along line IIa-IIa in FIG. 1.
Figure 2B:
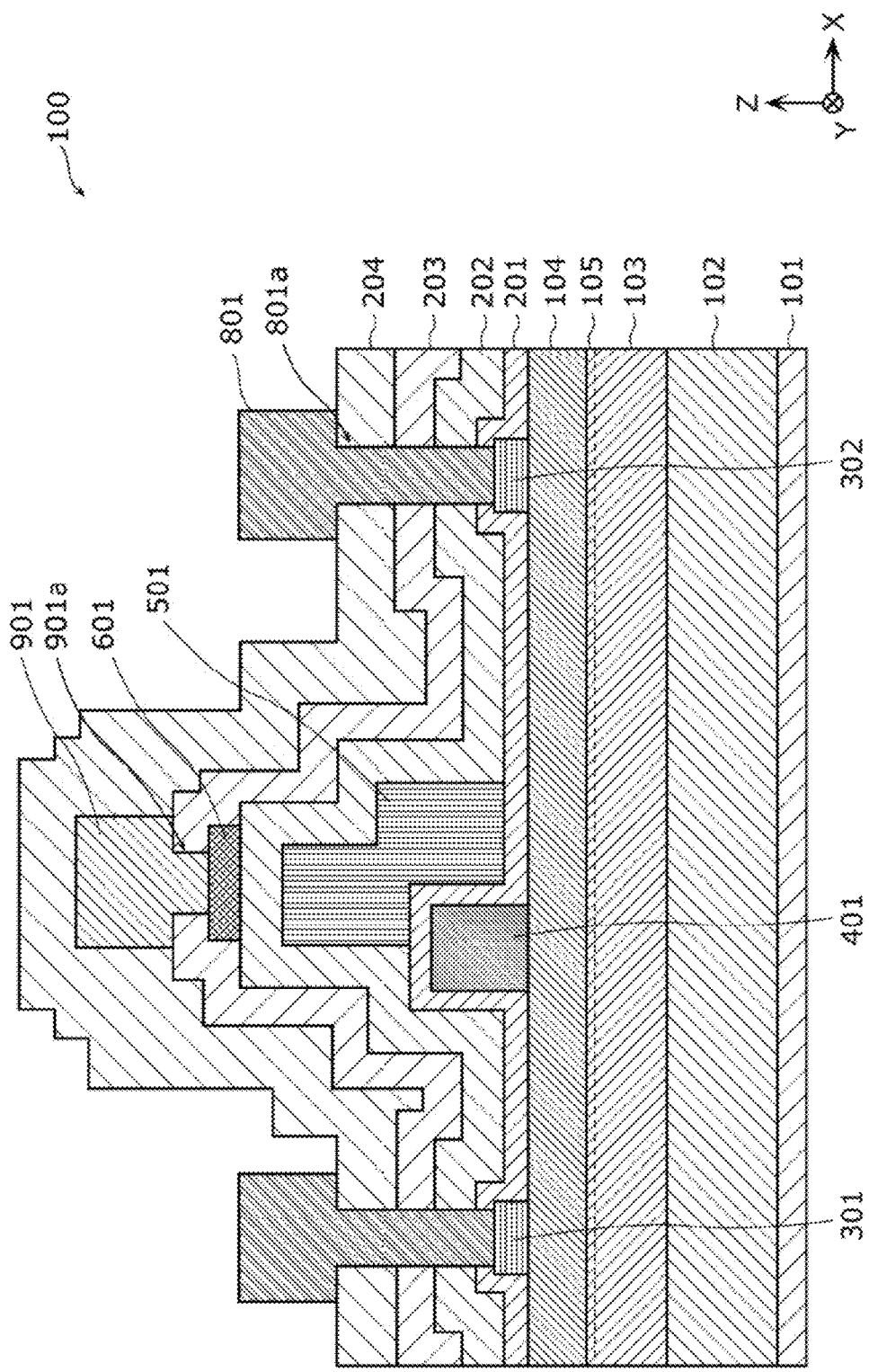
FIG. 2B is a cross-sectional view illustrating a configuration of the semiconductor device for high-frequency amplification, along line IIb-IIb in FIG. 1.

First, a configuration of a semiconductor device for high-frequency amplification according to Embodiment 1 is described with reference to FIGS. 1, 2A, and 2B. FIG. 1 is a plan view illustrating a configuration of semiconductor device for high-frequency amplification 100 according to Embodiment 1. FIG. 2A is a cross-sectional view illustrating a configuration of semiconductor device for high-frequency amplification 100, along line IIa-IIa in FIG. 1. FIG. 2B is a cross-sectional view illustrating a configuration of semiconductor device for high-frequency amplification 100, along line IIb-IIb in FIG. 1.

It should be noted that in FIG. 1, in order to facilitate recognition of positional relationships, source electrode 301, drain electrode 302, openings 801a for connection to the source and drain electrodes, opening 801c for connection to a gate electrode, and opening 801d for connection to a second interconnect layer which are disposed below first interconnect layer 801 and opening 901a for connection to a resistor disposed below second interconnect layer 901 are indicated by the dashed lines. In addition, in FIG. 1, for the purpose of differentiation, source field plate electrode 501 is dot hatched, resistor 601 is hatched with horizontal lines, second interconnect layer 901 is hatched with diagonal lines, and first interconnect layer 801 and others are not hatched. It should be noted that the same applies to the plan view in Variation 1 of Embodiment 1 and the subsequent plan views.

As illustrated in FIGS. 1, 2A, and 2B, semiconductor device for high-frequency amplification 100 includes substrate 101, buffer layer 102, first nitride semiconductor layer 103, second nitride semiconductor layer 104, first insulating layer 201, second insulating layer 202, third insulating layer 203, fourth insulating layer 204, source electrode 301, drain electrode 302, gate electrode 401, source field plate electrode 501, resistor 601, active region 701, non-active region 704, first interconnect layer 801, openings 801a for connection to the source and drain electrodes, opening 801b for connection to the source field plate electrode, opening 801c for connection to the gate electrode, opening 801d for connection to the second interconnect layer, source via hole 802, drain terminal 803, gate terminal 804, first resistor terminal 805, second resistor terminal 806, second interconnect layer 901, and opening 901a for connection to the resistor.

In addition, in semiconductor device for high-frequency amplification 100, two-dimensional electron gas layer 105 is formed on the first nitride semiconductor layer 103 side of the heterointerface between second nitride semiconductor layer 104 and first nitride semiconductor layer 103. It should be noted that semiconductor device for high-frequency amplification 100 is an example of a semiconductor device for power amplification (which may be hereinafter referred to as a semiconductor chip for power amplification or simply a chip).

Substrate 101 is, for example, a Si substrate. Substrate 101 is not limited to a Si substrate and may be a substrate such as a Sapphire substrate, a SiC substrate, a GaN substrate, or an AlN substrate.

Buffer layer 102 is formed above substrate 101. Buffer layer 102 is, for example, a nitride semiconductor layer having an AlN/AlGaN layered structure having a thickness of 2 μm. Alternatively, buffer layer 102 may be a single layer of a group III nitride semiconductor, such as GaN, AlGaN, AlN, InGaN, or AlInGaN, or include a plurality of layers of the above group III nitride semiconductors.

First nitride semiconductor layer 103 is formed above substrate 101. In Embodiment 1, first nitride semiconductor layer 103 is formed above buffer layer 102. First nitride semiconductor layer 103 contains, for example, undoped (i-type) GaN having a thickness of 200 nm. Undoped (i-type) means not being intentionally doped with impurities during epitaxial growth. First nitride semiconductor layer 103 may contain a group III nitride semiconductor such as AlGaN, InGaN, or AlInGaN, other than GaN. In addition, first nitride semiconductor layer 103 is not limited to being undoped (i-type), and may contain n-type impurities such as Si.

Second nitride semiconductor layer 104 is formed above first nitride semiconductor layer 103. Second nitride semiconductor layer 104 contains, for example, undoped (i-type) AlGaN having a thickness of 20 nm and a composition of 25% Al.

It should be noted that second nitride semiconductor layer 104 is not limited to AlGaN, and may contain a group III nitride semiconductor such as AlN, InGaN, or AlInGaN. In addition, second nitride semiconductor layer 104 may contain n-type impurities.

In addition, for example, a GaN semiconductor layer having a thickness of around 1 to 2 nm and a SiN protective insulating layer having a thickness of around 2 to 5 nm may be provided above second nitride semiconductor layer 104 as cap layers.

In Embodiment 1, second nitride semiconductor layer 104 has a band gap greater than the band gap of first nitride semiconductor layer 103. In addition, second nitride semiconductor layer 104 containing undoped (i-type) AlGaN and first nitride semiconductor layer 103 containing undoped (i-type) GaN form a heterostructure. That is, the interface between second nitride semiconductor layer 104 and first nitride semiconductor layer 103 is a heterojunction, and a hetero-barrier is formed on the interface between second nitride semiconductor layer 104 and first nitride semiconductor layer 103.

As a result, two-dimensional electron gas layer 105 is formed near the boundary between first nitride semiconductor layer 103 and second nitride semiconductor layer 104. For instance, two-dimensional electron gas layer 105 is formed on the first t nitride semiconductor layer 103 side of the heterointerface between second nitride semiconductor layer 104 and first nitride semiconductor layer 103 (in other words, in a portion on the second nitride semiconductor layer 104 side of first nitride semiconductor layer 103). For instance, two-dimensional electron gas layer 105 is provided on the first nitride semiconductor layer 103 side of the interface between first nitride semiconductor layer 103 and second nitride semiconductor layer 104.

It should be noted that as a spacer layer, for example, an AlN semiconductor layer having a thickness of around 1 to 2 nm may be provided between second nitride semiconductor layer 104 and first nitride semiconductor layer 103.

Source electrode 301 and drain electrode 302 are spaced apart from each other so as to be opposite each other above second nitride semiconductor layer 104. Each of source electrode 301 and drain electrode 302 is electrically connected to first nitride semiconductor layer 103. Examples of source electrode 301 and drain electrode 302 include, but not limited to, a multi-layered electrode film having a layered structure in which a Ti film and an Al film are sequentially stacked. In addition, source electrode 301 and drain electrode 302 are electrically connected to two-dimensional electron gas layer 105 (for example, an ohmic connection is made).

It should be noted that, for example, recesses formed by removing a portion of second nitride semiconductor layer 104 and/or a portion of first nitride semiconductor layer 103 and contact layers containing n-type impurities containing a donor such as Si may be provided below source electrode 301 and drain electrode 302. In addition, the contact layers containing the n-type impurities may be formed through, for example, plasma treatment, ion implantation, and regrowth.

Gate electrode 401 is provided between source electrode 301 and drain electrode 302, above second nitride semiconductor layer 104. Gate electrode 401 is spaced apart from source electrode 301 and drain electrode 302. Examples of gate electrode 401 include, but not limited to, a multi-layered electrode film having a layered structure in which a Ni film and a Au film are sequentially stacked. In addition, gate electrode 401 may be electrically connected to two-dimensional electron gas layer 105 by Schottky contact. In addition, a metal-insulator-semiconductor or MIS structure may be formed in which an insulating layer is interposed between gate electrode 401 and second nitride semiconductor layer 104 to electrically insulate between gate electrode 401 and second nitride semiconductor layer 104.

Gate electrode 401 extends in a Y-axis direction in a plan view. In the plan view, gate electrode 401 is rectangular, and a longitudinal direction of gate electrode 401 is parallel to the Y-axis direction. The Y-axis direction is an example of a first direction.

Gate electrode 401 may be, for example, one of Ni, Ta, Ti, W, TaN, TiN, Pt, Pd, Al, Au, Cu, or Ag or an alloy including at least one of the above. In addition, gate electrode 401 may be a single layer (a single film) or a stack of layers (a layered film).

First insulating layer 201 is provided above source electrode 301, drain electrode 302, and gate electrode 401. First insulating layer 201 contains at least one of SiN, $SiO_2$, SiON, AlN, $Al_2O_3$, SiC, or C (diamond). In Embodiment 1, first insulating layer 201 contains SiN having a thickness of 150 nm. In addition, first insulating layer 201 may be a single layer or a stack of layers. It should be noted that SiC and C (diamond) are highly heat-conductive materials having a predetermined heat conductivity or higher.

Source field plate electrode 501 has the same electric potential as source electrode 301. The end of source field plate electrode 501 on the drain electrode 302 side is between gate electrode 401 and drain electrode 302. Source field plate electrode 501 is provided above second nitride semiconductor layer 104. Specifically, source field plate electrode 501 is provided above first insulating layer 201 so that source field plate electrode 501 is closer to drain electrode 302 than the end of gate electrode 401 on the source electrode 301 side is and the end of source field plate electrode 501 on the drain electrode 302 side is between gate electrode 401 and drain electrode 302. In addition, in the plan view, source field plate electrode 501 is provided parallel to the longitudinal direction of gate electrode 401. Examples of source field plate electrode 501 include, but not limited to, a multi-layered electrode film having a layered structure in which a Ti film and an Al film are sequentially stacked.

Source field plate electrode 501 is connected to first interconnect layer 801 via opening 801b for connection to the source field plate electrode, first interconnect layer 801 being connected to source electrode 301 via opening 801a for connection to the source and drain electrodes. Source field plate electrode 501 is an example of a field plate.

Source field plate electrode 501 may be, for example, one of Ni, Ta, Ti, W, TaN, TiN, Pt, Pd, Al, Au, Cu, or Ag or an alloy including at least one of the above. In addition, source field plate electrode 501 may be a single layer or a stack of layers. It should be noted that Cu and Ag are highly heat-conductive materials having a predetermined heat conductivity or higher.

Second insulating layer 202 is provided above first insulating layer 201 and source field plate electrode 501. Second insulating layer 202 contains at least one of SiN, $SiO_2$, SiON, AlN, Al$_2$O$_3$, SiC, or C (diamond). In Embodiment 1, second insulating layer 202 contains SiN having a thickness of 100 nm. In addition, second insulating layer 202 may be a single layer or a stack of layers.

Resistor 601 is within active region 701 in the plan view and above second nitride semiconductor layer 104 (on the positive side of the Z-axis) in a cross-sectional view. Resistor 601 is a temperature detection resistor for detecting, as a change in the resistance value, a change in the temperature of a transistor for high-frequency amplification (an example of a device), which is described later. In Embodiment 1, resistor 601 is provided above second insulating layer 202. In addition, in Embodiment 1, resistor 601 is provided above source field plate electrode 501. That is, in the plan view, resistor 601 at least partially overlaps source field plate electrode 501. In addition, in Embodiment 1, in the plan view, resistor 601 at least partially overlaps gate electrode 401. For instance, in the plan view, resistor 601 at least partially overlaps the overlapping portion of source field plate electrode 501 and gate electrode 401. It should be noted that in the plan view, resistor 601 cannot be provided in non-overlapping portions with source field plate electrode 501 and/or gate electrode 401, within active region 701.

The end of resistor 601 on the source electrode 301 side (the negative side of the X-axis) is closer to drain electrode 302 (on the positive side of the X-axis) than the end of source field plate electrode 501 on the source electrode 301 side (the negative side of the X-axis) is. In addition, the end of resistor 601 on the drain electrode 302 side (the positive side of the X-axis) is closer to source electrode 301 (on the negative side of the X-axis) than the end of source field plate electrode 501 on the drain electrode 302 side (the positive side of the X-axis) is. Thus, it is possible to suppress an increase in the parasitic capacitance due to resistor 601.

Resistor 601 extends in the Y-axis direction in the plan view. In the plan view, resistor 601 is rectangular, and a longitudinal direction of resistor 601 is parallel to the Y-axis direction. For instance, in the plan view, the longitudinal direction of resistor 601 is parallel to the longitudinal direction (an extending direction) of gate electrode 401. In other words, the longitudinal direction of resistor 601 corresponds to the first direction. In the plan view, resistor 601 is rectangular and long in the Y-axis direction, for example. Resistor 601 is a long rectangular resistor covering from below two openings 901a for connection to the resistor provided in the Y-axis direction. It should be noted that the plan-view shape of resistor 601 is not limited to the above example.

The width (the length in an X-axis direction) of resistor 601 is, for example, less than or equal to the width (the length in the X-axis direction) of source field plate electrode 501 and/or the width (the length in the X-axis direction) of gate electrode 401. However, the width of resistor 601 is not limited to the above example. The thickness (the length in a Z-axis direction) of resistor 601 is, for example, less than or equal to the thickness (the length in the Z-axis direction) of source field plate electrode 501 and/or the thickness (the length in the Z-axis direction) of gate electrode 401. However, the thickness of resistor 601 is not limited to the above example.

Resistor 601 is, for example, a multi-layered electrode film having a layered structure in which a Ti film and an Al film are sequentially stacked. However, the film combination is not limited to the combination of Ti and Al. Resistor 601 may be a single-layer electrode film containing one of metals, such as Ti, Al, Cu, Ni, Au, Pt, Pd, Ta, W, Si, and Hf, may be a multi-layered electrode film configured by combining two or more metals out of the above metals, may be an electrode film formed by alloying two or more of the above metals, may be a conductive chemical compound obtained by nitriding or oxidizing one or more of the above metals, and may be a combination of the conductive chemical compound and the electrode film. In addition, resistor 601 may contain the same metal as gate electrode 401 or may contain a metal different from the metal contained in gate electrode 401.

Third insulating layer 203 is formed above second insulating layer 202 and resistor 601. Third insulating layer 203 contains at least one of SiN, SiO$_2$, SiON, AlN, Al$_2$O$_3$, SiC, or C (diamond). In Embodiment 1, third insulating layer 203 contains SiN having a thickness of 200 nm. In addition, third insulating layer 203 may be a single layer (a single film) or a stack of layers (a layered film).

Fourth insulating layer 204 is formed above third insulating layer 203. Fourth insulating layer 204 contains at least one of SiN, SiO$_2$, SiON, AlN, Al$_2$O$_3$, SiC, or C (diamond). In Embodiment 1, fourth insulating layer 204 contains SiN having a thickness of 200 nm. In addition, fourth insulating layer 204 may be a single layer (a single film) or a stack of layers (a layered film).

In the plan view, active region 701 is a region (a region within substrate 101) where two-dimensional electron gas layer 105 is present. When a direction orthogonal to the longitudinal direction of gate electrode 401 is defined as the X-axis direction, the length in the X-axis direction of active region 701 is defined as L1. When a direction parallel to the longitudinal direction of gate electrode 401 is defined as the Y-axis direction, the length in the Y-axis direction of active region 701 is defined as L2. The X-axis direction is a direction orthogonal to the first direction in the plan view and an example of a second direction.

The transistor for high-frequency amplification (a high-frequency amplifier) including at least source electrode 301, drain electrode 302, and gate electrode 401 is formed within active region 701. In Embodiment 1, the transistor for high-frequency amplification includes source field plate electrode 501 in addition to source electrode 301, drain electrode 302, and gate electrode 401.

Non-active region 704 is a region within substrate 101 that is outside active region 701, and an area where two-dimensional electron gas layer 105 is not present. Non-active region 704 may be formed by implanting a molecule containing one of, for example, He, B, H, F, or Fe or may be formed by partially removing second nitride semiconductor layer 104, first nitride semiconductor layer 103, and buffer layer 102 viewed in the plan view and implanting a molecule containing one of He, B, H, F, or Fe into the remaining area. In addition, non-active region 704 may be formed by partially removing second nitride semiconductor layer 104, first nitride semiconductor layer 103, and buffer layer 102 viewed in the plan view. It should be noted that the state of two-dimensional electron gas layer 105 not being present includes the state in which electrons are substantially not present, in addition to the state in which there are no electrons.

Thus, in the plan view, substrate 101 is divided into active region 701 including two-dimensional electron gas layer 105 and non-active region 704 without two-dimensional electron gas layer 105.

First interconnect layer 801 is formed above fourth insulating layer 204. Examples of first interconnect layer 801 include, but not limited to, a multi-layered metal layer having a layered structure in which a Au layer is formed above a Ti layer.

Source electrode 301 and drain electrode 302 are electrically connected to first interconnect layer 801 by covering, with first interconnect layer 801, openings 801a for connection to the source and drain electrodes provided in fourth insulating layer 204, third insulating layer 203, second insulating layer 202, and first insulating layer 201 and reaching source electrode 301 and drain electrode 302.

Source field plate electrode 501 and source electrode 301 are electrically connected by covering, with first interconnect layer 801, opening 801b for connection to the source field plate electrode provided in fourth insulating layer 204, third insulating layer 203, and second insulating layer 202 and reaching source field plate electrode 501. In the plan view, opening 801b for connection to the source field plate electrode is formed in a Y-axis-direction-side portion of the region (non-active region 704) outside active region 701.

Source electrode 301 and source field plate electrode 501 are connected to a back surface metal (not illustrated) provided on the back surface of substrate 101 through source via hole 802 provided in a Y-axis-direction-side portion of the region outside active region 701, provided in fourth insulating layer 204, third insulating layer 203, second insulating layer 202, first insulating layer 201, second nitride semiconductor layer 104, first nitride semiconductor layer 103, buffer layer 102, and substrate 101, and reaching the back surface of substrate 101. Source electrode 301 and source field plate electrode 501 have a reference electric potential.

In the plan view, in the Y-axis-direction-side portion of non-active region 704, drain terminal 803 is formed of first interconnect layer 801, and drain terminal 803 is connected to drain electrode 302.

Gate electrode 401 and first interconnect layer 801 (gate terminal 804) are electrically connected by covering, with first interconnect layer 801, opening 801c for connection to the gate electrode formed in the Y-axis-direction-side portion of the region outside active region 701 in the plan view, provided in fourth insulating layer 204, second insulating layer 202, and first insulating layer 201, and reaching gate electrode 401.

In the plan view, in the portion on the opposite side (on the negative side of the Y-axis) from drain terminal 803 in the Y-axis direction of non-active region 704, gate terminal 804 is formed of first interconnect layer 801. Gate terminal 804 is connected to gate electrode 401.

Second interconnect layers 901 are interconnect layers for connecting resistor 601 to first resistor terminal 805 and second resistor terminal 806, and are provided between third insulating layer 203 and fourth insulating layer 204. Second interconnect layers 901 are connected to both sides of resistor 601 via openings 901a for connection to the resistor. Examples of second interconnect layer 901 include, but not limited to, a multi-layered metal layer having a layered structure in which a Au layer is formed above a Ti layer.

Resistor 601 and second interconnect layers 901 are electrically connected by covering, with second interconnect layers 901, openings 901a for connection to the resistor provided in third insulating layer 203 and reaching resistor 601.

Drain terminal 803, which is in the Y-axis-direction-side portion of the region outside active region 701, is connected to drain electrode 302 via opening 801a for connection to the source and drain electrodes. Drain terminal 803 is formed of first interconnect layer 801.

Gate terminal 804 is connected to gate electrode 401 via opening 801c for connection to the gate electrode. Gate terminal 804 is formed of first interconnect layer 801.

At least one of drain terminal 803 or gate terminal 804 is an example of a first terminal pad. The first terminal pad is a portion electrically connected to a component outside the chip (e.g., a packaging substrate or a semiconductor package) by connecting, for example, a wire to the first terminal pad and is, for example, connected to drain electrode 302 or gate electrode 401. In addition, for example, the first terminal pad is disposed in a region aligned with active region 701 in the extending direction of gate electrode 401 (the Y-axis direction), within non-active region 704.

Source via hole 802 connects the back surface metal and first interconnect layer 801 connected to source electrode 301 through opening 801a for connection to the source and drain electrodes.

First resistor terminal 805 and second resistor terminal 806 are connected to resistor 601 via second interconnect layers 901, and are connected by, for example, a wire, to a processing unit or an electronic component for temperature detection outside semiconductor device for high-frequency amplification 100. First resistor terminal 805 is connected to the end of resistor 601 on the positive side of the Y-axis (one end in the longitudinal direction of the resistor) via second interconnect layer 901. Second resistor terminal 806 is connected to the end of resistor 601 on the negative side of the Y-axis (the other end in the longitudinal direction) via second interconnect layer 901. In other words, each of both ends of resistor 601 is connected to a different one of first resistor terminal 805 or second resistor terminal 806.

At least one of first resistor terminal 805 or second resistor terminal 806 is an example of a second terminal pad connected to resistor 601. For instance, the second terminal pad is a portion electrically connected to a part outside the chip (e.g., a packaging substrate or a semiconductor package) by connecting, for example, a wire to the second terminal pad. The second terminal pad is disposed in a region aligned with active region 701 in a direction (the X-axis direction) orthogonal to the extending direction of gate electrode 401 (the Y-axis direction), within non-active region 704.

First resistor terminal 805 and second resistor terminal 806 are provided in an X-axis-direction-side portion of the region (non-active region 704) outside active region 701, and are connected to second interconnect layers 901 through openings 801d for connection to the second interconnect layers.

In the plan view, for instance, first resistor terminal 805 and second resistor terminal 806 are provided in the portion on the negative side of the X-axis among the X-axis-direction-side portions of the region outside active region 701. For instance, first resistor terminal 805 and second resistor terminal 806 are provided on the same side of semiconductor device for high-frequency amplification 100.

First resistor terminal 805 and second resistor terminal 806 are terminal pads (the second terminal pads) which are different from the terminal pads (the first terminal pads) connected to the transistor for high-frequency amplification. The terminal pads connected to the transistor for high-frequency amplification are, for example, drain terminal 803 and gate terminal 804.

First resistor terminal 805 and second resistor terminal 806 are, for example, formed of first interconnect layer 801.

Thus, gate terminal 804 and drain terminal 803 are disposed in the Y-axis direction in non-active region 704, whereas first resistor terminal 805 and second resistor terminal 806 are disposed in the X-axis-direction-side portion of non-active region 704. Accordingly, it is possible to detect a change in the resistance value of resistor 601 with high responsiveness, without inhibiting an input signal from gate terminal 804 and an output signal from drain terminal 803 during the high-frequency operation.

It should be noted that first resistor terminal 805 and second resistor terminal 806 are electrically connected to second interconnect layers 901 by covering, with first interconnect layer 801 (e.g., first resistor terminal 805 and second resistor terminal 806), openings 801d for connection to the second interconnect layers which are provided in an insulating layer between first resistor terminal 805 and second interconnect layer 901 and between second resistor terminal 806 and second interconnect layer 901 in non-active region 704 and reach second interconnect layers 901 each connected to a different one of both ends of resistor 601.

As described above, in semiconductor device for high-frequency amplification 100, another element (e.g., an electronic component) is not connected between resistor 601 and first resistor terminal 805 and between resistor 601 and second resistor terminal 806. First resistor terminal 805 and second resistor terminal 806 are connected to resistor 601 without via another electronic component. The end of resistor 601 on the positive side of the Y-axis and first resistor terminal 805 are directly connected via one of second interconnect layers 901 (interconnections), and the end of resistor 601 on the negative side of the Y-axis and second resistor terminal 806 are directly connected via the other of second interconnect layers 901 (interconnections).

[1-2. Effects of Semiconductor Device for High-Frequency Amplification]

In semiconductor device for high-frequency amplification 100 according to Embodiment 1, since resistor 601 serving as a temperature sensor is disposed in active region 701 of the transistor that generates heat (e.g., a transistor for high-frequency amplification), it is possible to follow the temperature distribution within active region 701 and detect a temperature change in the operating transistor with high responsiveness. For instance, in semiconductor device for high-frequency amplification 100, a temperature change due to heat generated during the operation of the transistor near the end of gate electrode 401 on the drain electrode 302 side that is closest to resistor 601 can be detected as the change in the resistance value of resistor 601 with high responsiveness. In addition, resistor 601 is disposed above second nitride semiconductor layer 104, and the temperature of the transistor is output from first resistor terminal 805 and second resistor terminal 806. By doing so, it is possible to detect the temperature of the transistor with high responsiveness without affecting the operation of the transistor. It should be noted that high responsiveness means a temperature change within the active region is immediately reflected in the temperature detected by the temperature sensor.

It should be noted that although PTL 1 discloses that the temperature sensor is in the non-active region, PTL 1 does not disclose that the temperature sensor is in the active region, which is a heat source. Thus, in the technique disclosed in PTL 1, it is difficult to detect the temperature with high responsiveness. In particular, when transistors (devices) are disposed at regular intervals within an active region, heat generation tends to be concentrated in a central portion of the active region in terms of the temperature distribution within the active region. Thus, as in the case of PTL 1, for a temperature sensor disposed in a non-active region, it is difficult to follow the temperature distribution within an active region. It should be noted that to follow means to maintain the state in which the temperature detected by the temperature sensor is close to the real current temperature within the active region.

Meanwhile, in Embodiment 1, in the plan view, resistor 601 is provided within active region 701, which makes it easier to detect a temperature change near the center of active region 701 where heat generation tends to be concentrated. Thus, the temperature obtained using resistor 601 can be the temperature following the temperature within active region 701.

As described above, semiconductor device for high-frequency amplification 100 according to Embodiment 1 includes substrate 101; first nitride semiconductor layer 103 provided above substrate 101; second nitride semiconductor layer 104 provided above first nitride semiconductor layer 103 and having a band gap greater than the band gap of first nitride semiconductor layer 103; two-dimensional electron gas layer 105 provided on the side where first nitride semiconductor layer 103 is present, relative to the interface between first nitride semiconductor layer 103 and second nitride semiconductor layer 104; source electrode 301 and drain electrode 302 spaced apart from each other above second nitride semiconductor layer 104, and each electrically connected to two-dimensional electron gas layer 105; and gate electrode 401 spaced apart from source electrode 301 and drain electrode 302 and in contact with second nitride semiconductor layer 104. In a plan view of substrate 101, substrate 101 is divided into active region 701 including two-dimensional electron gas layer 105 and non-active region 704 without two-dimensional electron gas layer 105. Then, in active region 701, semiconductor device for high-frequency amplification 100 includes: a transistor for high-frequency amplification including source electrode 301, drain electrode 302, and gate electrode 401; and resistor 601 provided above second nitride semiconductor layer 104, and in non-active region 704, semiconductor device for high-frequency amplification 100 includes: a first terminal pad (e.g., drain terminal 803 or gate terminal 804) connected to drain electrode 302 or gate electrode 401; and a second terminal pad (e.g., first resistor terminal 805 or second resistor terminal 806) connected to resistor 601.

Thus, since resistor 601 serving as a temperature sensor is disposed in active region 701 where the transistor for high-frequency amplification that generates heat is formed, semiconductor device for high-frequency amplification 100 can detect a change in the temperature of the transistor for high-frequency amplification with high responsiveness, compared with when resistor 601 is disposed in non-active region 704 where the transistor for high-frequency amplification is not formed. Accordingly, semiconductor device for high-frequency amplification 100 can detect the temperature of the transistor with high responsiveness.

It should be noted that to connect the first terminal pad to drain electrode 302 or gate electrode 401 means to electrically connect the first terminal pad to drain electrode 302 or gate electrode 401 via a corresponding one of interconnections.

In addition, for instance, in the plan view, the longitudinal direction of resistor 601 corresponds to the first direction that is the extending direction of gate electrode 401 (Y-axis direction). That is, the longitudinal direction of resistor 601 is parallel to the first direction.

Thus, it is possible to detect the temperature of particular gate electrode 401.

In addition, for instance, in the plan view, the first terminal pad is disposed in non-active region 704 that is aligned with active region 701 in the extending direction of gate electrode 401, and the second terminal pad is disposed in non-active region 704 that is aligned with active region 701 in the direction orthogonal to the extending direction.

Thus, resistor 601 can detect the temperature without having interference with an input signal from gate terminal 804 and an output signal from drain terminal 803 within the chip. In addition, the connection wire connected to the first terminal pad and the connection wire connected to the second terminal pad can be separately disposed from the exterior of the chip. This can decrease the density of wires, which can suppress signal interferences at the exterior of the chip.

Variation 1 of Embodiment 1

Figure 3A:
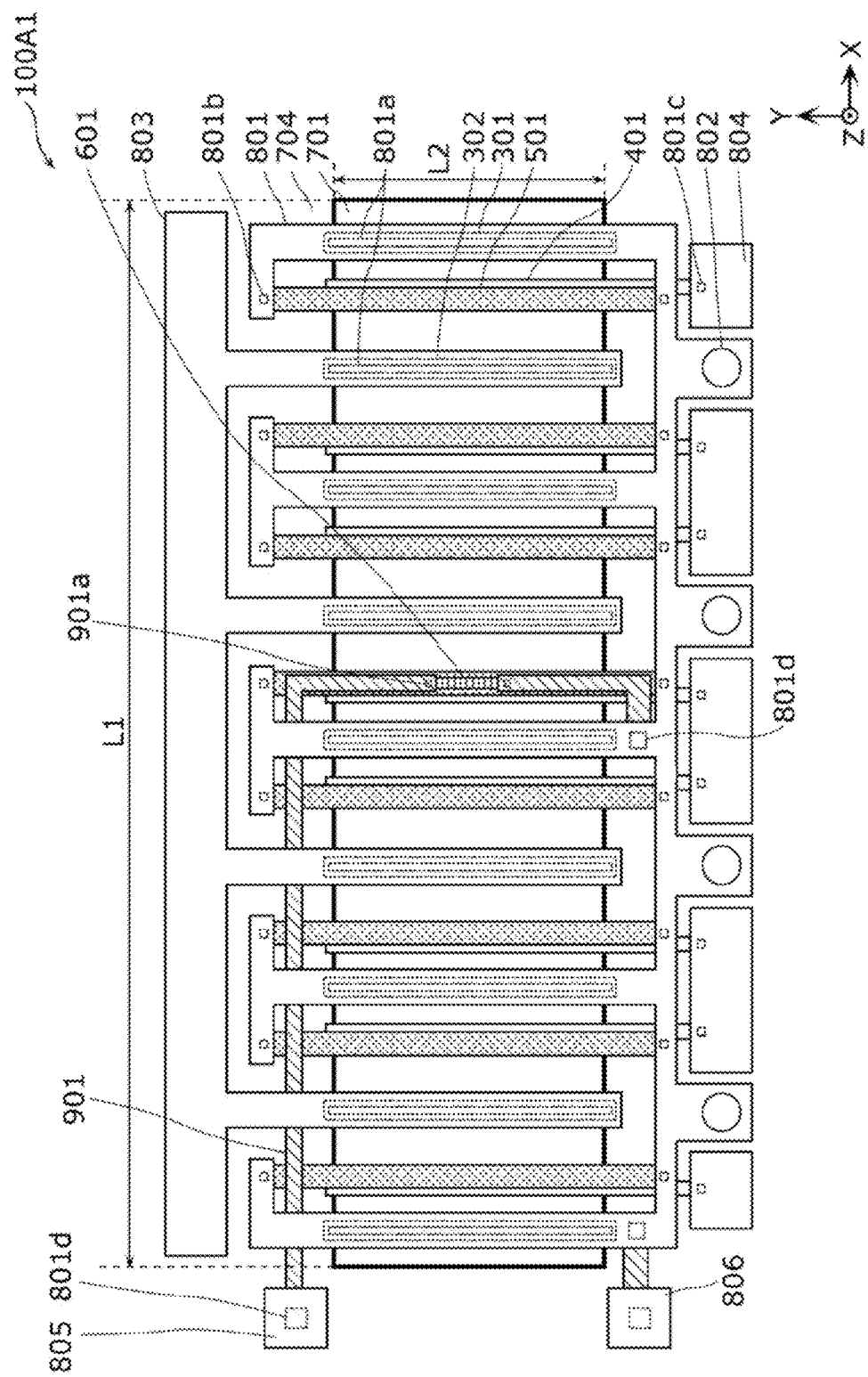
FIG. 3A is a plan view illustrating a first example of a configuration of a semiconductor device for high-frequency amplification according to Variation 1 of Embodiment 1.
Figure 3B:
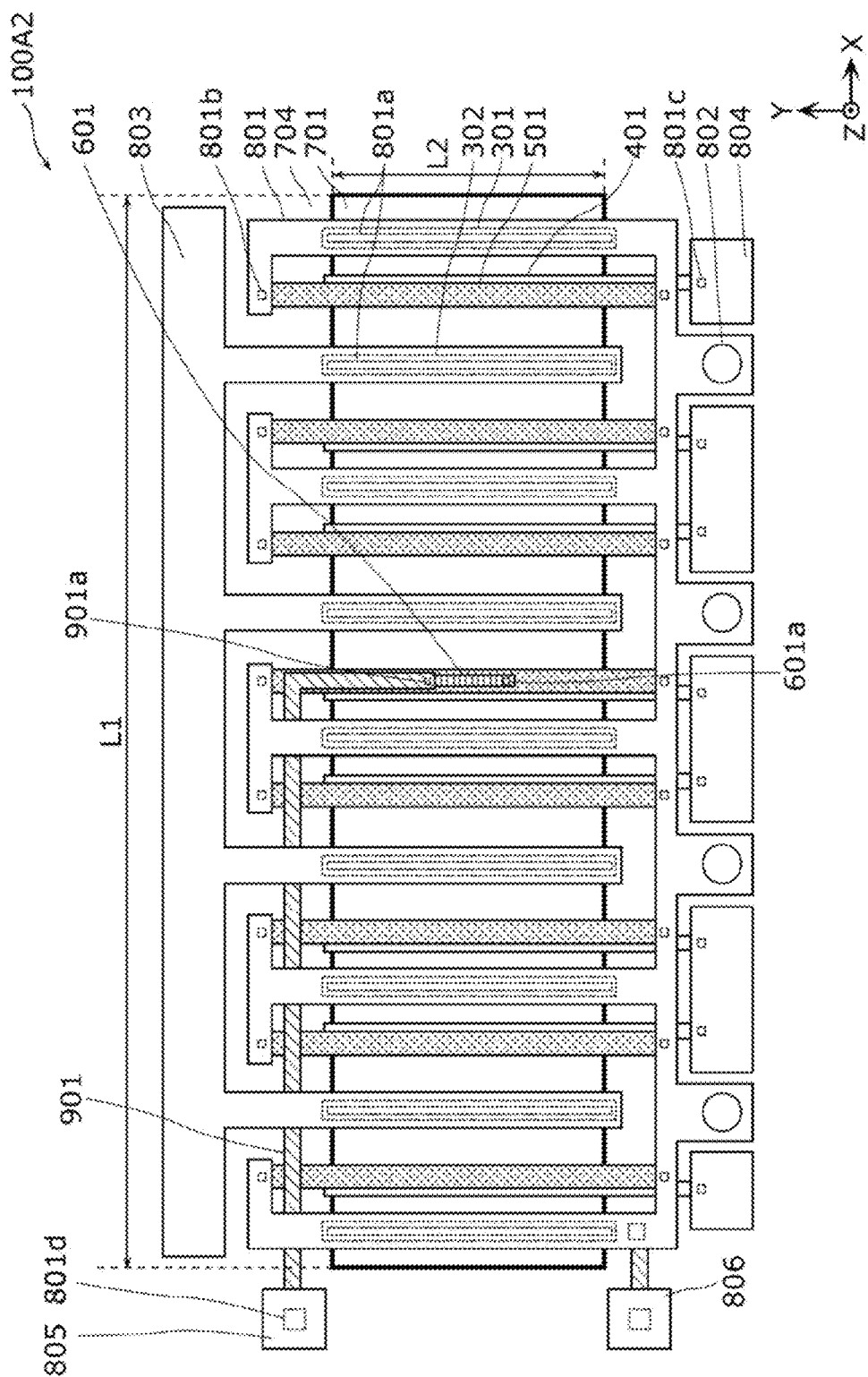
FIG. 3B is a plan view illustrating a second example of the configuration of the semiconductor device for high-frequency amplification according to Variation 1 of Embodiment 1.

In Variation 1, another example of connections between both ends of resistor 601 and external connection terminals (e.g., first resistor terminal 805, second resistor terminal 806, a back surface electrode, and a source pad) in semiconductor device for high-frequency amplification 100 according to Embodiment 1 is described with reference to FIGS. 3A and 3B. FIGS. 3A and 3B are plan views illustrating examples of a configuration of a semiconductor device for high-frequency amplification according to Variation 1 of Embodiment 1. It should be noted that FIG. 3A illustrates a configuration of semiconductor device for high-frequency amplification 100A1 and FIG. 3B illustrates a configuration of semiconductor device for high-frequency amplification 100A2.

As illustrated in FIGS. 3A and 3B, the electric potential of one end of resistor 601 may be set to the source electric potential within a chip. Specifically, as illustrated in FIG. 3A, one end of resistor 601 may be connected, via opening 801d for connection to the second interconnect layer, to first interconnect layer 801 whose electric potential is set to the source electric potential. In addition, as illustrated in FIG. 3B, one end of resistor 601 may be connected, via opening 601a for connecting the resistor and the source field plate electrode, to source field plate electrode 501 whose electric potential is set to the source electric potential. In either case, the other end of resistor 601 is connected to first resistor terminal 805, which makes second resistor terminal 806 unnecessary and can decrease the number of pads included in semiconductor device for high-frequency amplifications 100A1 and 100A2. Electrical properties between first resistor terminal 805 and source external terminals (a back surface electrode and a source pad) may be measured to detect the temperature using resistor 601 from outside of semiconductor device for high-frequency amplification 100.

Variation 2 of Embodiment 1

Figure 4A:
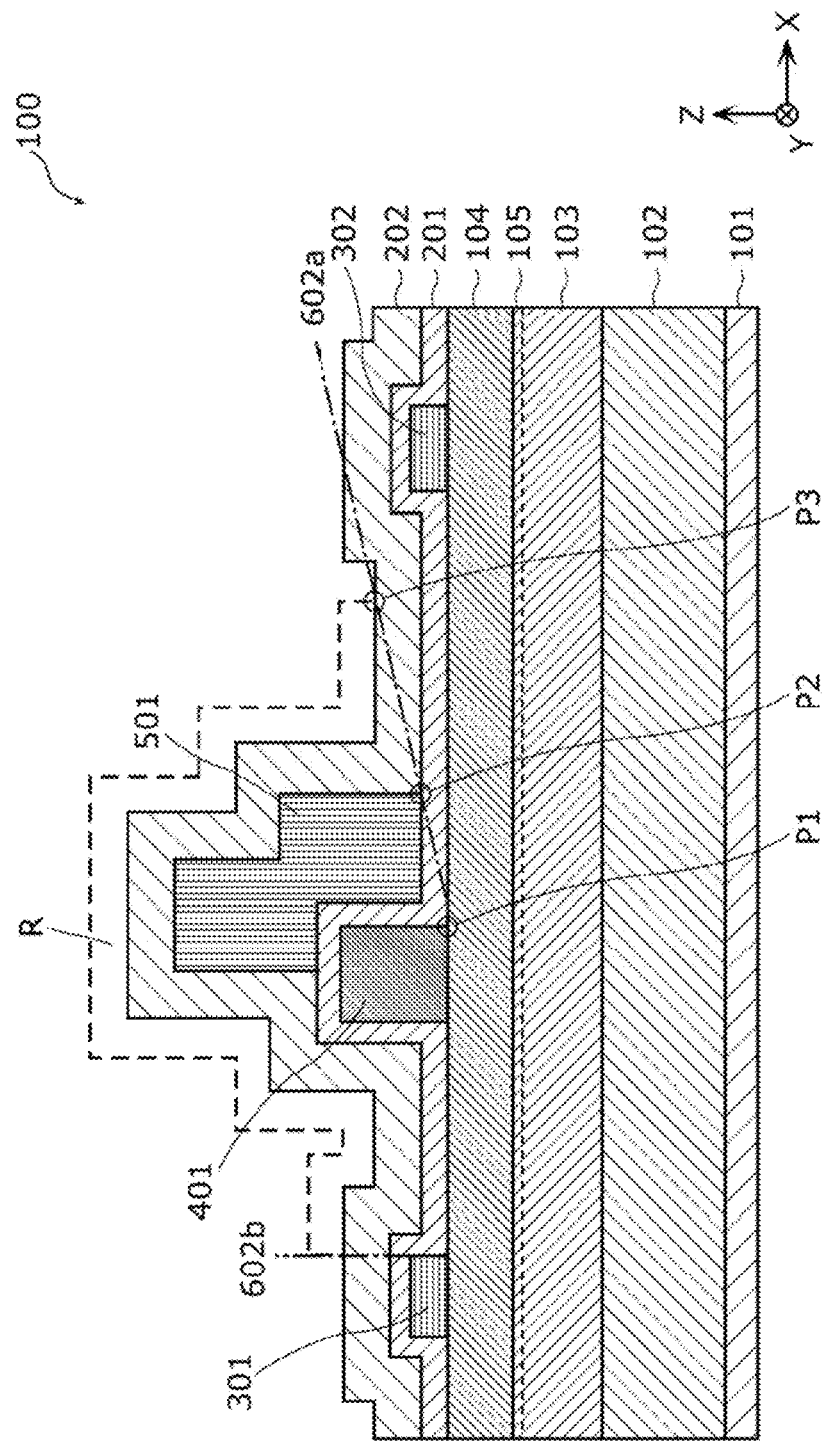
FIG. 4A is a cross-sectional view indicating an area where a resistor of a semiconductor device for high-frequency amplification according to Variation 2 of Embodiment 1 can be disposed.

In Variation 2, the position of resistor 601 in semiconductor device for high-frequency amplification 100 according to Embodiment 1 is described with reference to FIGS. 4A to 4J. First, an area where resistor 601 can be disposed is explained with reference to FIG. 4A. FIG. 4A is a cross-sectional view indicating an area where resistor 601 of semiconductor device for high-frequency amplification 100 according to Variation 2 of Embodiment 1 can be disposed. It should be noted that in FIGS. 4A to 4J, fourth insulating layer 204, first interconnect layer 801, openings 801a for connection to the source and drain electrodes, and other elements illustrated in, for example, FIG. 2A are omitted.

Dashed-line region R illustrated in FIG. 4A indicates the area where resistor 601 can be disposed. FIG. 4A indicates the largest possible area where resistor 601 can be disposed. The end of resistor 601 on the source electrode 301 side is closer to drain electrode 302 than the end of source electrode 301 on the drain electrode 302 side is (e.g., than virtual line 602b is). In addition, the end of resistor 601 on the drain electrode 302 side is on the gate electrode 401 side (on the negative side of the X-axis) relative to virtual line 602a that is the straight line passing through the end of gate electrode 401 on the drain electrode 302 side (point P1) and the end of source field plate electrode 501 on the drain electrode 302 side (point P2). For instance, the end of resistor 601 on the drain electrode 302 side is closer to source electrode 301 (on the negative side of the X-axis) than point P3 at the top of second insulating layer 202 (e.g., the virtual line passing through point P3 and being parallel to the Z-axis). Virtual line 602a is an example of a virtual straight line.

As a result of resistor 601 being disposed within dashed-line region R, it is possible to detect, selectively and with high responsiveness, a temperature change due to heat generated during the operation of the transistor near the end of gate electrode 401 on the drain electrode 302 side that is closest to resistor 601.

It should be noted that virtual line 602a is also an extended line of the line segment connecting the end of gate electrode 401 on the drain electrode 302 side and the end of source field plate electrode 501 on the drain electrode 302 side. In addition, virtual line 602b is a straight line passing through the end of source electrode 301 on the drain electrode 302 side and being parallel to the Z-axis.

Figure 4B:
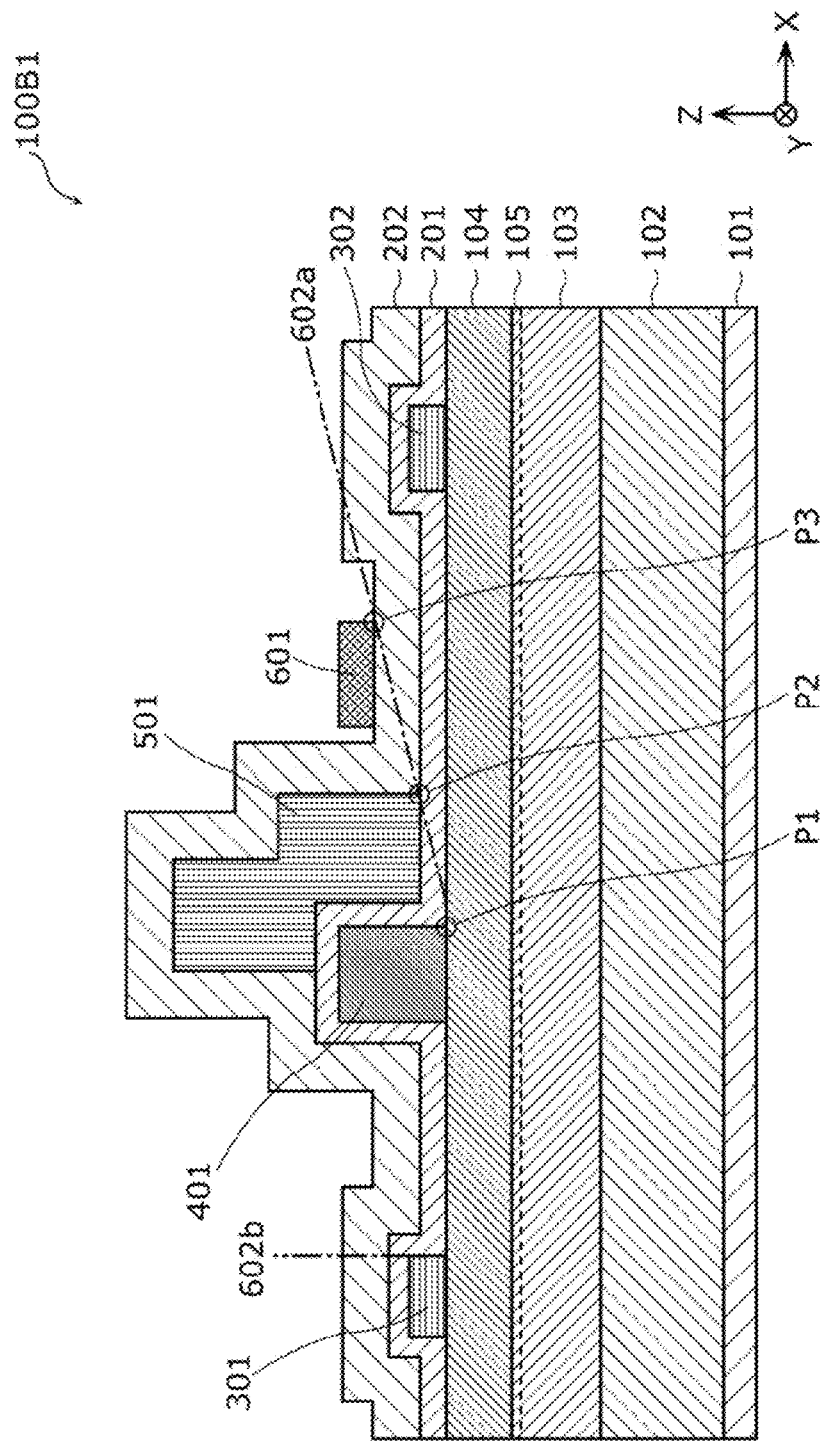
FIG. 4B is a cross-sectional view illustrating a first example of a configuration of the semiconductor device for high-frequency amplification according to Variation 2 of Embodiment 1.
Figure 4C:
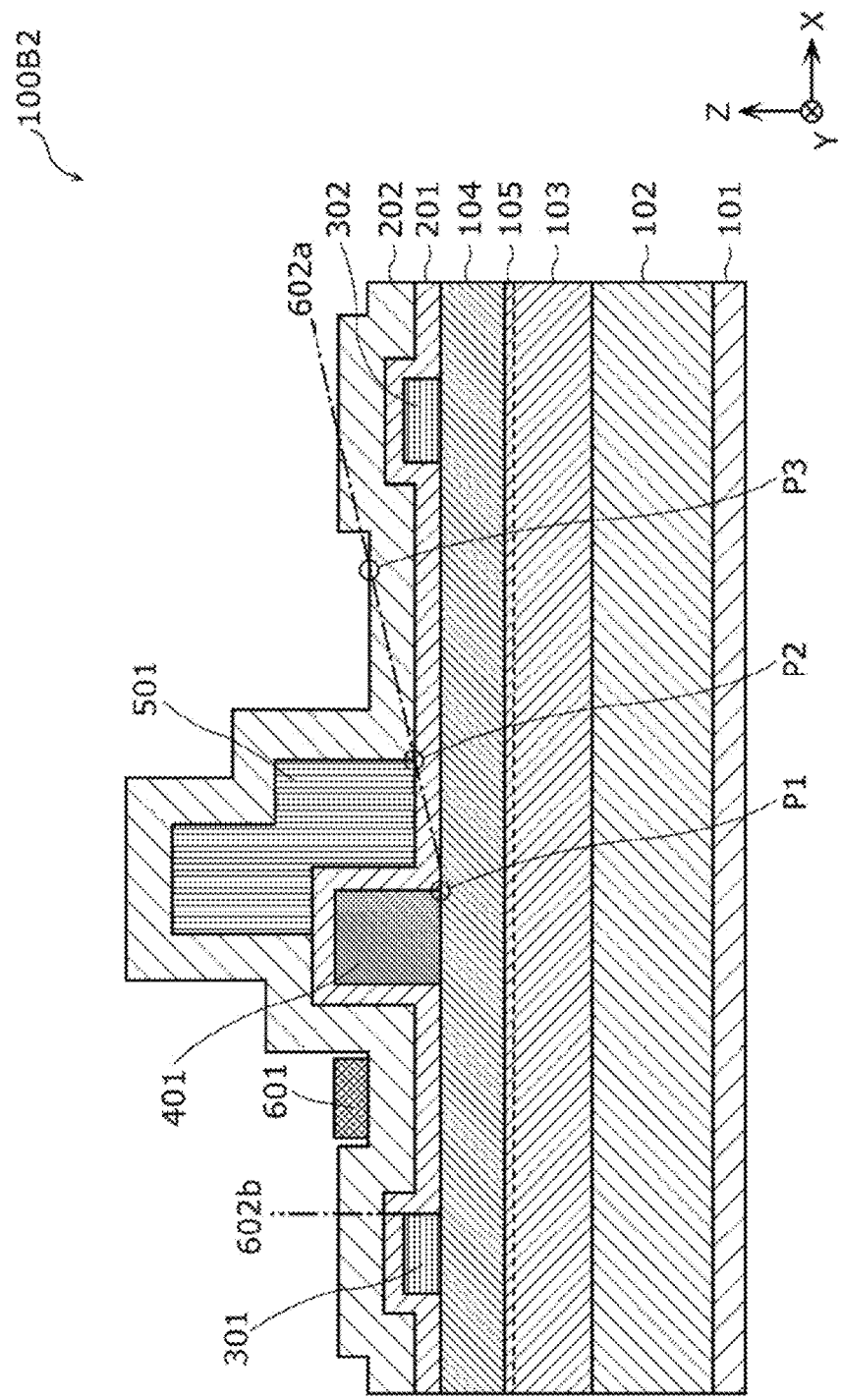
FIG. 4C is a cross-sectional view illustrating a second example of the configuration of the semiconductor device for high-frequency amplification according to Variation 2 of Embodiment 1.
Figure 4D:
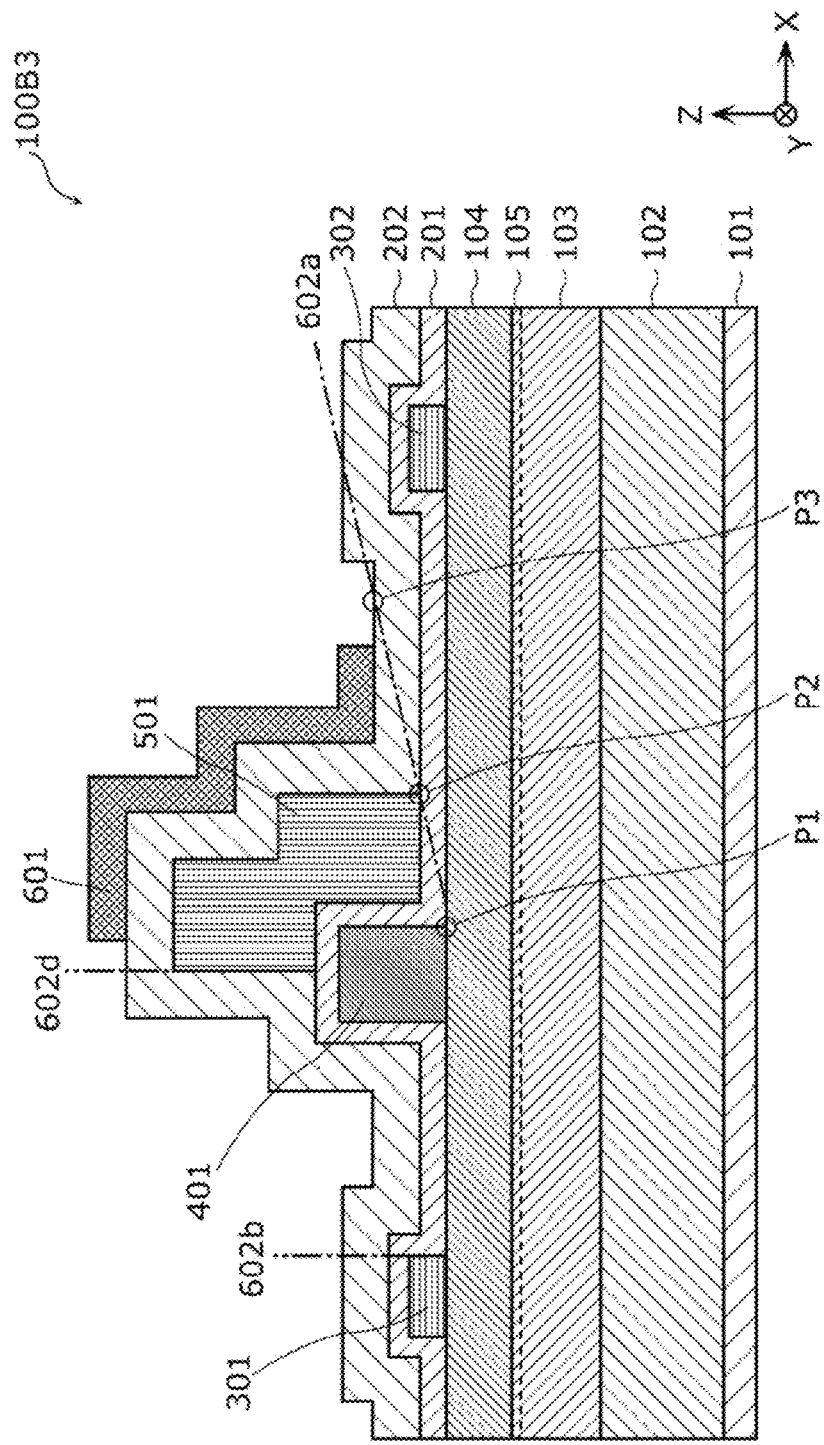
FIG. 4D is a cross-sectional view illustrating a third example of the configuration of the semiconductor device for high-frequency amplification according to Variation 2 of Embodiment 1.
Figure 4E:
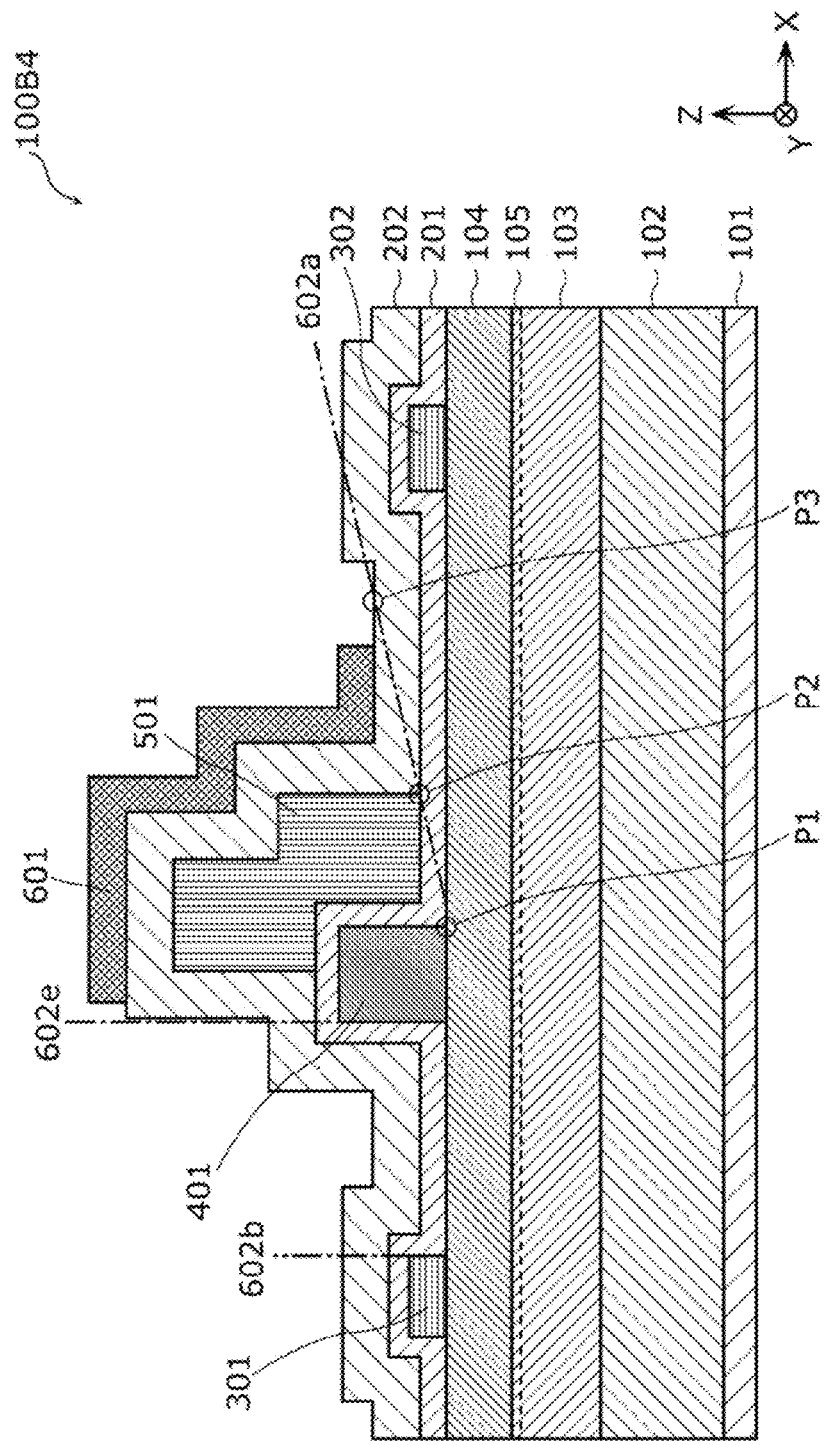
FIG. 4E is a cross-sectional view illustrating a fourth example of the configuration of the semiconductor device for high-frequency amplification according to Variation 2 of Embodiment 1.
Figure 4F:
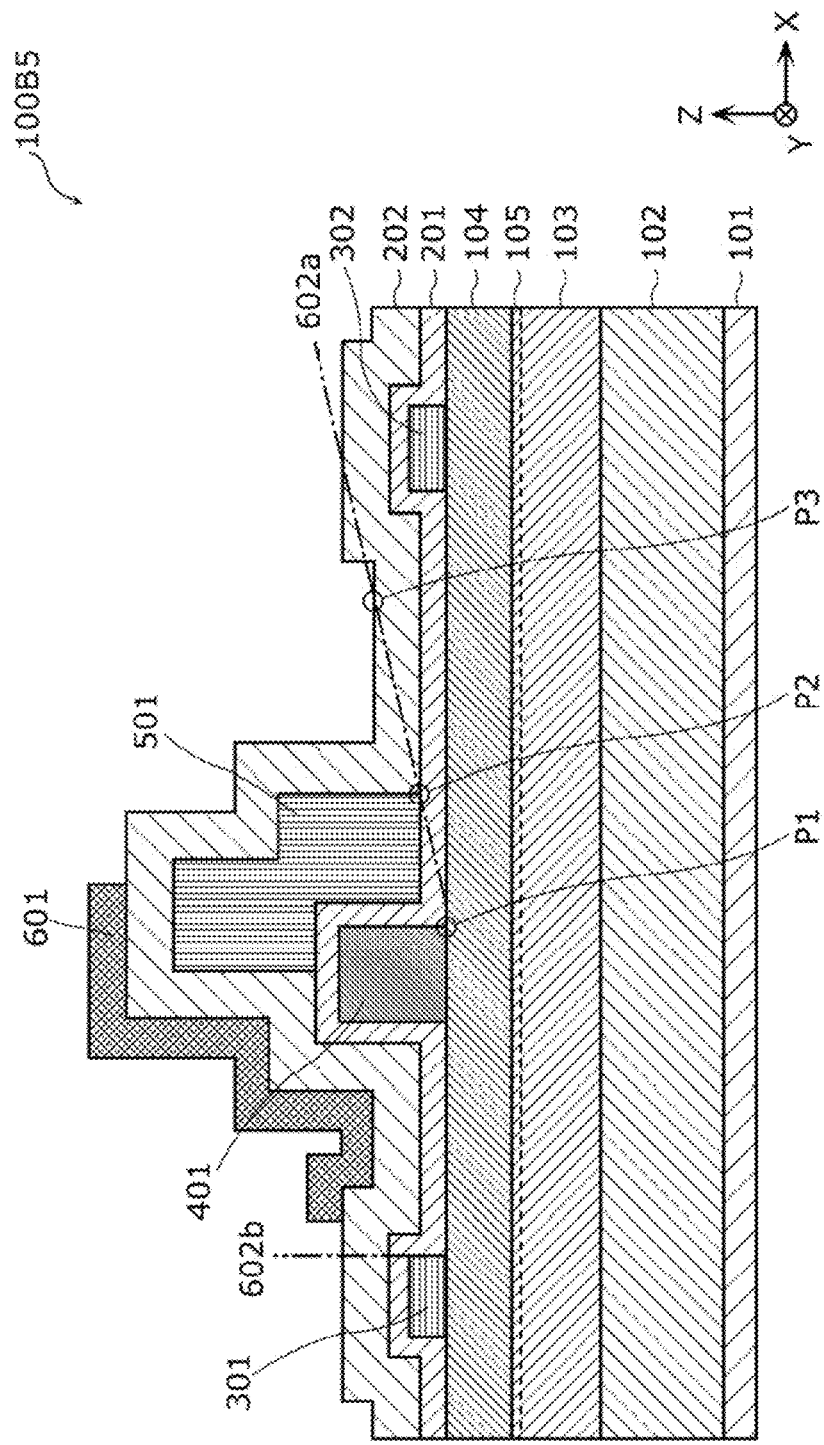
FIG. 4F is a cross-sectional view illustrating a fifth example of the configuration of the semiconductor device for high-frequency amplification according to Variation 2 of Embodiment 1.
Figure 4G:
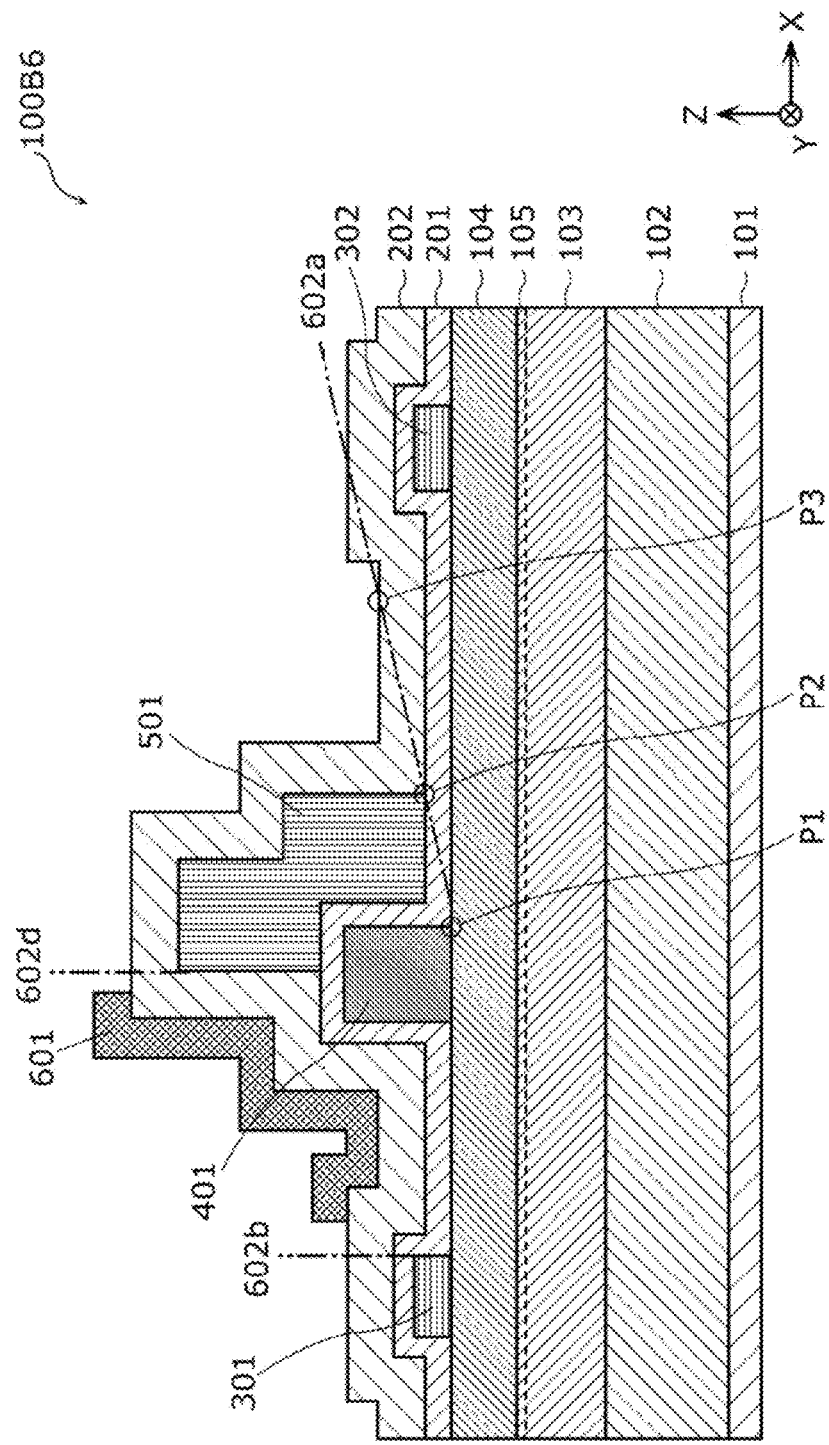
FIG. 4G is a cross-sectional view illustrating a sixth example of the configuration of the semiconductor device for high-frequency amplification according to Variation 2 of Embodiment 1.
Figure 4H:
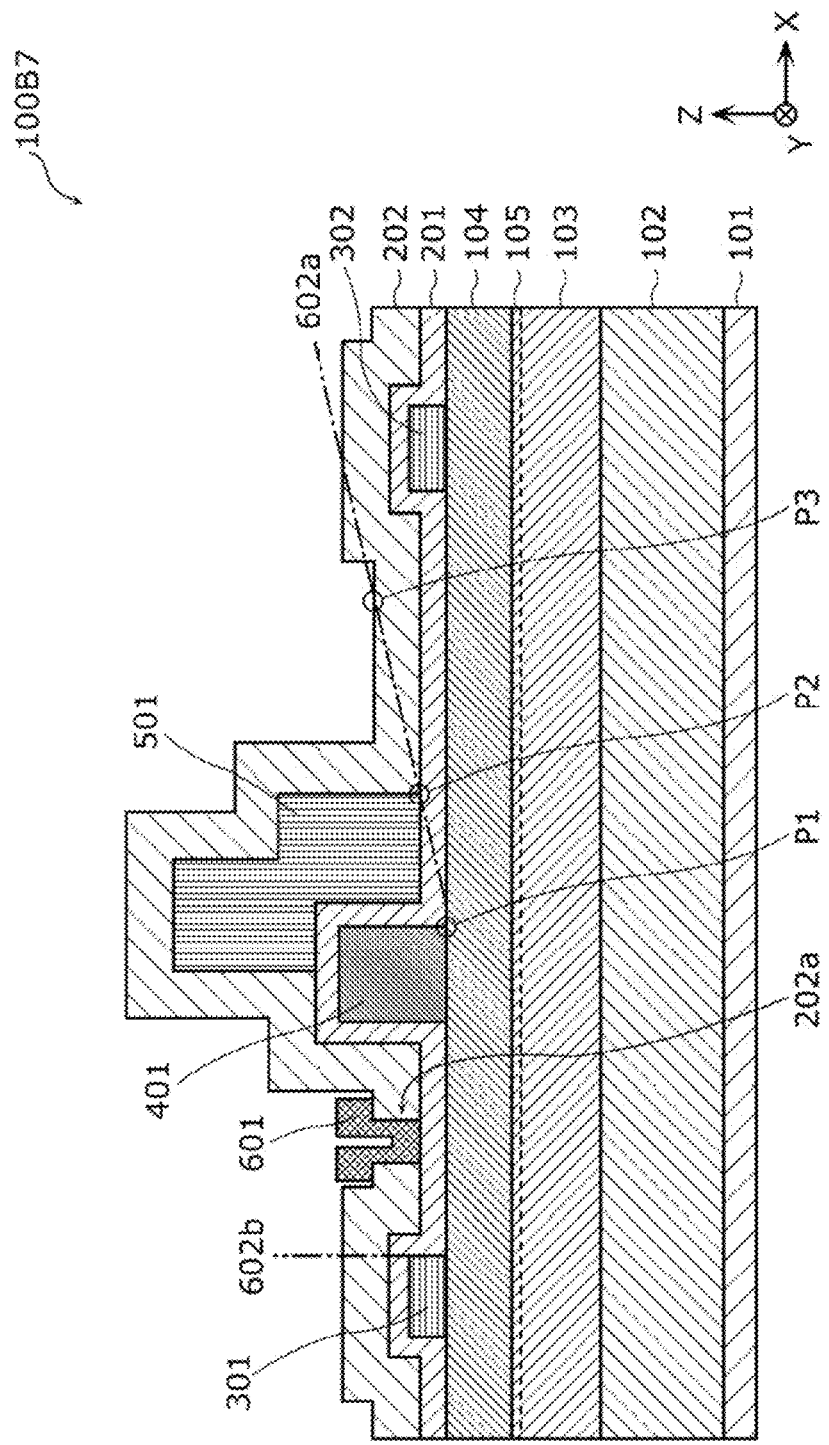
FIG. 4H is a cross-sectional view illustrating a seventh example of the configuration of the semiconductor device for high-frequency amplification according to Variation 2 of Embodiment 1.
Figure 4I:
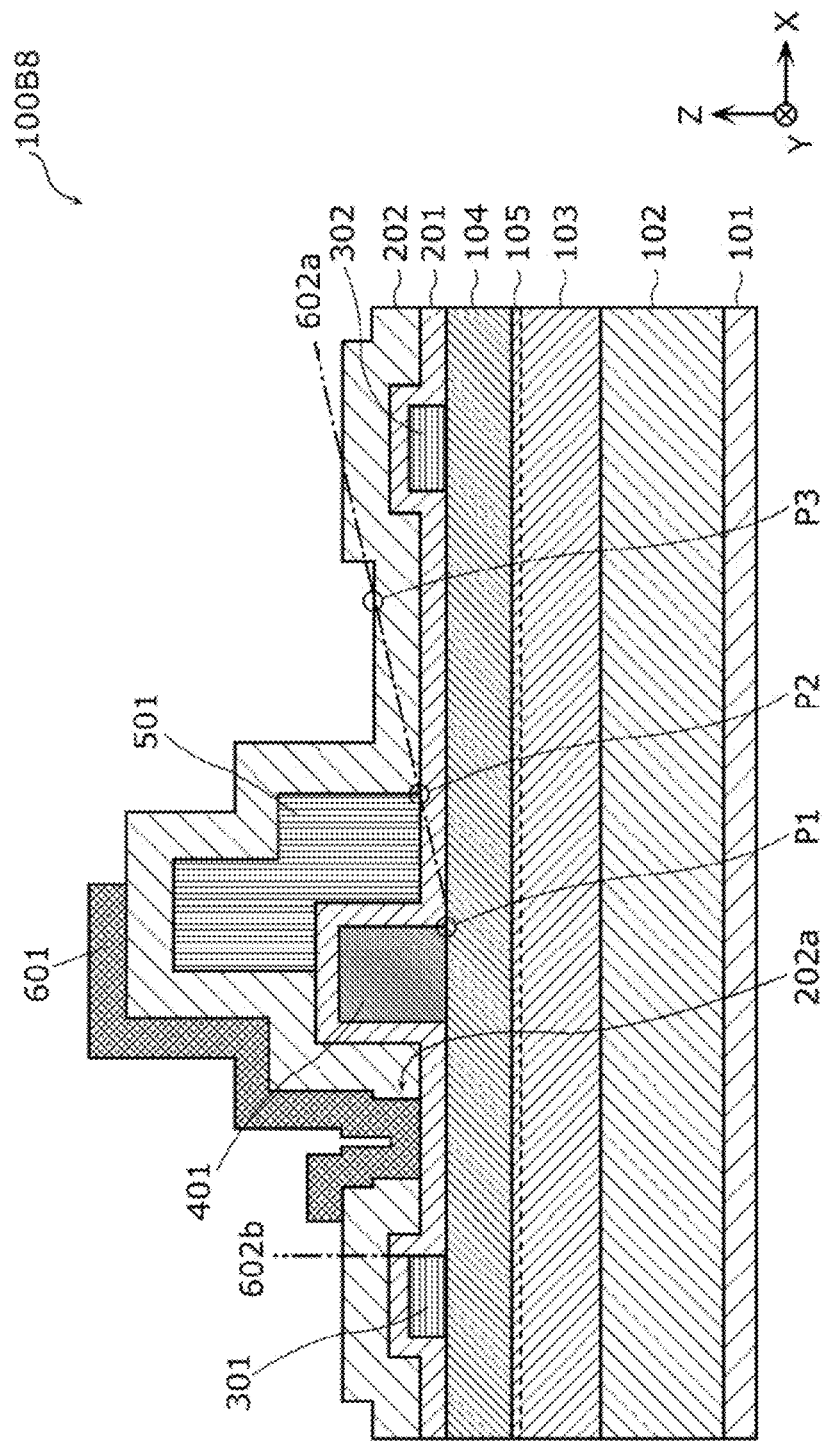
FIG. 4I is a cross-sectional view illustrating an eighth example of the configuration of the semiconductor device for high-frequency amplification according to Variation 2 of Embodiment 1.
Figure 4J:
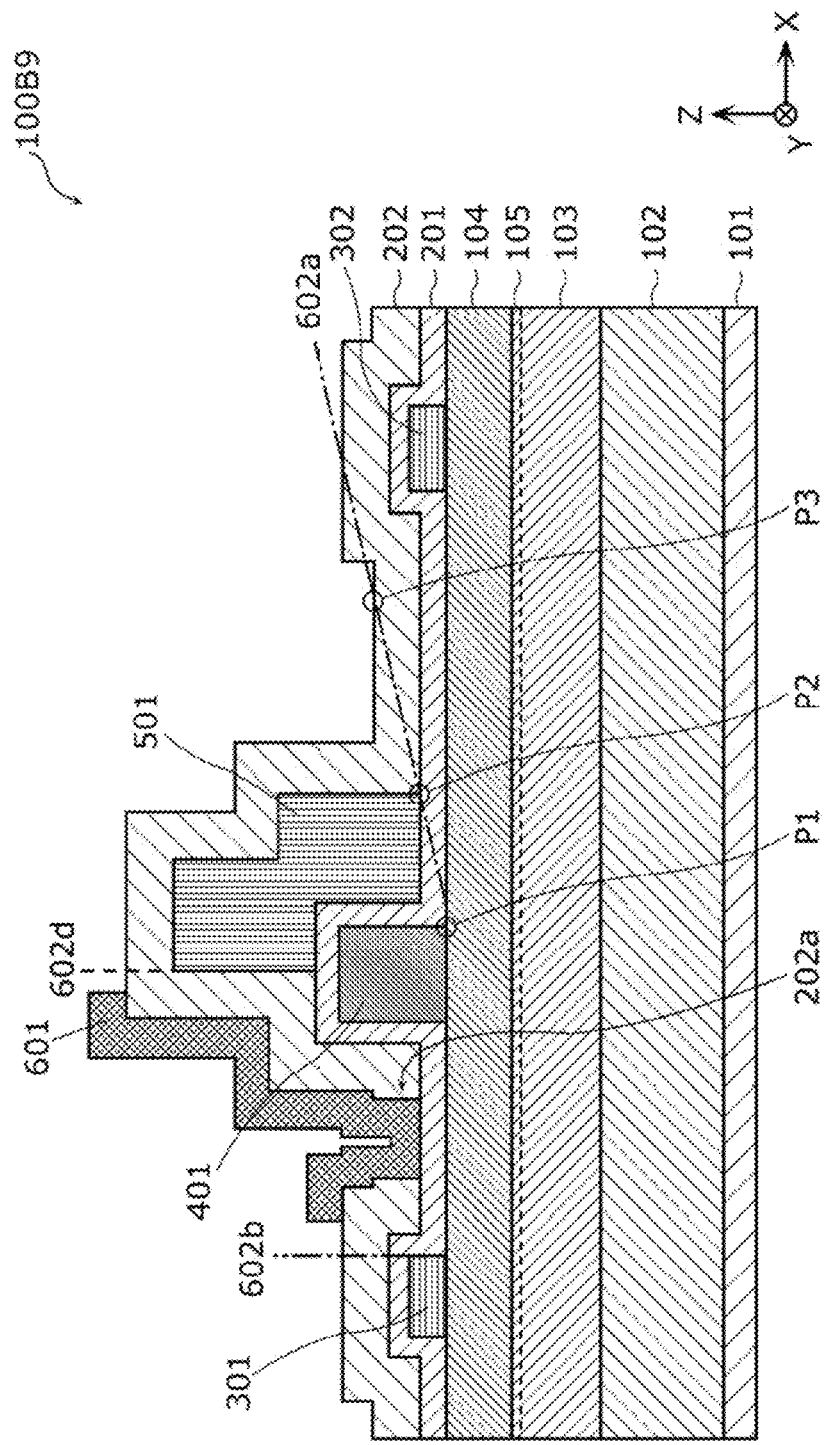
FIG. 4J is a cross-sectional view illustrating a ninth example of the configuration of the semiconductor device for high-frequency amplification according to Variation 2 of Embodiment 1.

Hereinafter, examples of the position of resistor 601 within dashed-line region R illustrated in FIG. 4A are described with reference to FIGS. 4B to 4J. FIGS. 4B to 4J are cross-sectional views illustrating examples of a configuration of the semiconductor device for high-frequency amplification according to Variation 2 of Embodiment 1. It should be noted that FIG. 4B illustrates a configuration of semiconductor device for high-frequency amplification 100B1. FIG. 4C illustrates a configuration of semiconductor device for high-frequency amplification 100B2. FIG. 4D illustrates a configuration of semiconductor device for high-frequency amplification 100B3. FIG. 4E illustrates a configuration of semiconductor device for high-frequency amplification 100B4. FIG. 4F illustrates a configuration of semiconductor device for high-frequency amplification 100B5. FIG. 4G illustrates a configuration of semiconductor device for high-frequency amplification 100B6. FIG. 4H illustrates a configuration of semiconductor device for high-frequency amplification 100B7. FIG. 4I illustrates a configuration of semiconductor device for high-frequency amplification 100B8. FIG. 4J illustrates a configuration of semiconductor device for high-frequency amplification 100B9.

As illustrated in FIGS. 4B and 4C, resistor 601 need not be disposed above gate electrode 401 or source field plate electrode 501.

In addition, for instance, as illustrated in FIG. 4B, the end of resistor 601 on the drain electrode 302 side may be on the source electrode 301 side relative to virtual line 602a, and the end of resistor 601 on the source electrode 301 side may be closer to drain electrode 302 than the end of source field plate electrode 501 on the drain electrode 302 side is. For instance, in the plan view, resistor 601 may be provided between drain electrode 302 and source field plate electrode 501, at a position where resistor 601 does not overlap each of drain electrode 302 and source field plate electrode 501.

In addition, for instance, as illustrated in FIG. 4C, the end of resistor 601 on the drain electrode 302 side may be closer to source electrode 301 (on the negative side of the X-axis) than the end of gate electrode 401 on the source electrode 301 side, and the end of resistor 601 on the source electrode 301 side may be on the drain electrode 302 side of source electrode 301 (on the positive side of the X-axis relative to source electrode 301). For instance, in the plan view, resistor 601 may be provided between source electrode 301 and gate electrode 401, at a position where resistor 601 does not overlap each of source electrode 301 and gate electrode 401.

In the examples illustrated in FIGS. 4B and 4C, the bottom surface of resistor 601 (the surface on the negative side of the Z-axis) is below the top surface (the surface on the positive side of the Z-axis) of gate electrode 401.

In addition, as illustrated in FIG. 4D, the end of resistor 601 on the drain electrode 302 side may be on the source electrode 301 side relative to virtual line 602a, and the end of resistor 601 on the source electrode 301 side may be closer to drain electrode 302 than the end of source field plate electrode 501 on the source electrode 301 side is (for example, than virtual line 602d is). For instance, in the plan view, resistor 601 may be provided to cover at least a portion of source field plate electrode 501 and a portion of the region between source field plate electrode 501 and drain electrode 302. It should be noted that virtual line 602d is a straight line passing through the end of source field plate electrode 501 on the source electrode 301 side and being parallel to the Z-axis.

In addition, as illustrated in FIG. 4E, the end of resistor 601 on the drain electrode 302 side may be on the source electrode 301 side relative to virtual line 602a, and the end of resistor 601 on the source electrode 301 side may be closer to drain electrode 302 than the end of gate electrode 401 on the source electrode 301 side is (for example, than virtual line 602e is). For instance, in the plan view, resistor 601 may be provided to cover at least a portion of gate electrode 401, source field plate electrode 501, and a portion of the region between source field plate electrode 501 and drain electrode 302. It should be noted that virtual line 602e is a straight line passing through the end of gate electrode 401 on the source electrode 301 side and being parallel to the Z-axis. It should be noted that resistor 601 may have a cross-sectional shape conforming to the cross-sectional shape of source field plate electrode 501. Resistor 601 may have a stepwise shape.

In addition, as illustrated in FIG. 4F, the end of resistor 601 on the drain electrode 302 side may be closer to source electrode 301 (on the negative side of the X-axis) than the end of source field plate electrode 501 on the drain electrode 302 side is, and the end of resistor 601 on the source electrode 301 side may be provided on the drain electrode 302 side of source electrode 301 (on the positive side of the X-axis relative to source electrode 301).

In addition, as illustrated in FIG. 4G, the end of resistor 601 on the drain electrode 302 side may be closer to source electrode 301 than the end of source field plate electrode 501 on the source electrode 301 side is (e.g., than virtual line 602d is), and the end of resistor 601 on the source electrode 301 side may be provided on the drain electrode 302 side of source electrode 301. In addition, for instance, the end of resistor 601 on the drain electrode 302 side may be closer to source electrode 301 (on the negative side of the X-axis) than the end of gate electrode 401 on the drain electrode 302 side is. It should be noted that resistor 601 may have a cross-sectional shape conforming to the arrangement positions and the cross-sectional shapes of source field plate electrode 501 and gate electrode 401. Resistor 601 may have a stepwise shape.

In addition, when at least a portion of resistor 601 is disposed between the end of source electrode 301 on the drain electrode 302 side and the end of gate electrode 401 on the source electrode 301 side, as illustrated in FIGS. 4H to 4J, recess 202a may be provided in second insulating layer 202, and resistor 601 may be disposed above recess 202a. In the plan view, recess 202a is a depressed portion (a through hole) formed in a portion of the region between source electrode 301 and gate electrode 401 within second insulating layer 202. For instance, as illustrated in FIGS. 4H to 4J, a portion of resistor 601 may be provided in contact with first insulating layer 201.

In addition, by changing the depth of recess 202a in or from second insulating layer 202, resistor 601 may be provided up to a position within second insulating layer 202 or a position within first insulating layer 201. That is, recess 202a may be a depressed portion not passing through second insulating layer 202 or a depressed portion reaching a portion of first insulating layer 201. In addition, for the case of the position of resistor 601 illustrated in FIG. 4H, resistor 601 may be formed using source field plate electrode 501. That is, resistor 601 and source field plate electrode 501 may be formed concurrently.

Thus, in the cross-sectional view of substrate 101, the entirety of resistor 601 is disposed so that the end of resistor 601 on the drain electrode 302 side is on the gate electrode 401 side (the negative side of the X-axis) relative to virtual line 602a passing through the lowest point (point P1) of the end of gate electrode 401 on the drain electrode 302 side and the lowest point (point P2) of the end of source field plate electrode 501 on the drain electrode 302 side. The entirety of resistor 601 here means the entirety of the overlapping portion of resistor 601 and active region 701 in the plan view. In addition, being on the gate electrode 401 side relative to virtual line 602a means that the entirety of the cross section (the hatched portion) of resistor 601 illustrated in FIGS. 4B to 4J is on the gate electrode 401 side relative to virtual line 602a.

As described above, semiconductor devices for high-frequency amplification 100B1 to 100B9 according to Variation 2 further includes source field plate electrode 501 above second nitride semiconductor layer 104, source field plate electrode 501 having the end on the drain electrode 302 side that is positioned between gate electrode 401 and drain electrode 302 and having an electric potential identical to that of source electrode 301. Then, in the cross-sectional view, the entirety of resistor 601 is disposed on the gate electrode 401 side relative to the virtual straight line (e.g., virtual line 602a) passing through the lowest point of the end of gate electrode 401 on the drain electrode 302 side (e.g., point P1 illustrated in FIG. 4B) and the lowest point of the end of source field plate electrode 501 on the drain electrode 302 side (e.g., point P2 illustrated in FIG. 4B), and the end of resistor 601 on the source electrode 301 side is closer to drain electrode 302 than the end of source electrode 301 on the drain electrode 302 side is.

Thus, it is possible to detect, selectively and with high responsiveness, a temperature change due to heat generated during the operation of the transistor near the end of gate electrode 401 on the drain electrode 302 side that is closest to resistor 601. In addition, it is possible to reduce the effects of resistor 601 on the electric field that generates on the drain electrode 302 side.

In addition, for instance, in the second direction orthogonal to the first direction in the plan view, the end of resistor 601 on the drain electrode 302 side is closer to source electrode 301 than the end of source field plate electrode 501 on the drain electrode 302 side is. In addition, for instance, in the second direction orthogonal to the first direction in the plan view, the end of resistor 601 on the source electrode 301 side is closer to drain electrode 302 than the end of source field plate electrode 501 on the source electrode 301 side is.

Thus, it is possible to suppress an increase in the parasitic capacitance due to resistor 601.

Variation 3 of Embodiment 1

Figure 5:
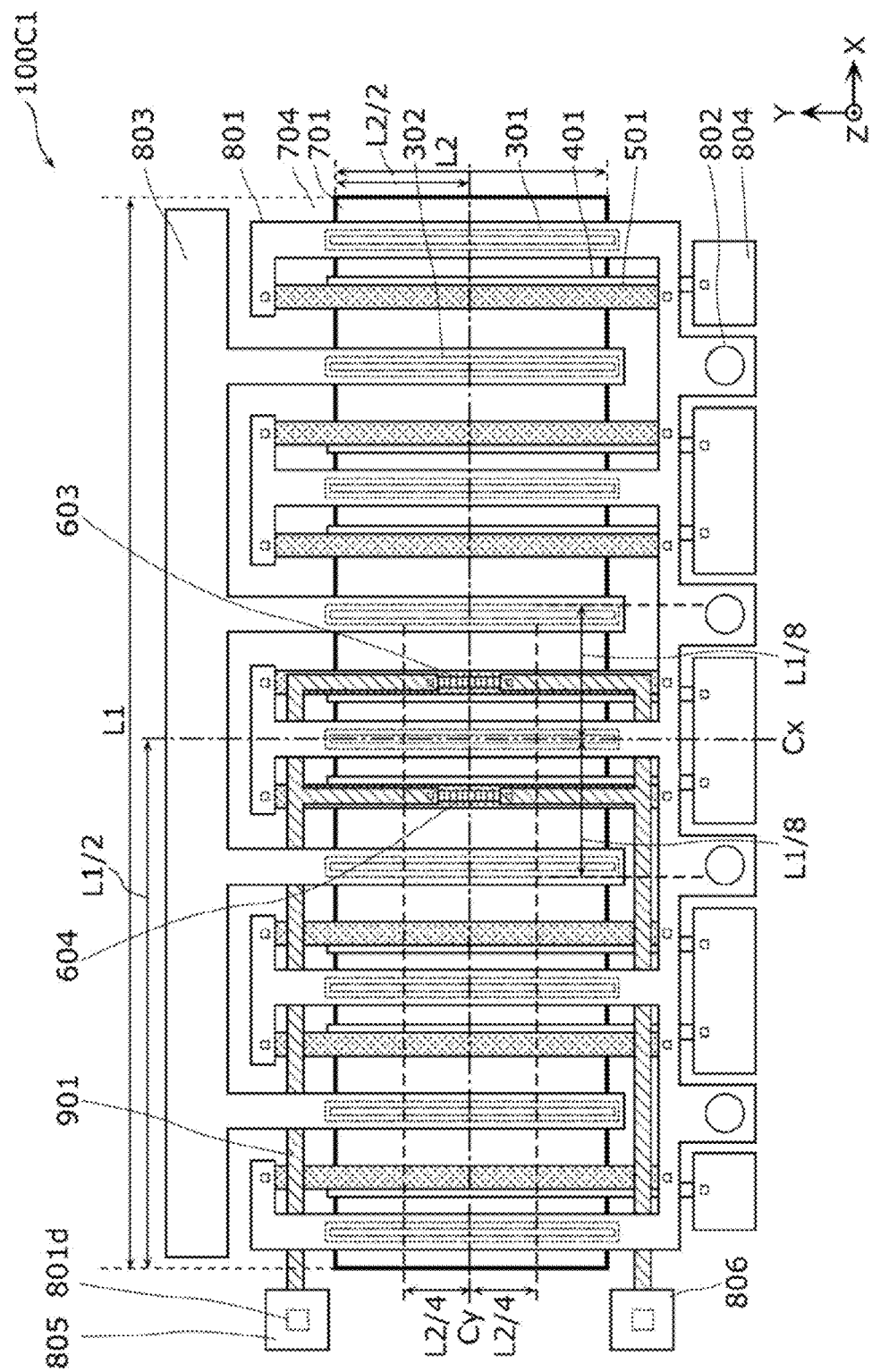
FIG. 5 is a plan view illustrating a configuration of a semiconductor device for high-frequency amplification according to Variation 3 of Embodiment 1.

In Variation 3, an example in which a plurality of resistors 601 are provided is described with reference to FIG. 5. FIG. 5 is a plan view illustrating a configuration of semiconductor device for high-frequency amplification 100C1 according to Variation 3 of Embodiment 1.

As illustrated in FIG. 5, in the plan view, a plurality of resistors may be present within active region 701. In the example illustrated in FIG. 5, first resistor 603 and second resistor 604, that is, two resistors are provided. However, three or more resistors may be provided. In addition, for instance, in the plan view, first resistor 603 and second resistor 604 are provided with electrode 301 source being interposed therebetween. However, the arrangement of the resistors is not limited to the above example. It should be noted that first resistor 603 and second resistor 604 are formed, for example, using the same material. In addition, in the plan view, first resistor 603 and second resistor 604 have the same size and shape, for example.

First resistor 603 and second resistor 604 are provided in parallel and each connected to second interconnect layers 901. By arranging the resistors in parallel, if one of the resistors is open (disconnected), it is possible to detect, by using the other resistor, a temperature change as a change in the resistance value.

In addition, in the plan view, each of first resistor 603 and second resistor 604 is provided in the area within a distance of L1/8 in the X-axis direction from the center in the X-axis direction of active region 701. The area is the area (e.g., a rectangular area that is long in the Y-axis direction) between the position that is a distance of L1/8 away from the center (long dashed short dashed line Cx) in the X-axis direction of active region 701 toward the positive side of the X-axis and the position that is a distance of L1/8 away from the center toward the negative side of the X-axis. In addition, in the plan view, first resistor 603 and second resistor 604 each having a length in the Y-axis direction less than a length of L2/2 are provided in active region 701. In addition, in the plan view, each of first resistor 603 and second resistor 604 may be provided, for instance, within a distance of L2/4 in the Y-axis direction from the center in the Y-axis direction of active region 701. Thus, first resistor 603 and second resistor 604 can selectively detect, as a change in the resistance value, a temperature change near the center of active region 701 where heat generation is most concentrated when devices are disposed at regular intervals. It should be noted that in the plan view, the length in the Y-axis direction within active region 701 of at least one of first resistor 603 or second resistor 604 may be less than a length of L2/2.

In addition, in the plan view, each of first resistor 603 and second resistor 604 may be disposed above source field plate electrode 501 so as to overlap the center in the Y-axis direction of active region 701. Each of first resistor 603 and second resistor 604 may be disposed above source field plate electrode 501 so as to overlap long dashed short dashed line Cy (e.g., so as to straddle long dashed short dashed line Cy) in the plan view. It should be noted that the same applies to resistor 601 according to Embodiment 1. Resistor 601 may be disposed above source field plate electrode 501 so as to overlap long dashed short dashed line Cy (e.g., so as to straddle long dashed short dashed line Cy).

It should be noted that long dashed short dashed line Cx indicates the center in the X-axis direction, and the distances from the ends of active region 701 in the X-axis direction to the center are a distance of L1/2 (the distances from both ends in the X-axis direction of active region 701 to the center are equal).

It should be noted that first resistor 603 and second resistor 604 are connected to first resistor terminal 805 and second resistor terminal 806 which are second terminal pads common to first resistor 603 and second resistor 604.

As described above, semiconductor device for high-frequency amplification 100C1 according to Variation 3 includes a plurality of resistors (e.g., first resistor 603 and second resistor 604).

Thus, even if one resistor is open (disconnected), the other resistor can detect a temperature change as a change in the resistance value, which improves the reliability of semiconductor device for high-frequency amplification 100C1.

In addition, for instance, in the plan view, when the length of semiconductor device for high-frequency amplification 100C1 in the second direction (e.g., the X-axis direction) orthogonal to the first direction (e.g., the Y-axis direction) is defined as L1, in the second direction, the resistor is disposed in the area within a distance of L1/8 from the center of active region 701.

This enables the resistor to detect, as a change in the resistance value, a temperature change near the center of active region 701 where heat generation tends to be most concentrated (in a large-heat-generation portion) when the devices are disposed at regular intervals.

In addition, for instance, in the plan view, when the length in the first direction of active region 701 (that is, the length of active region 701 in the first direction) is defined as L2, the length in the first direction of the resistor is less than a length of L2/2. In addition, for instance, in the first direction in the plan view, the resistor is disposed in the area within a distance of L2/4 from the center of active region 701.

Thus, the resistor can detect, as a change in the resistance value, a temperature change near the center in the Y-axis direction of gate electrode 401 where heat generation tends to be most concentrated when the devices are disposed at regular intervals.

Variation 4 of Embodiment 1

Figure 6A:
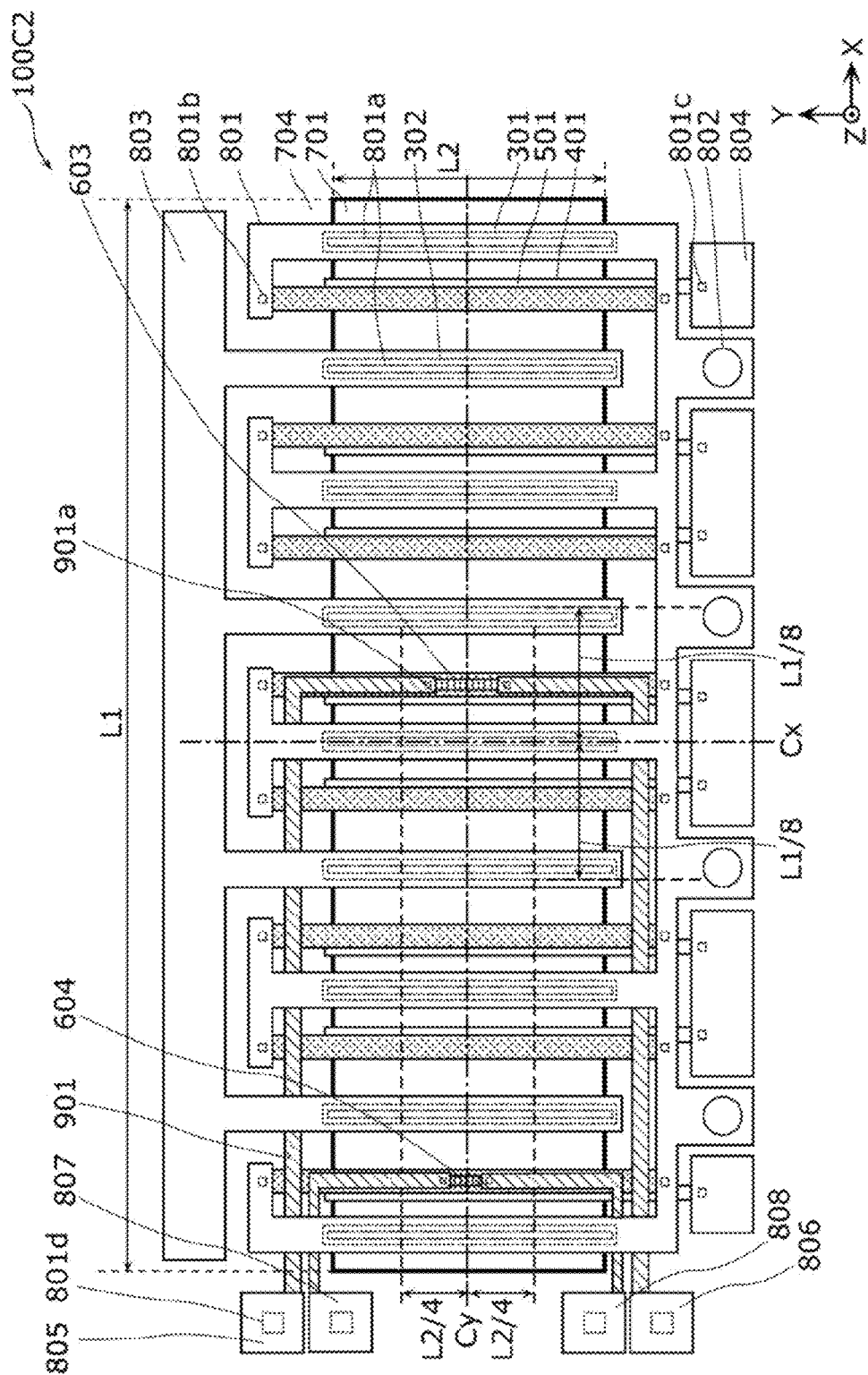
FIG. 6A is a plan view illustrating a first example of a configuration of a semiconductor device for high-frequency amplification according to Variation 4 of Embodiment 1.
Figure 6B:
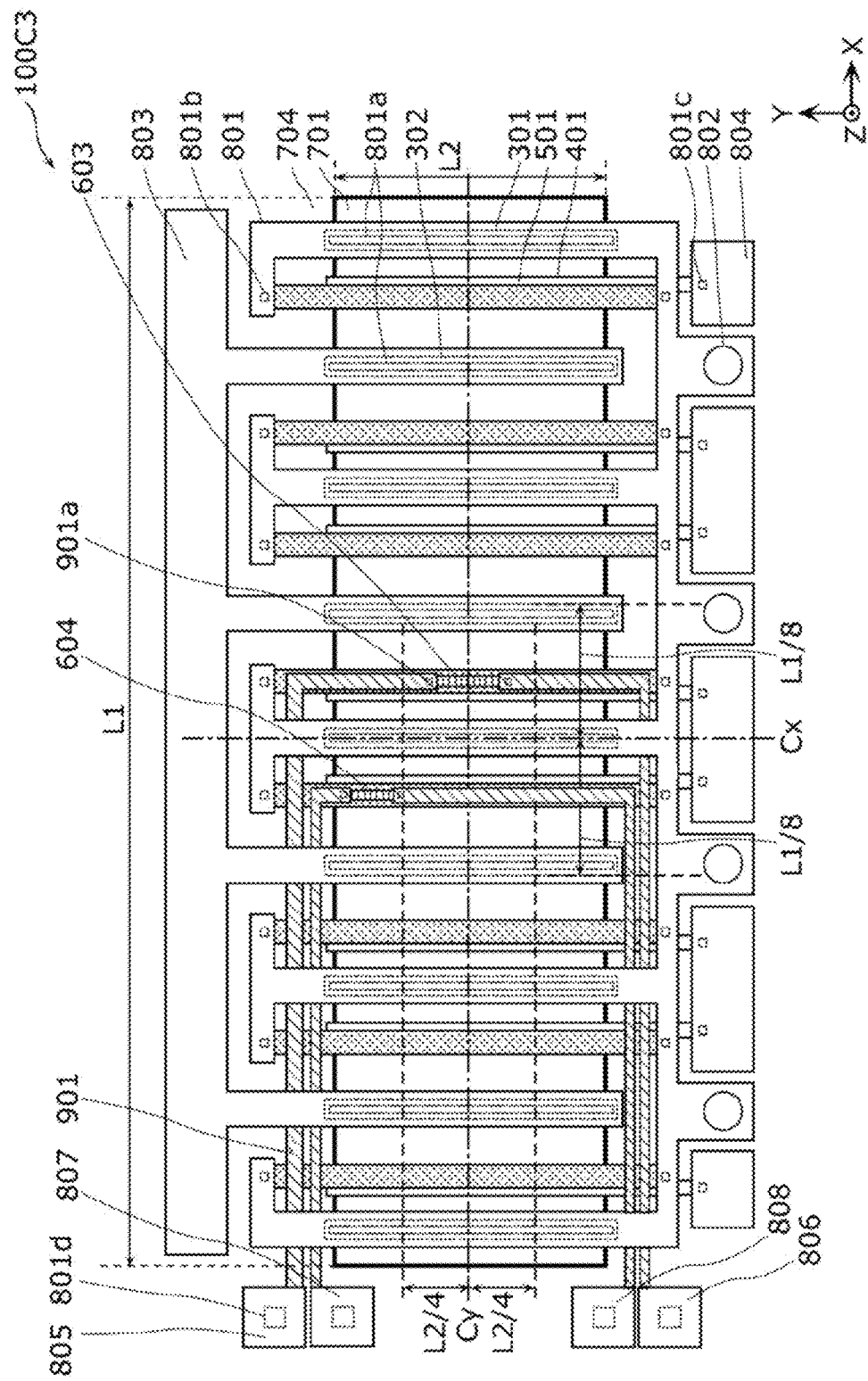
FIG. 6B is a plan view illustrating a second example of the configuration of the semiconductor device for high-frequency amplification according to Variation 4 of Embodiment 1.
Figure 6C:
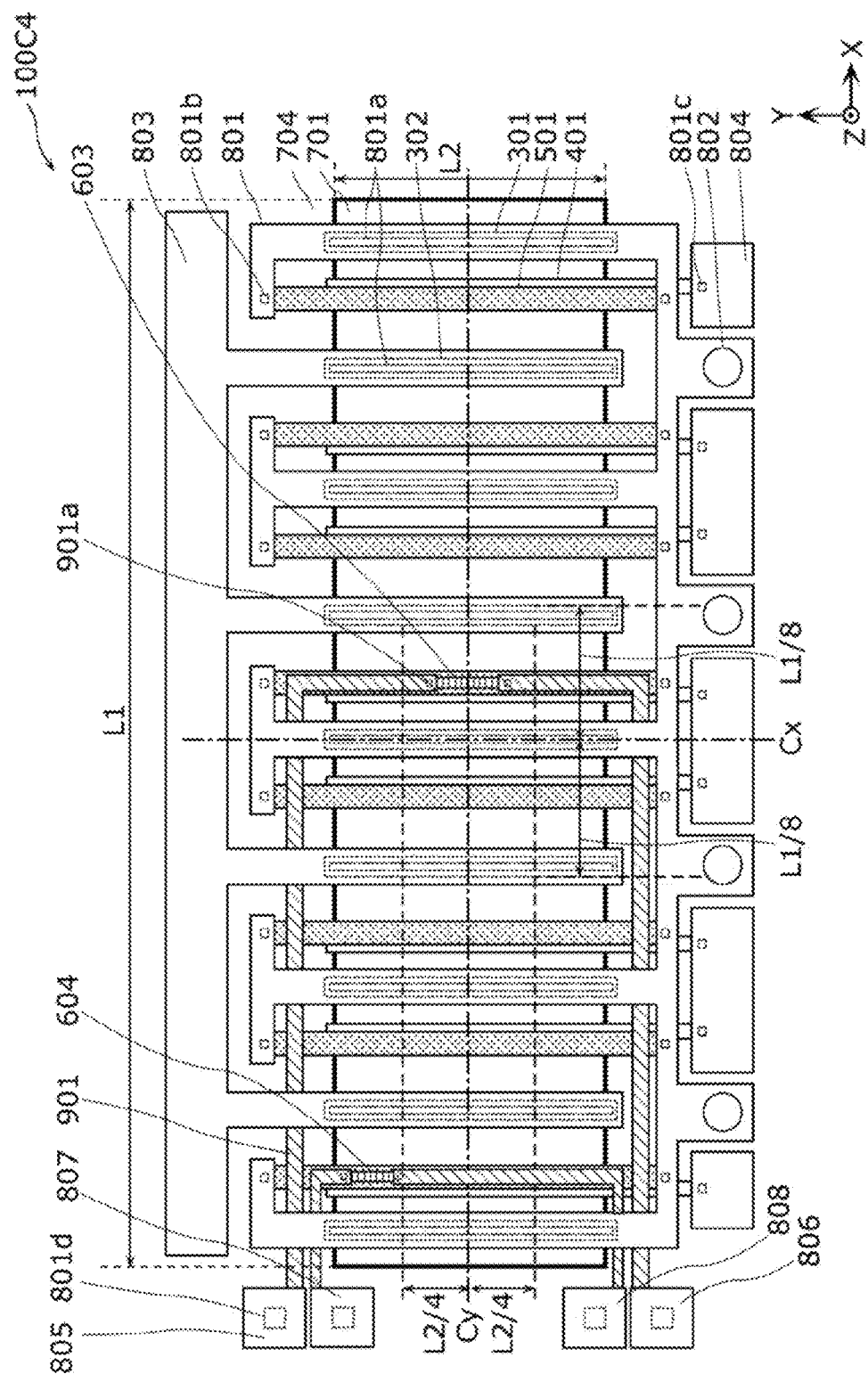
FIG. 6C is a plan view illustrating a third example of the configuration of the semiconductor device for high-frequency amplification according to Variation 4 of Embodiment 1.

In Variation 4, other arrangement examples of a plurality of resistors are described with reference to FIGS. 6A to 6C. FIGS. 6A to 6C are plan views illustrating examples of a configuration of a semiconductor device for high-frequency amplification according to Variation 4 of Embodiment 1. It should be noted that FIG. 6A illustrates a configuration of semiconductor device for high-frequency amplification 100C2, FIG. 6B illustrates a configuration of semiconductor device for high-frequency amplification 100C3, and FIG. 6C illustrates a configuration of semiconductor device for high-frequency amplification 100C4.

As illustrated in FIGS. 6A, 6B, and 6C, the terminal pads connected to first resistor 603 are different from the terminal pads connected to second resistor 604. Specifically, one end of first resistor 603 is connected to first resistor terminal 805, and the other end of first resistor 603 is connected to second resistor terminal 806. One end of second resistor 604 is connected to third resistor terminal 807, and the other end of second resistor 604 is connected to fourth resistor terminal 808. Thus, it is possible to detect temperature changes at two given spots within active region 701, as changes in the resistance values at the two given spots. Third resistor terminal 807 and fourth resistor terminal 808 are examples of the second terminal pad.

As illustrated in FIGS. 6A to 6C, first resistor 603 is disposed in the area within a distance of L1/8 in the X-axis direction from the center (long dashed short dashed line Cx) in the X-axis direction of active region 701 and within a distance of L2/4 in the Y-axis direction from the center (long dashed short dashed line Cy) in the Y-axis direction of active region 701. Thus, semiconductor devices for high-frequency amplification 100C2 to 100C4 can selectively detect, as a change in the resistance value, a temperature change in a heat generation concentration portion near the center of active region 701.

In addition, as illustrated in FIG. 6A, second resistor 604 may be farther in the X-axis direction from the center in the X-axis direction of active region 701 than first resistor 603 is. Second resistor 604 may be disposed in an area within active region 701 that is beyond a distance of L1/8 in the X-axis direction from the center in the X-axis direction of active region 701 and within a distance of L2/4 in the Y-axis direction from the center in the Y-axis direction of active region 701. Thus, semiconductor devices for high-frequency amplification 100C2 to 100C4 can selectively detect, as a change in the resistance value, a temperature change in a portion of active region 701 where heat generation is most concentrated near an end portion of active region 701 when devices are disposed at regular intervals.

As illustrated in FIG. 6B, second resistor 604 may be disposed in an area within active region 701 that is within a distance of L1/8 in the X-axis direction from the center in the X-axis direction of active region 701 and beyond a distance of L2/4 in the Y-axis direction from the center in the Y-axis direction of active region 701. Thus, semiconductor devices for high-frequency amplification 100C2 to 100C4 can selectively detect, as a change in the resistance value, a temperature change in a portion of active region 701 where heat generation is least concentrated near the center of active region 701 when the devices are disposed at regular intervals.

As illustrated in FIG. 6C, second resistor 604 may be disposed in an area within active region 701 that is beyond a distance of L1/8 in the X-axis direction from the center in the X-axis direction of active region 701 and beyond a distance of L2/4 in the Y-axis direction from the center in the Y-axis direction of active region 701. Thus, semiconductor devices for high-frequency amplification 100C2 to 100C4 can selectively detect, as a change in the resistance value, a temperature change in a portion of active region 701 where heat generation is least concentrated in the entirety of active region 701 when the devices are disposed at regular intervals.

As described above, the resistors of semiconductor device for high-frequency amplification 100C2 according to Variation 4 include first resistor 603 and second resistor 604. In the second direction in the plan view, first resistor 603 is disposed in the area within a distance of L1/8 from the center of active region 701, and second resistor 604 is disposed in an area beyond a distance of L1/8 from the center of active region 701.

This makes it possible to detect, as changes in the resistance values, temperature changes in a large-heat-generation portion in the second direction and a small-heat-generation portion in the second direction within active region 701. This makes it possible to detect a temperature difference in active region 701.

In addition, for instance, the resistors include first resistor 603 and second resistor 604. In the first direction in the plan view, first resistor 603 is disposed in the area within a distance of L2/4 from the center of active region 701, and second resistor 604 is disposed in an area beyond a distance of L2/4 from the center of active region 701.

This makes it possible to detect, as changes in the resistance values, temperature changes in a large-heat-generation portion in the first direction and a small-heat-generation portion in the first direction within active region 701. This makes it possible to detect a temperature difference in active region 701.

Variation 5 of Embodiment 1

Figure 7A:
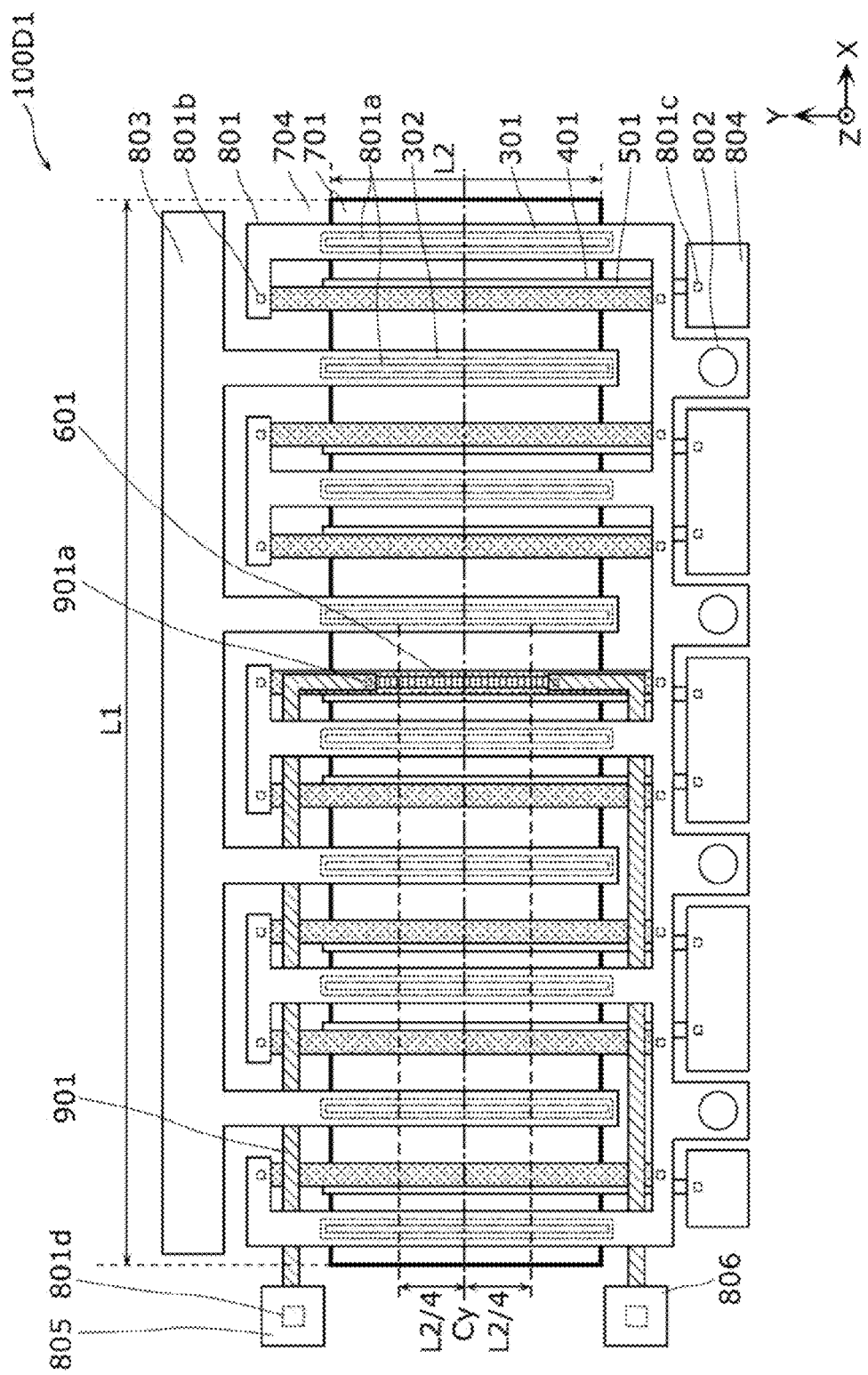
FIG. 7A is a plan view illustrating a first example of a configuration of a semiconductor device for high-frequency amplification according to Variation 5 of Embodiment 1.
Figure 7B:
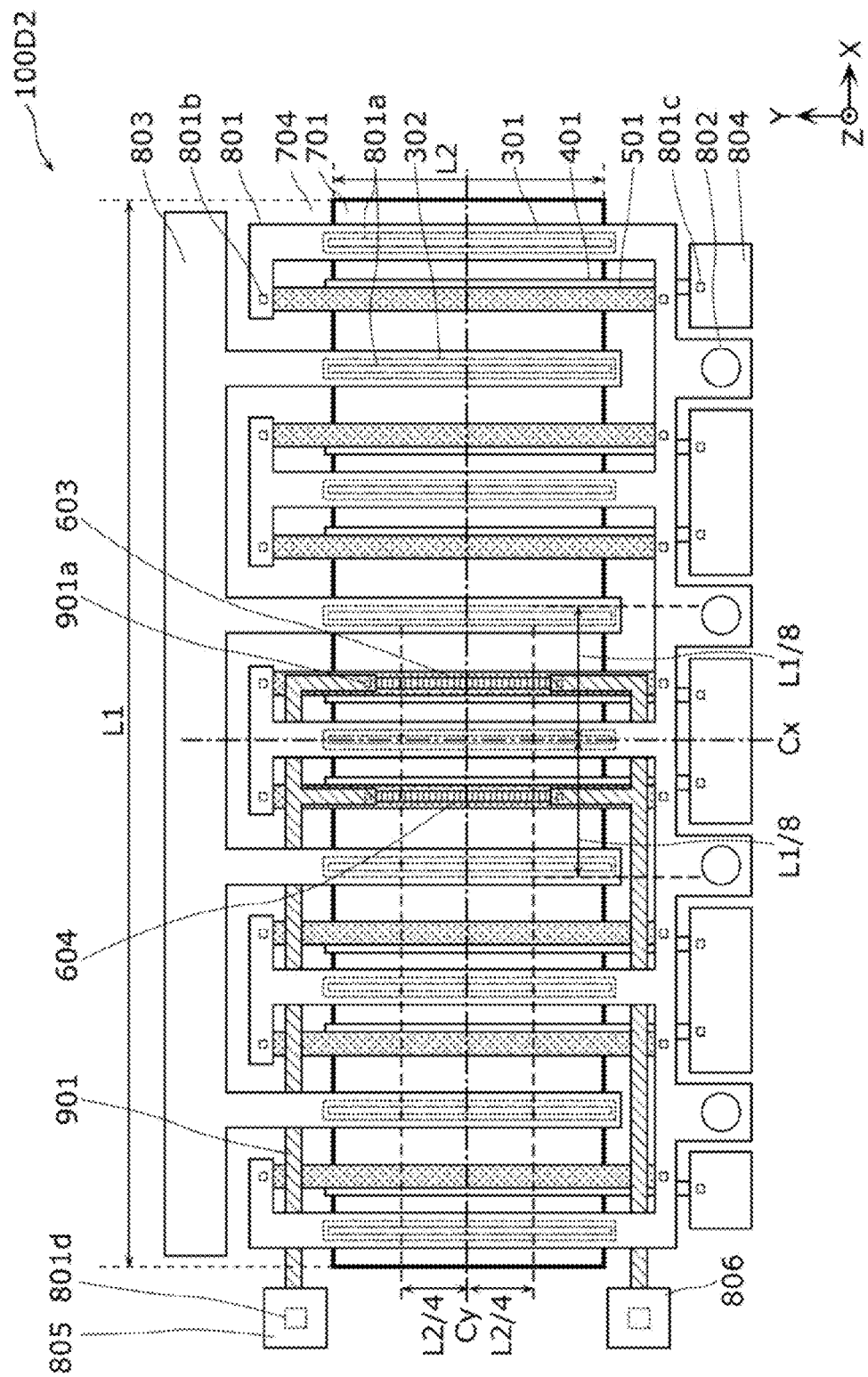
FIG. 7B is a plan view illustrating a second example of the configuration of the semiconductor device for high-frequency amplification according to Variation 5 of Embodiment 1.
Figure 7C:
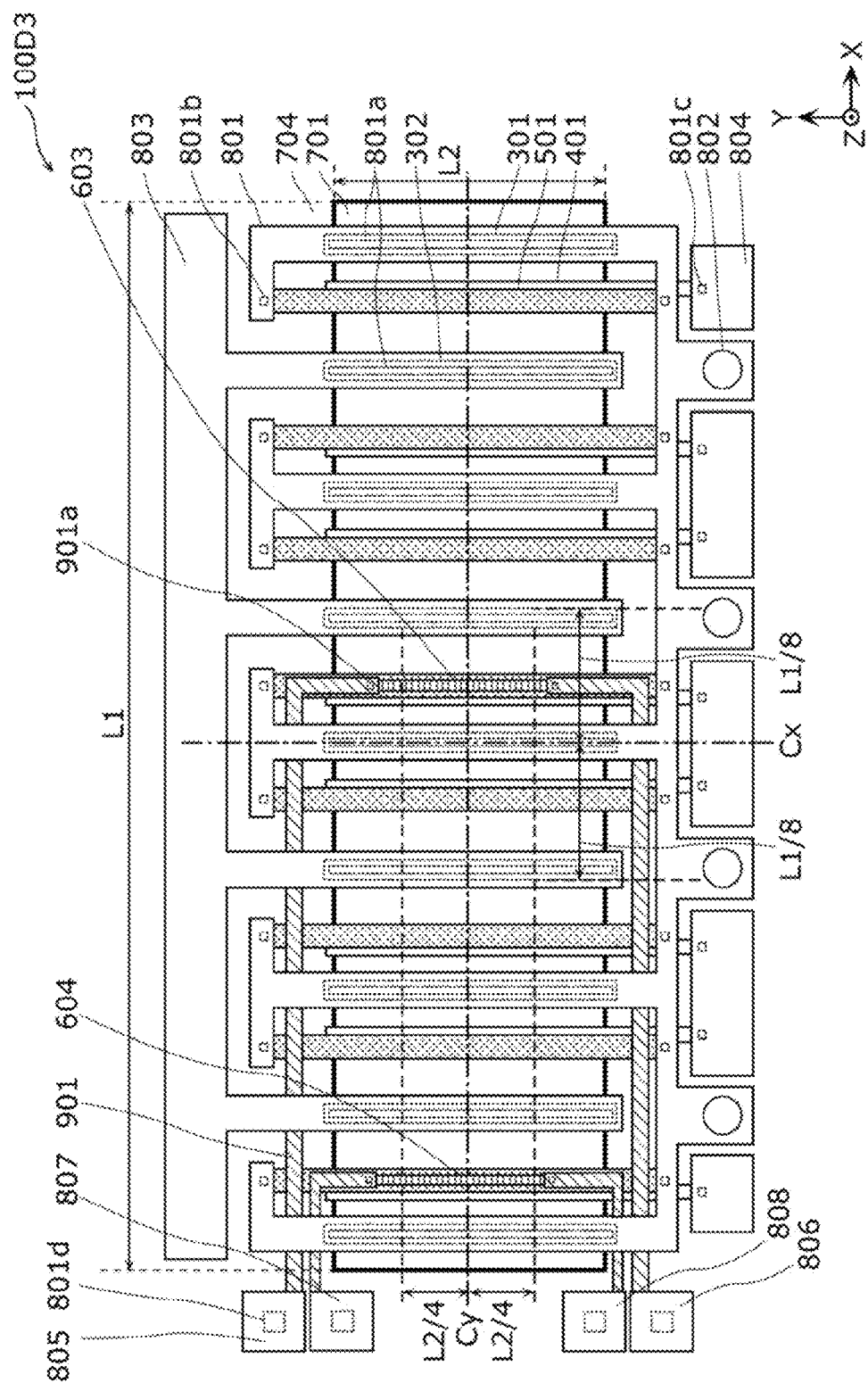
FIG. 7C is a plan view illustrating a third example of the configuration of the semiconductor device for high-frequency amplification according to Variation 5 of Embodiment 1.

In Variation 5, examples in which the length of a resistor differs from that of the resistor in, for example, Embodiment 1 are described with reference to FIGS. 7A to FIG. 7C. FIGS. 7A to FIG. 7C are plan views illustrating examples of a configuration of a semiconductor device for high-frequency amplification according to Variation 5 of Embodiment 1. Semiconductor device for high-frequency amplification 100D1 illustrated in FIG. 7A has a configuration in which the length of resistor 601 of semiconductor device for high-frequency amplification 100 illustrated in FIG. 1 is extended. Semiconductor device for high-frequency amplification 100D2 illustrated in FIG. 7B has a configuration in which the lengths of first resistor 603 and second resistor 604 of semiconductor device for high-frequency amplification 100C1 illustrated in FIG. 5 are extended. Semiconductor device for high-frequency amplification 100D3 illustrated in FIG. 7C has a configuration in which the lengths of first resistor 603 and second resistor 604 of semiconductor device for high-frequency amplification 100C2 illustrated in FIG. 6A are extended.

As illustrated in FIG. 7A, resistor 601 having a length of L2/2 or longer in the Y-axis direction may be disposed in active region 701. In addition, as illustrated in FIGS. 7B and 7C, first resistor 603 and second resistor 604 each of which has a length of L2/2 or longer in the Y-axis direction may be disposed in active region 701. This makes it possible to detect an average temperature change in the entire heat quantity as a change in the resistance value. It should be noted that each of resistor 601, first resistor 603, and second resistor 604 may have a length of L2 or less in the Y-axis direction of active region 701.

As described above, in the plan view, when the length in first direction of active region 701 (that is, the length of active region 701 in the first direction) is defined as L2, each of the resistors included in semiconductor devices for high-frequency amplification 100D1 to 100D3 according to Variation 5 has a length in the first direction of L2/2 or longer.

Since the resistor has a length in the first direction of L2/2 or longer, that is, the resistor is long, it is possible to detect an average temperature change in the entirety of gate electrode 401 as a change in the resistance value.

Variation 6 of Embodiment 1

Figure 8B:
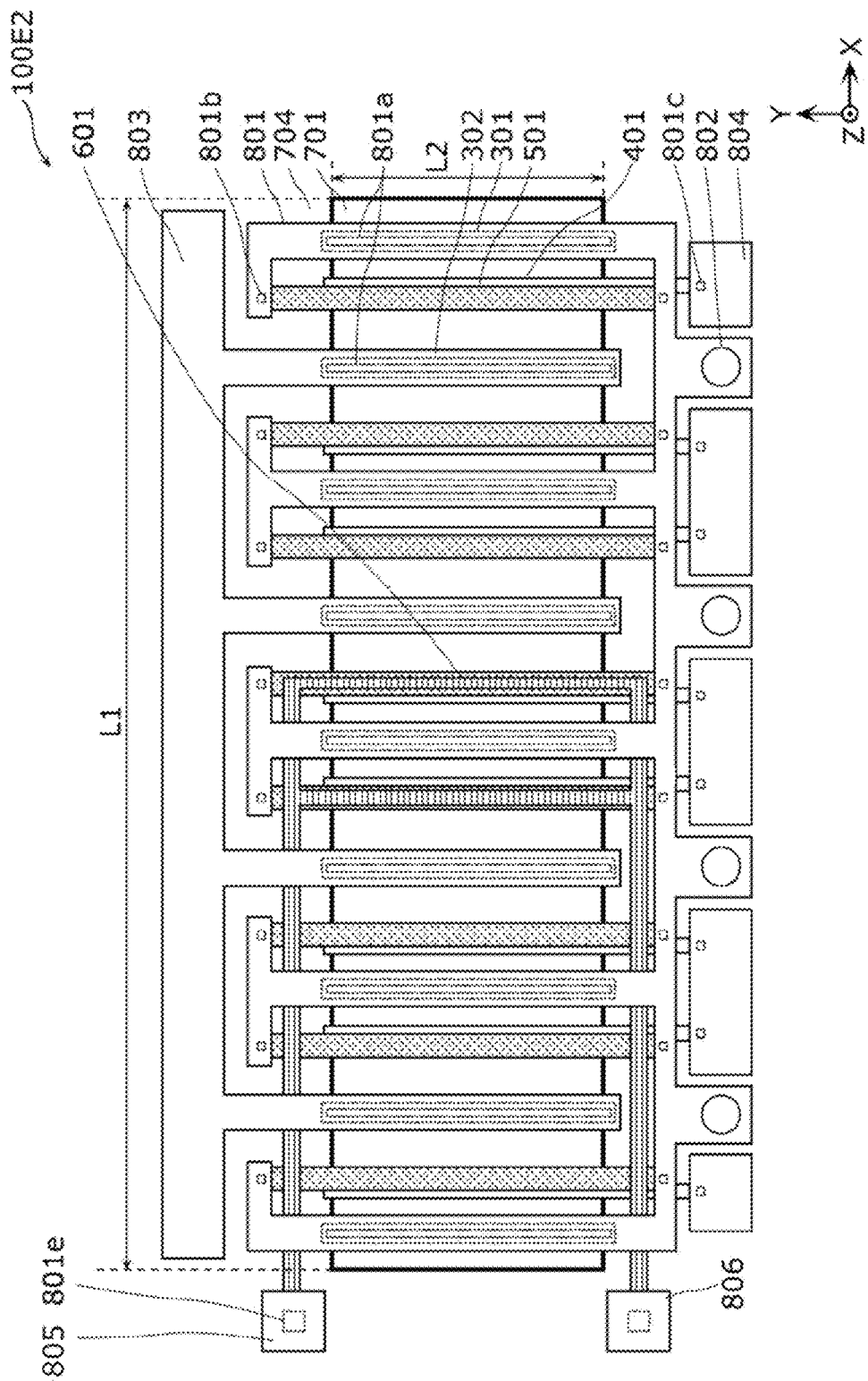
FIG. 8B is a plan view illustrating a second example of the configuration of the semiconductor device for high-frequency amplification according to Variation 6 of Embodiment 1.
Figure 8C:
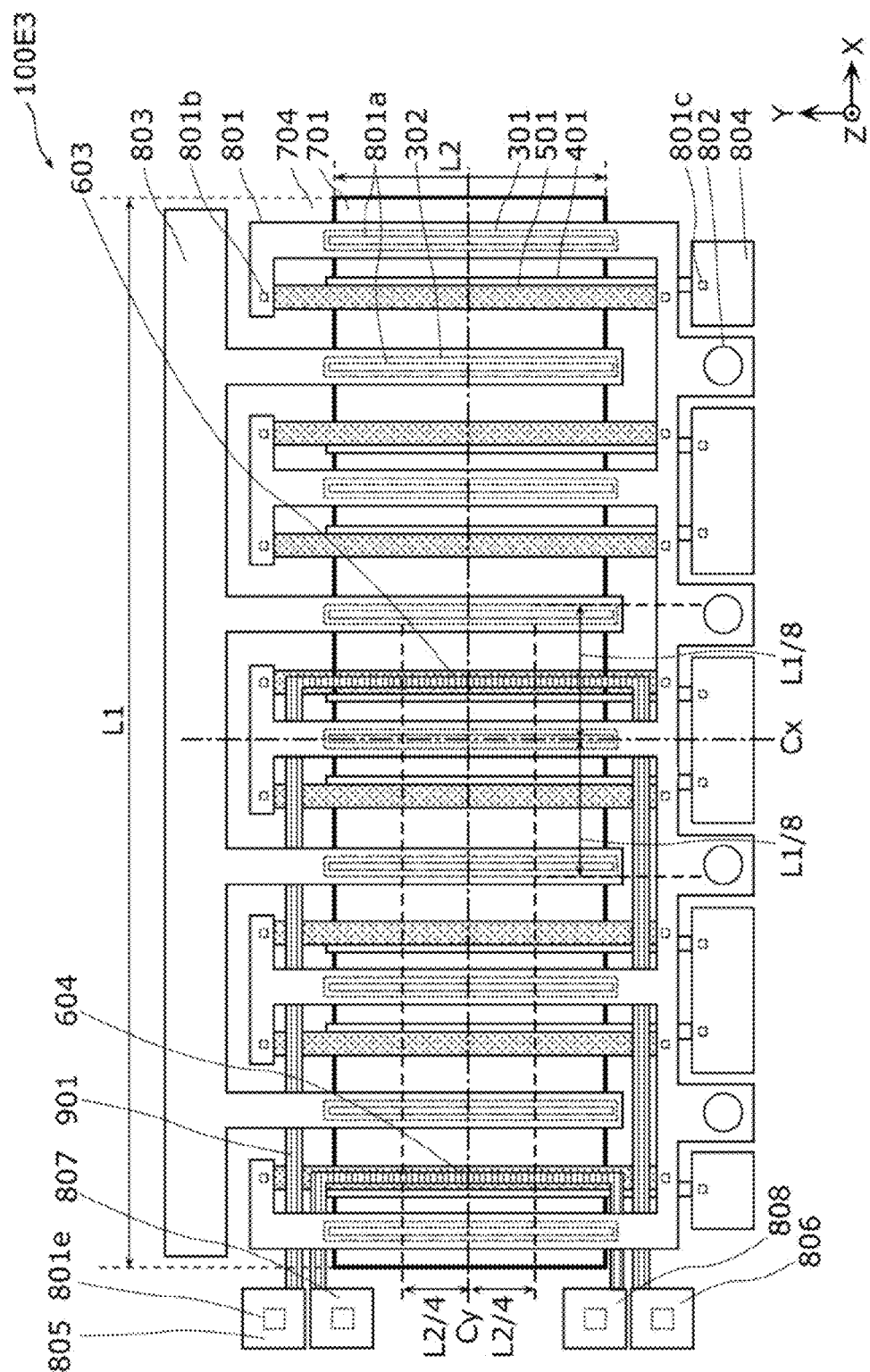
FIG. 8C is a plan view illustrating a third example of the configuration of the semiconductor device for high-frequency amplification according to Variation 6 of Embodiment 1.

In Variation 6, configurations without second interconnect layer 901 are described with reference to FIGS. 8A to 8C. FIGS. 8A to FIG. 8C are plan views illustrating examples of a configuration of a semiconductor device for high-frequency amplification according to Variation 6 of Embodiment 1. It should be noted that FIG. 8A illustrates a configuration of semiconductor device for high-frequency amplification 100E1, FIG. 8B illustrates a configuration of semiconductor device for high-frequency amplification 100E2, and FIG. 8C illustrates a configuration of semiconductor device for high-frequency amplification 100E3.

As illustrated in FIGS. 8A and 8B, resistor 601 extends into an area beyond a distance of L2/2 in the Y-axis direction from the center in the Y-axis direction of active region 701, that is, extends beyond active region 701. Resistor 601 extends beyond active region 701 and into non-active region 704. For instance, resistor 601 extends from non-active region 704 on the negative side of the Y-axis relative to active region 701 into non-active region 704 on the positive side of the Y-axis relative to active region 701.

In addition, resistor 601 extends up to first resistor terminal 805 and second resistor terminal 806 and are directly connected to first resistor terminal 805 and second resistor terminal 806 without via second interconnect layer 901. By covering, with first resistor terminal 805 and second resistor terminal 806, openings 801e for connection to the resistor which are for connecting first interconnect layer 801 to both ends of resistor 601, the present disclosure can be implemented without second interconnect layer 901. Openings 801e for connection to the resistor are openings for directly connecting resistor 601 to first resistor terminal 805 and second resistor terminal 806. Openings 801e for connection to the resistor pass through third insulating layer 203 and fourth insulating layer 204.

Resistor 601 configured as above includes a first portion extending in the Y-axis direction and functioning as a temperature detection portion and second portions extending in the X-axis direction from both ends of the first portion and functioning as interconnections. In the plan view, the second portions are formed in non-active regions 704. In the examples illustrated in FIGS. 8A and 8B, in the plan view, resistor 601 has a shape obtained by rotating a U-shape by an angle of 90 degrees counterclockwise and providing corners (a shape made up of three straight lines).

In addition, as illustrated in FIG. 8C, first resistor 603 and second resistor 604 are disposed in the areas beyond a distance of L2/4 in the Y-axis direction from the center in the Y-axis direction of active region 701, for example, extend beyond active region 701. First resistor 603 and second resistor 604 extend beyond active region 701 and into non-active region 704. For instance, first resistor 603 and second resistor 604 extend from non-active region 704 on the negative side of the Y-axis relative to active region 701 into non-active region 704 on the positive side of the Y-axis relative to active region 701.

First resistor 603 and second resistor 604 each include a first portion extending in the Y-axis direction and functioning as a temperature detection portion and second portions extending in the X-axis direction from both ends of the first portion and functioning as interconnections. In the plan view, the second portions are formed in non-active regions 704.

As described above, each of resistors 601 included in semiconductor devices for high-frequency amplification 100E1 to 100E3 according to Variation 6 has a length in the first direction (e.g., the Y-axis direction) of L2 or longer and extends into non-active region 704.

Thus, when resistor 601 and an interconnect layer (e.g., second interconnect layer 901) are connected, since a connection portion having a complex configuration is not formed in active region 701, it is possible to readily change interconnect layers, that is, readily connect resistor 601 and the interconnect layer. In addition, even if second interconnect layer 901 is not provided, resistor 601 can be electrically connected to first resistor terminal 805 and second resistor terminal 806. This can simplify the configurations of semiconductor devices for high-frequency amplification 100E1 to 100E3.

Embodiment 2

[2-1. Configuration of Semiconductor Device for High-Frequency Amplification]

Figure 9:
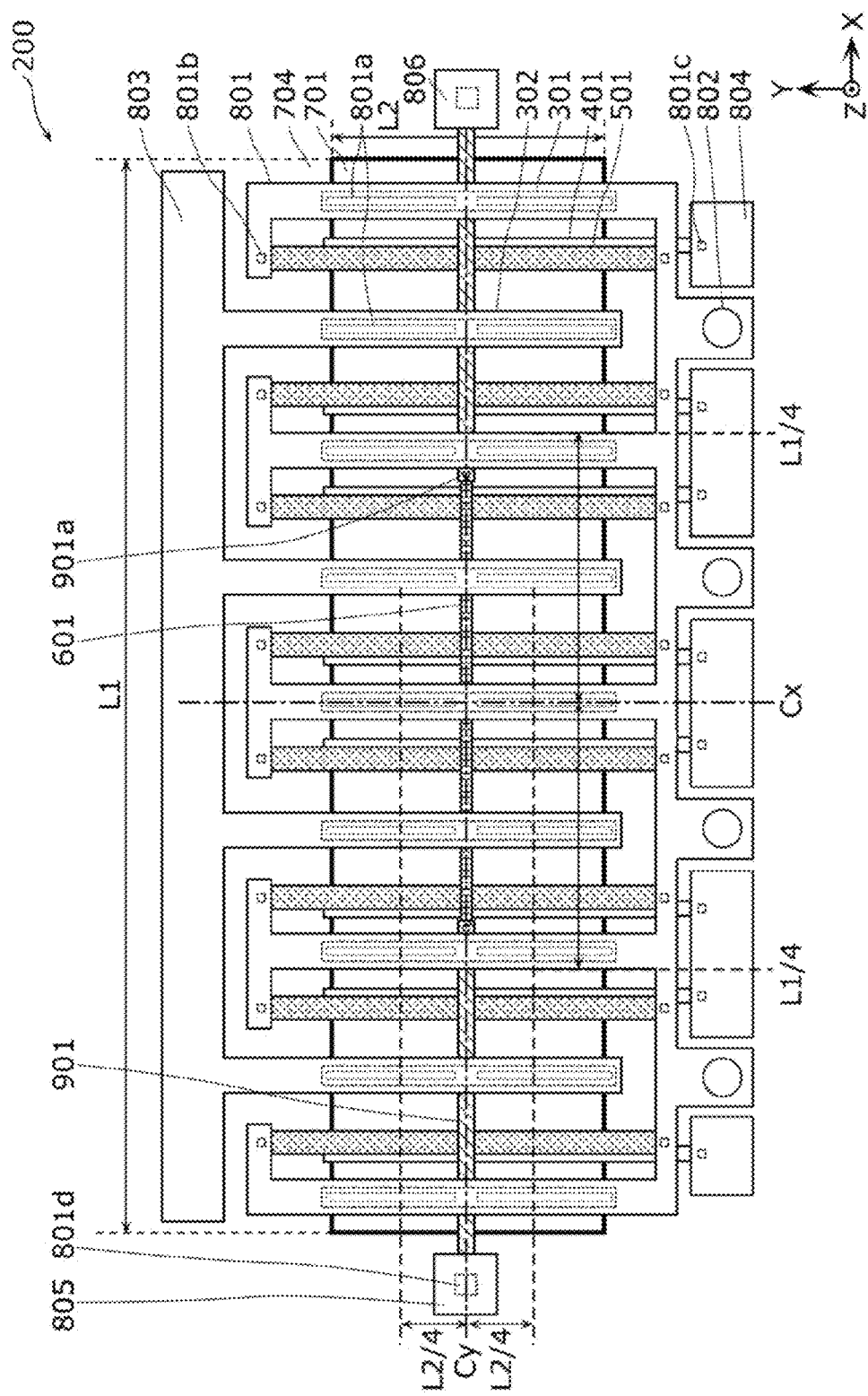
FIG. 9 is a plan view illustrating a configuration of a semiconductor device for high-frequency amplification according to Embodiment 2.

Next, a semiconductor device for high-frequency amplification according to Embodiment 2 is described with reference to FIG. 9. FIG. 9 is a plan view illustrating a configuration of semiconductor device for high-frequency amplification 200 according to Embodiment 2. It should be noted that in Embodiment 2, constituent elements identical or similar to those described in Embodiment 1 are assigned the same reference signs, and detailed explanations are omitted.

As illustrated in FIG. 9, resistor 601 of semiconductor device for high-frequency amplification 200 extends parallel to an X-axis direction. Resistor 601 is rectangular and long in the X-axis direction that is a direction in which a plurality of gate electrodes 401 are aligned. Thus, resistor 601 crosses the plurality of gate electrodes 401, which makes it possible to detect temperature changes in the plurality of gate electrodes 401 as a change in the resistance value. In Embodiment 2, in the plan view, a longitudinal direction of gate electrode 401 intersects a longitudinal direction of resistor 601. In the example illustrated in FIG. 9, the longitudinal direction of gate electrode 401 is orthogonal to the longitudinal direction of resistor 601. It should be noted that in the plan view, openings 801a for connection to the source and drain electrodes cannot be provided in the portion where resistor 601 is provided.

For instance, in the plan view, resistor 601 is disposed in the area within a distance of L1/4 in the X-axis direction from the center (long dashed short dashed line Cx) in the X-axis direction of active region 701 and within a distance of L2/4 in a Y-axis direction from the center (long dashed short dashed line Cy) in the Y-axis direction of active region 701.

Thus, resistor 601 crossing the plurality of gate electrodes 401 can detect a temperature change in a heat generation concentrated portion as a change in the resistance value. It should be noted that the length in the X-axis direction from long dashed short dashed line Cx of resistor 601 is not limited to a length of L1/4 or less and resistor 601 may be provided so as to cross at least two gate electrodes 401.

As described above, in the plan view, the longitudinal direction of resistor 601 included in semiconductor device for high-frequency amplification 200 according to Embodiment 2 corresponds to a second direction (e.g., the X-axis direction) orthogonal to a first direction (e.g., the Y-axis direction) which is an extending direction of gate electrode 401.

Thus, resistor 601 crosses the plurality of gate electrodes 401, which makes it possible to detect temperature changes in the plurality of gate electrodes 401 as a change in the resistance value.

In addition, for instance, in the plan view, when the length in the first direction of active region 701 (that is, the length of active region 701 in the first direction) is defined as L2, in the first direction in the plan view, resistor 601 is disposed in the area within a distance of L2/4 from the center of active region 701.

Thus, it is possible to detect, as a change in the resistance value, temperature changes in the plurality of gate electrodes 401 in a portion near the center of active region 701 where heat generation tends to be concentrated (a large-heat-generation portion).

Variation of Embodiment 2

Figure 10A:
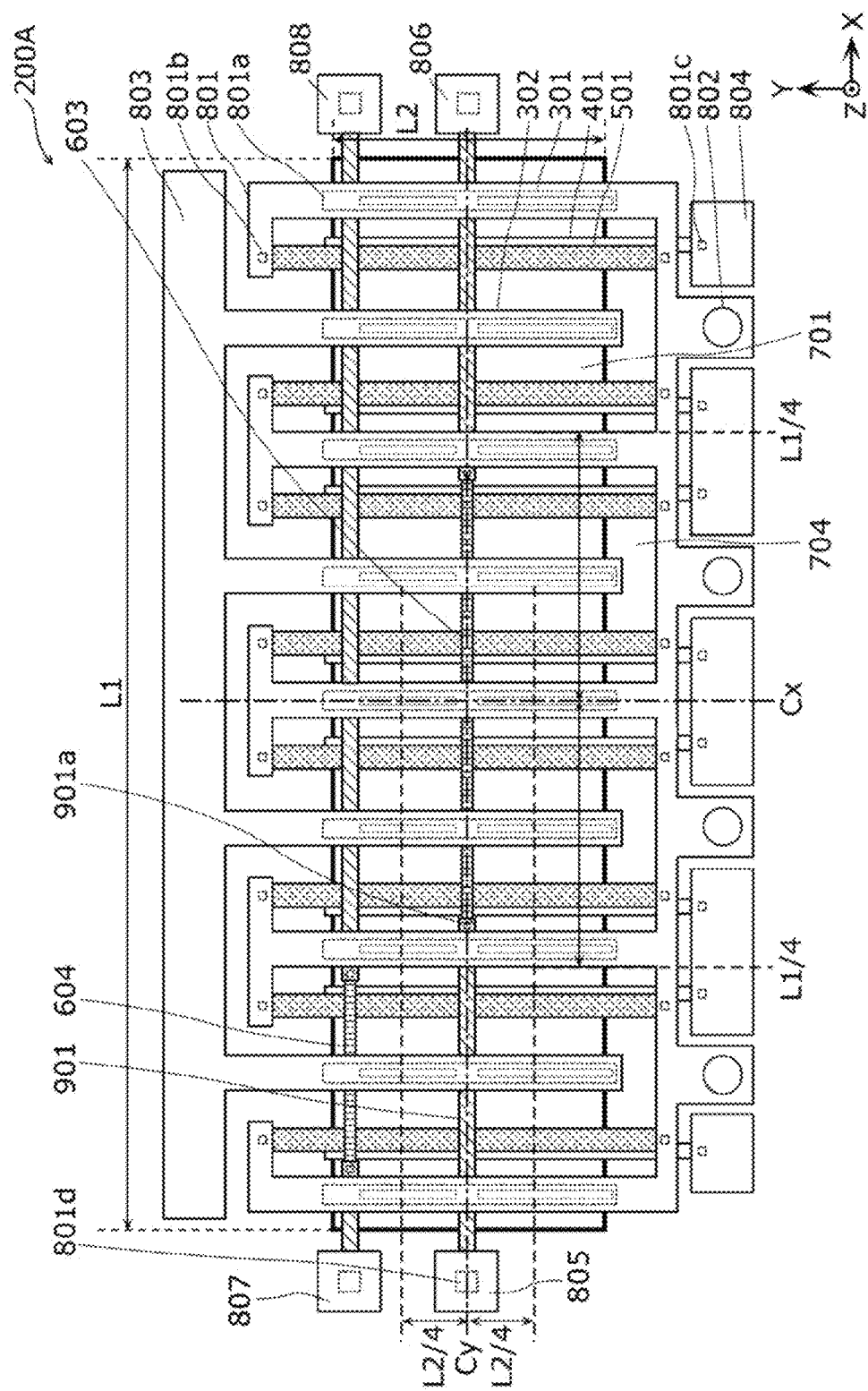
FIG. 10A is a plan view illustrating a first example of a configuration of a semiconductor device for high-frequency amplification according to a variation of Embodiment 2.
Figure 10B:
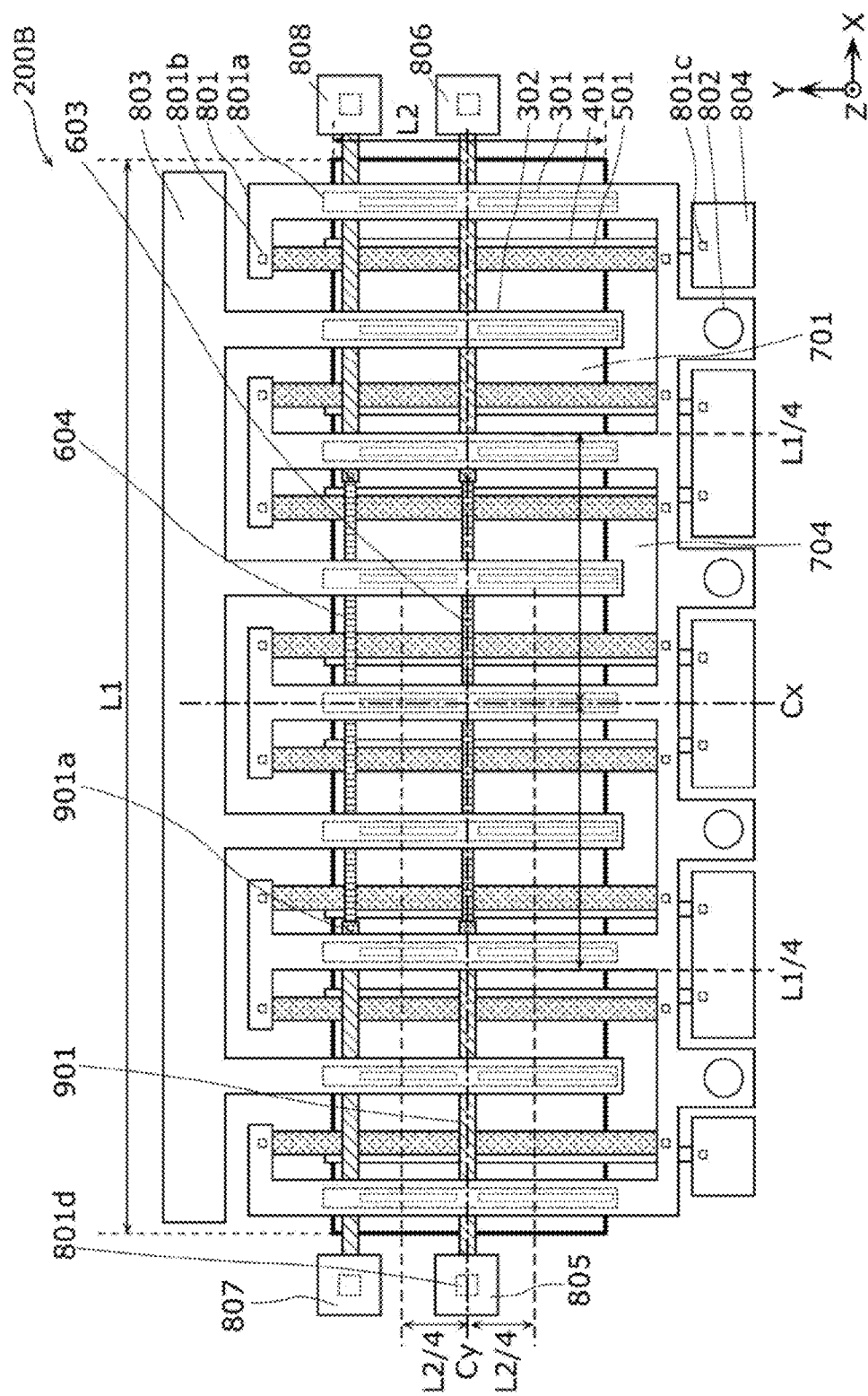
FIG. 10B is a plan view illustrating a second example of the configuration of the semiconductor device for high-frequency amplification according to the variation of Embodiment 2.

In a variation of Embodiment 2, a semiconductor device for high-frequency amplification including a plurality of resistors disposed parallel to the X-axis direction is described with reference to FIGS. 10A and 10B. FIGS. 10A and 10B are plan views illustrating examples of a configuration of the semiconductor device for high-frequency amplification according to the variation of Embodiment 2. It should be noted that FIG. 10A illustrates a configuration of semiconductor device for high-frequency amplification 200A and FIG. 10B illustrates a configuration of semiconductor device for high-frequency amplification 200B. It should be noted that in the variation, each of first resistor 603 and second resistor 604 crosses two or more gate electrodes 401.

As illustrated in FIGS. 10A and 10B, a plurality of resistors extending parallel to the X-axis direction may be present. One end of first resistor 603 is connected to first resistor terminal 805, and the other end of first resistor 603 is connected to second resistor terminal 806. One end of second resistor 604 is connected to third resistor terminal 807, and the other end of second resistor 604 is connected to fourth resistor terminal 808. Thus, it is possible to detect temperature changes in the two spots within active region 701 as changes in the resistance values in the two spots.

First resistor 603 is disposed in the area within a distance of L1/4 in the X-axis direction from the center (long dashed short dashed line Cx) in the X-axis direction of active region 701 and within a distance of L2/4 in the Y-axis direction from the center (long dashed short dashed line Cy) in the Y-axis direction of active region 701. Thus, resistor 603 crossing a plurality of gate electrodes 401 can detect a temperature change in a heat generation concentrated portion as a change in the resistance value.

As illustrated in FIG. 10A, second resistor 604 may be disposed in an area beyond a distance of L1/4 in the X-axis direction from the center in the X-axis direction of active region 701 and beyond a distance of L2/4 in the Y-axis direction from the center in the Y-axis direction of active region 701. Thus, second resistor 604 crossing a plurality of gate electrodes 401 can detect, as a change in the resistance value, a temperature change in a portion where heat generation is least concentrated in the entirety of active region 701.

It should be noted that in this case, first resistor 603 and second resistor 604 are provided so that first resistor 603 and second resistor 604 cross different gate electrodes 401. Each of first resistor 603 and second resistor 604 may cross at least one gate electrode 401. In addition, although the length in the X-axis direction of first resistor 603 differs from the length in the X-axis direction of second resistor 604, the lengths may be the same. For instance, the length in the X-axis direction of first resistor 603 closer to the center in the Y-axis direction may be longer than the length in the X-axis direction of second resistor 604 farther from the center in the Y-axis direction.

As illustrated in FIG. 10B, second resistor 604 may be disposed at a position farther in the Y-axis direction from the center in the Y-axis direction of active region 701 than first resistor 603 is. Second resistor 604 may be disposed in an area within a distance of L1/4 in the X-axis direction from the center in the X-axis direction of active region 701 and beyond a distance of L2/4 in the Y-axis direction from the center in the Y-axis direction of active region 701. Thus, second resistor 604 crossing a plurality of gate electrodes can detect, as a change in the resistance value, a temperature change in a portion where heat generation is least concentrated near the center of active region 701.

It should be noted that in this case, first resistor 603 and second resistor 604 are provided so as to cross common gate electrodes 401. However, first resistor 603 and second resistor 604 may be provided so that each of first resistor 603 and second resistor 604 crosses at least one different gate electrode 401.

As described above, the resistors of semiconductor devices for high-frequency amplification 200A and 200B according to the variation of Embodiment 2 include first resistor 603 and second resistor 604. In the first direction in the plan view, first resistor 603 is disposed in the area within a distance of L2/4 from the center of active region 701, and second resistor 604 is disposed in an area beyond a distance of L2/4 from the center of active region 701.

Thus, by using first resistor 603 and second resistor 604 crossing the plurality of gate electrodes 401, it is possible to detect, as changes in the resistance values, a temperature change in a portion within active region 701 where heat generation is concentrated and a temperature change in a portion within active region 701 where heat generation is not concentrated.

[Fabrication Method]

Then, a method of fabricating the semiconductor devices for high-frequency amplification configured as above is described with reference to FIGS. 11 to 21B. As an example, a method of fabricating semiconductor device for high-frequency amplification 100 according to Embodiment 1 is described below. FIGS. 11 to 21B are cross-sectional views for explaining the method of fabricating semiconductor device for high-frequency amplification 100 according to Embodiment 1, the cross-sectional views each illustrating a configuration of semiconductor device for high-frequency amplification 100 in the process of fabrication. In addition, FIGS. 18A, 19A, 20A, and 21A are the cross-sectional views corresponding to line IIa-IIa in FIG. 1, and FIGS. 18B, 19B, 20B, and 21B are the cross-sectional views corresponding to line IIb-IIb in FIG. 1. It should be noted that the methods of fabricating the semiconductor devices for high-frequency amplification according to the variations of Embodiment 1, Embodiment 2, and the variation of Embodiment 2 are also the same as the method of fabricating the semiconductor device for high-frequency amplification according to Embodiment 1. Thus, explanations are omitted.

Figure 11:
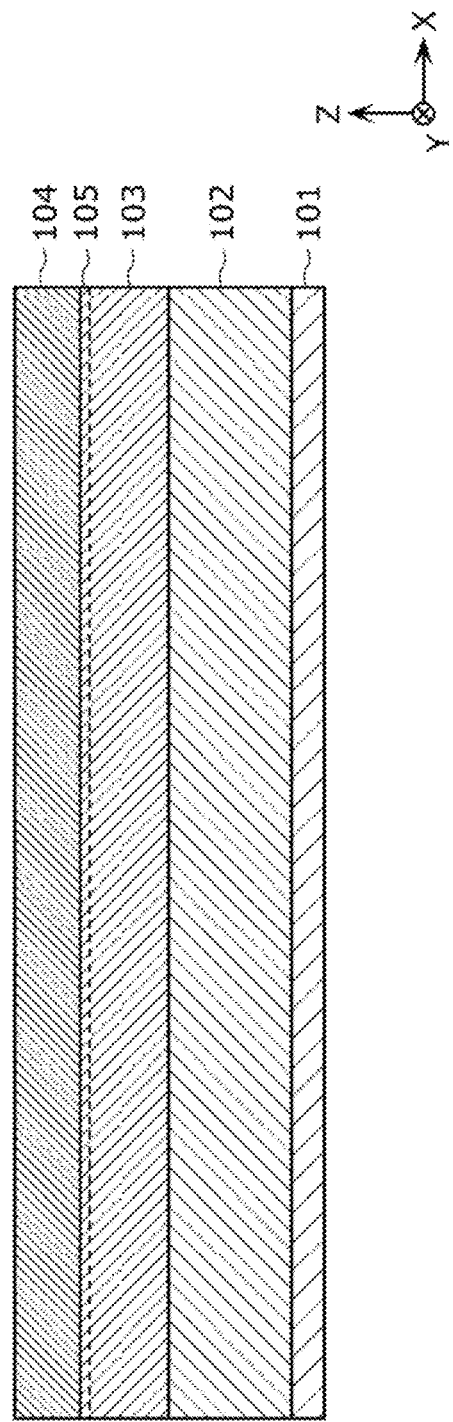
FIG. 11 is the first cross-sectional view for explaining a method of fabricating the semiconductor device for high-frequency amplification according to Embodiment 1.

As illustrated in FIG. 11, buffer layer 102, first nitride semiconductor layer 103, and second nitride semiconductor layer 104 are sequentially epitaxially grown above Si substrate 101 in the positive c-plane direction (<0001> direction) by metal organic chemical vapor deposition (MOCVD). Here, buffer layer 102 has a layered structure of AlN and AlGaN and has a thickness of 2 μm. First nitride semiconductor layer 103 contains i-type GaN and has a thickness of 200 nm. Second nitride semiconductor layer 104 contains i-type AlGaN and has a thickness of 20 nm and a composition of 25% Al. Two-dimensional electron gas layer 105 is formed on the first nitride semiconductor layer 103 side of the heterointerface between first nitride semiconductor layer 103 and second nitride semiconductor layer 104.

Figure 12:
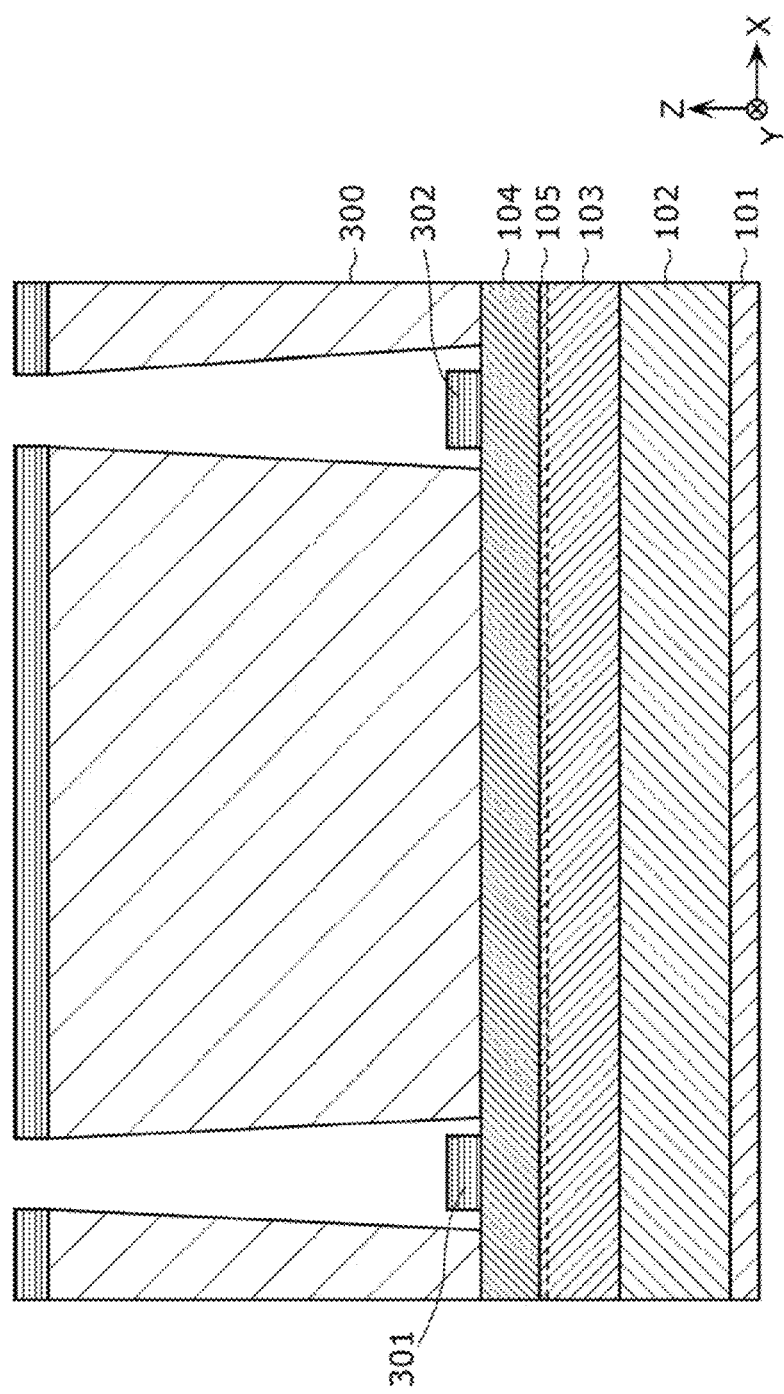
FIG. 12 is the second cross-sectional view for explaining the method of fabricating the semiconductor device for high-frequency amplification according to Embodiment 1.

Then, as illustrated in FIG. 12, photoresist 300 has openings for a source electrode 301 area and a drain electrode 302 area above second nitride semiconductor layer 104, and source electrode 301 and drain electrode 302 are formed by sequentially depositing Ti with a thickness of 20 nm and Al with a thickness of 200 nm in the openings of photoresist 300 by vapor deposition. After photoresist 300 is removed with an organic solvent, alloying treatment using thermal treatment is performed by the rapid thermal anneal (RTA) method. In this way, source electrode 301 and drain electrode 302 have an ohmic connection with two-dimensional electron gas layer 105.

Figure 13:
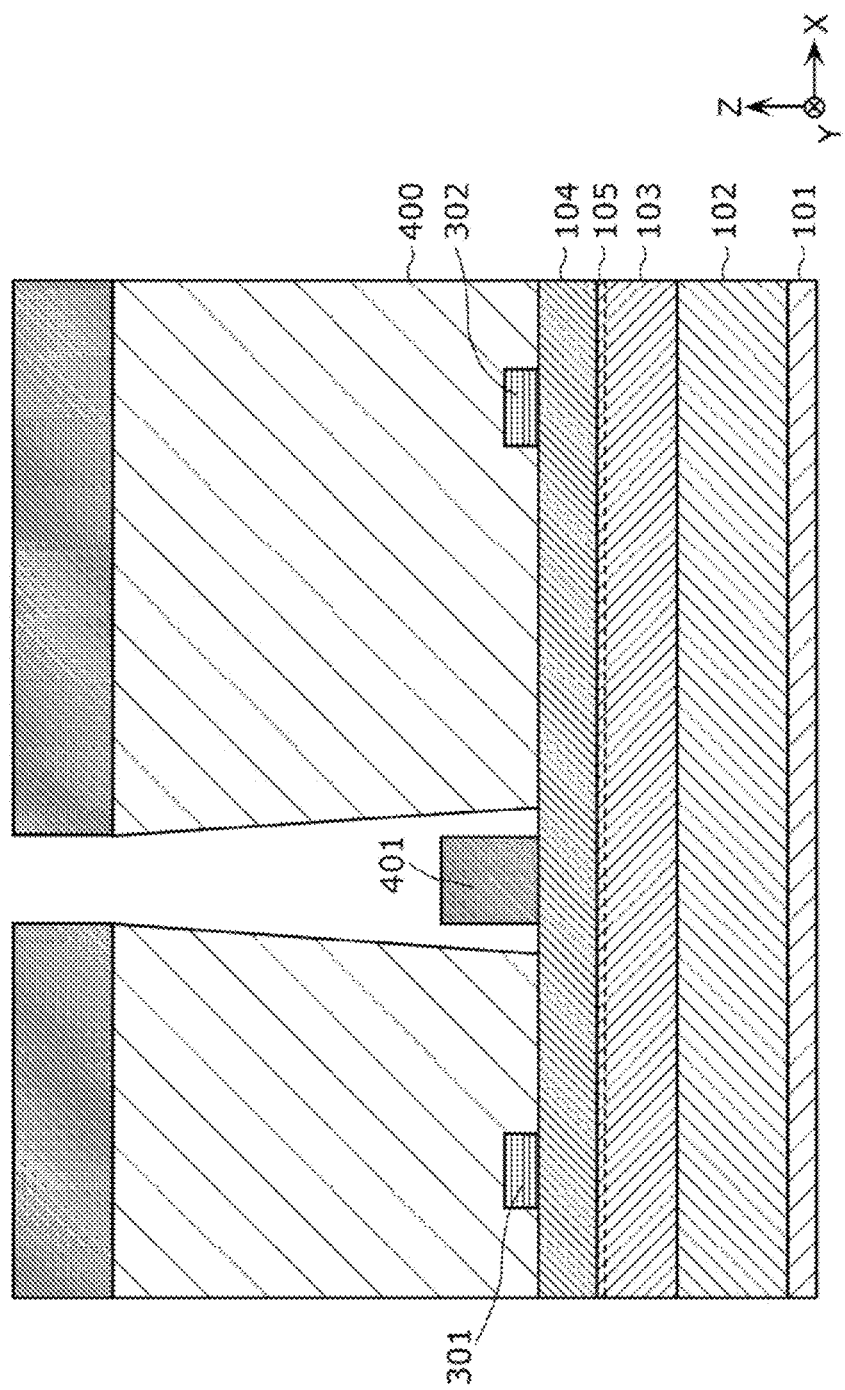
FIG. 13 is the third cross-sectional view for explaining the method of fabricating the semiconductor device for high-frequency amplification according to Embodiment 1.

Then, as illustrated in FIG. 13, photoresist 400 has an opening for a gate electrode 401 area above second nitride semiconductor layer 104, and gate electrode 401 is formed by sequentially depositing Ni with a thickness of 50 nm and Au with a thickness of 500 nm in the opening of photoresist 400 by vapor deposition.

Figure 14:
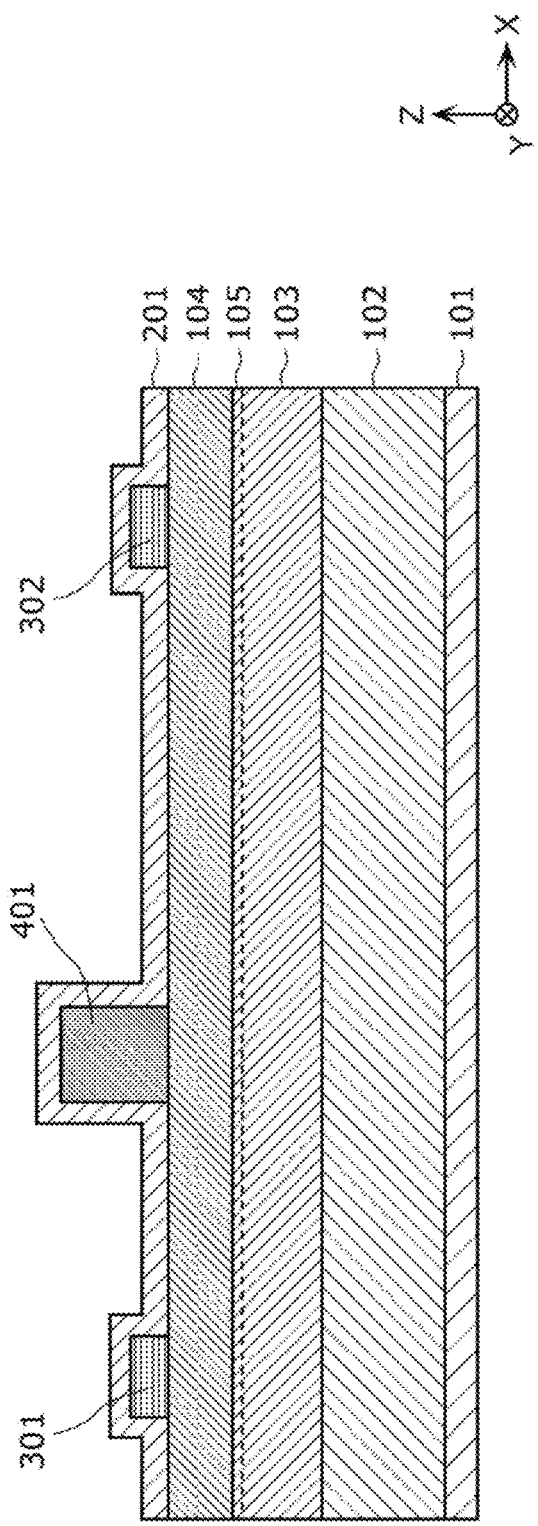
FIG. 14 is the fourth cross-sectional view for explaining the method of fabricating the semiconductor device for high-frequency amplification according to Embodiment 1.

After photoresist 400 is removed with an organic solvent, as illustrated in FIG. 14, as first insulating layer 201, SiN is formed with a thickness of 150 nm above second nitride semiconductor layer 104, source electrode 301, drain electrode 302, and gate electrode 401 by the plasma chemical vapor deposition method.

Figure 15:
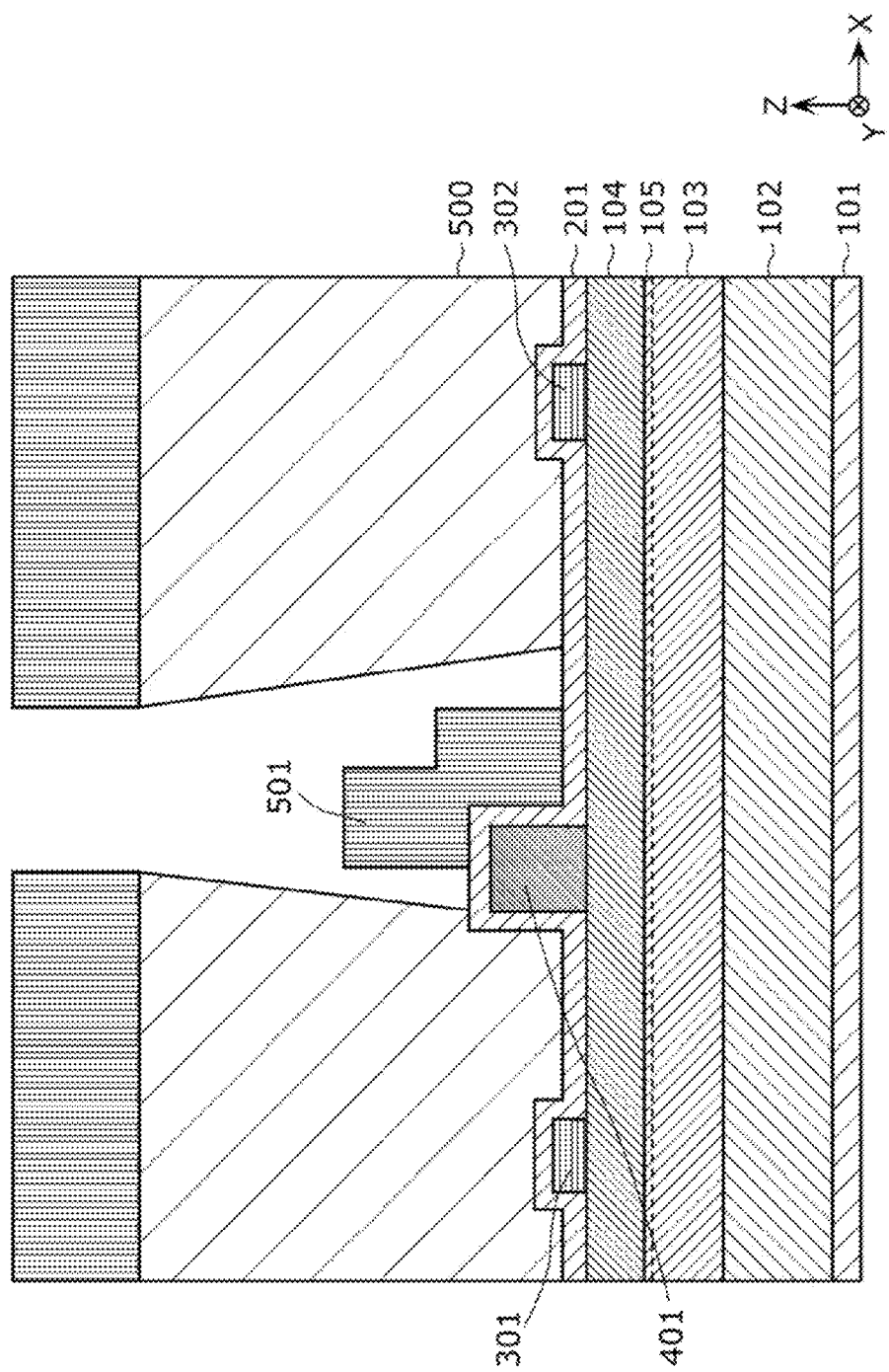
FIG. 15 is the fifth cross-sectional view for explaining the method of fabricating the semiconductor device for high-frequency amplification according to Embodiment 1.

Then, as illustrated in FIG. 15, photoresist 500 has an opening for a source field plate electrode 501 area above first insulating layer 201, and source field plate electrode 501 is formed by sequentially depositing Ni with a thickness of 150 nm and Au with a thickness of 400 nm in the opening of photoresist 500 by vapor deposition.

Figure 16:
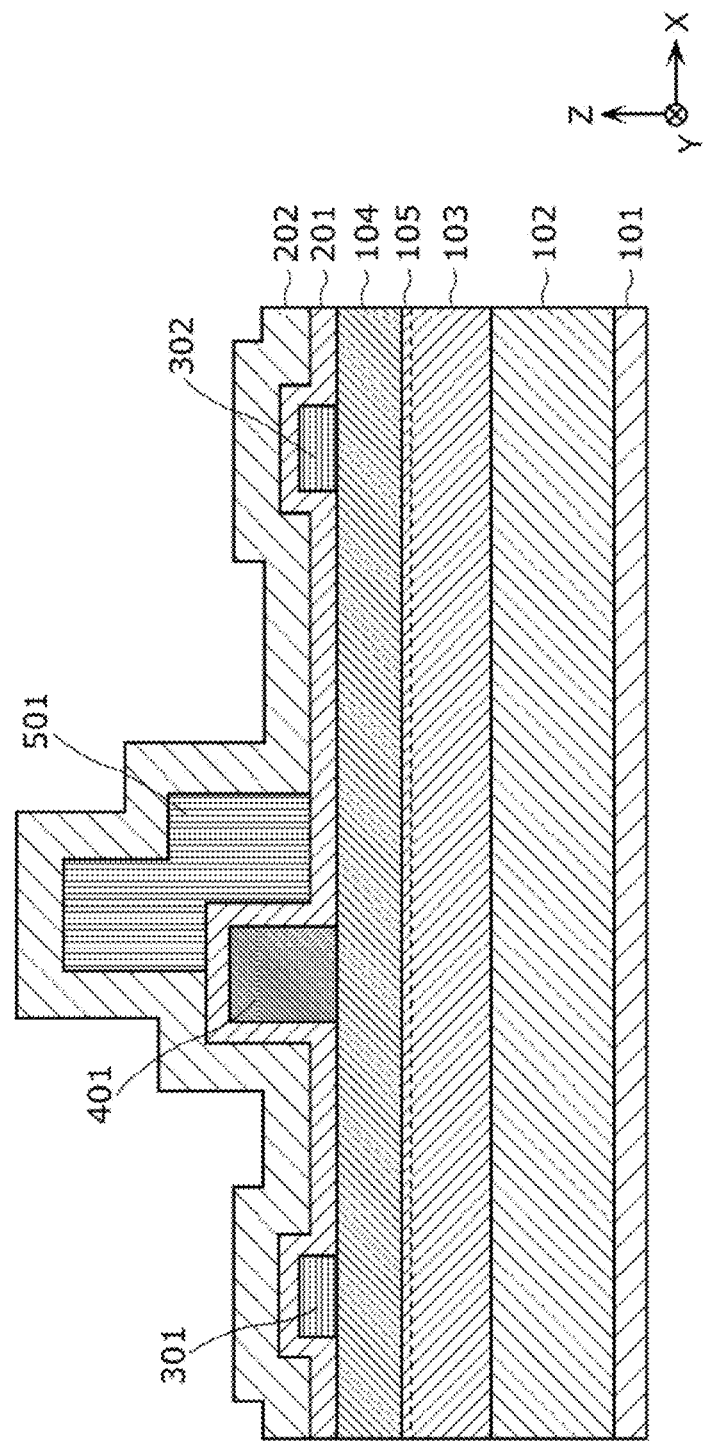
FIG. 16 is the sixth cross-sectional view for explaining the method of fabricating the semiconductor device for high-frequency amplification according to Embodiment 1.

After photoresist 500 is removed with an organic solvent, as illustrated in FIG. 16, as second insulating layer 202, SiN is formed with a thickness of 100 nm above first insulating layer 201 and source field plate electrode 501 by the plasma CVD method.

Figure 17:
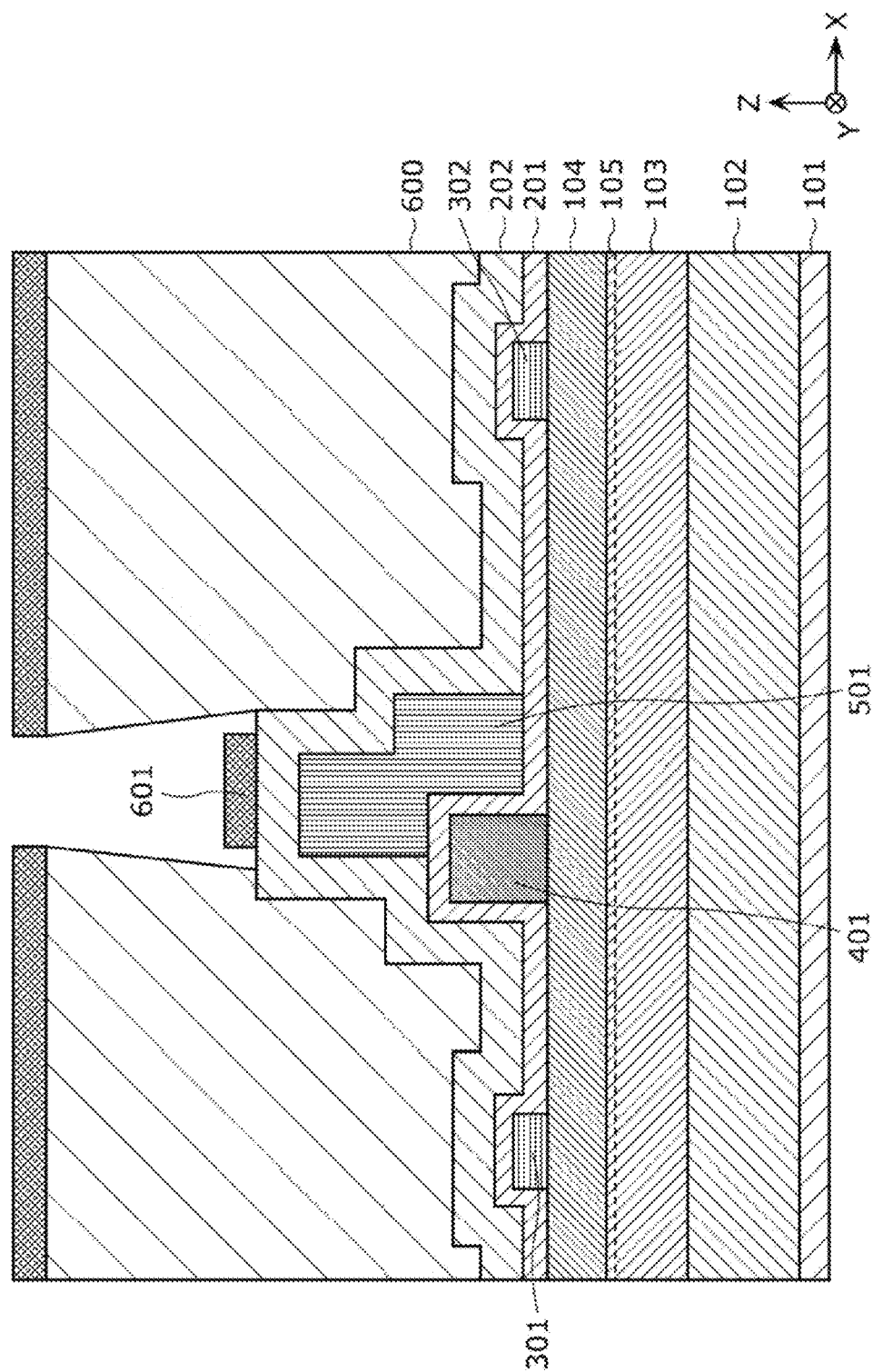
FIG. 17 is the seventh cross-sectional view for explaining the method of fabricating the semiconductor device for high-frequency amplification according to Embodiment 1.

Then as illustrated in FIG. 17, photoresist 600 has an opening for a resistor 601 area above second insulating layer 202, and resistor 601 is formed by depositing Al with a thickness of 200 nm in the opening of photoresist 600 by vapor deposition.

Figure 18A:
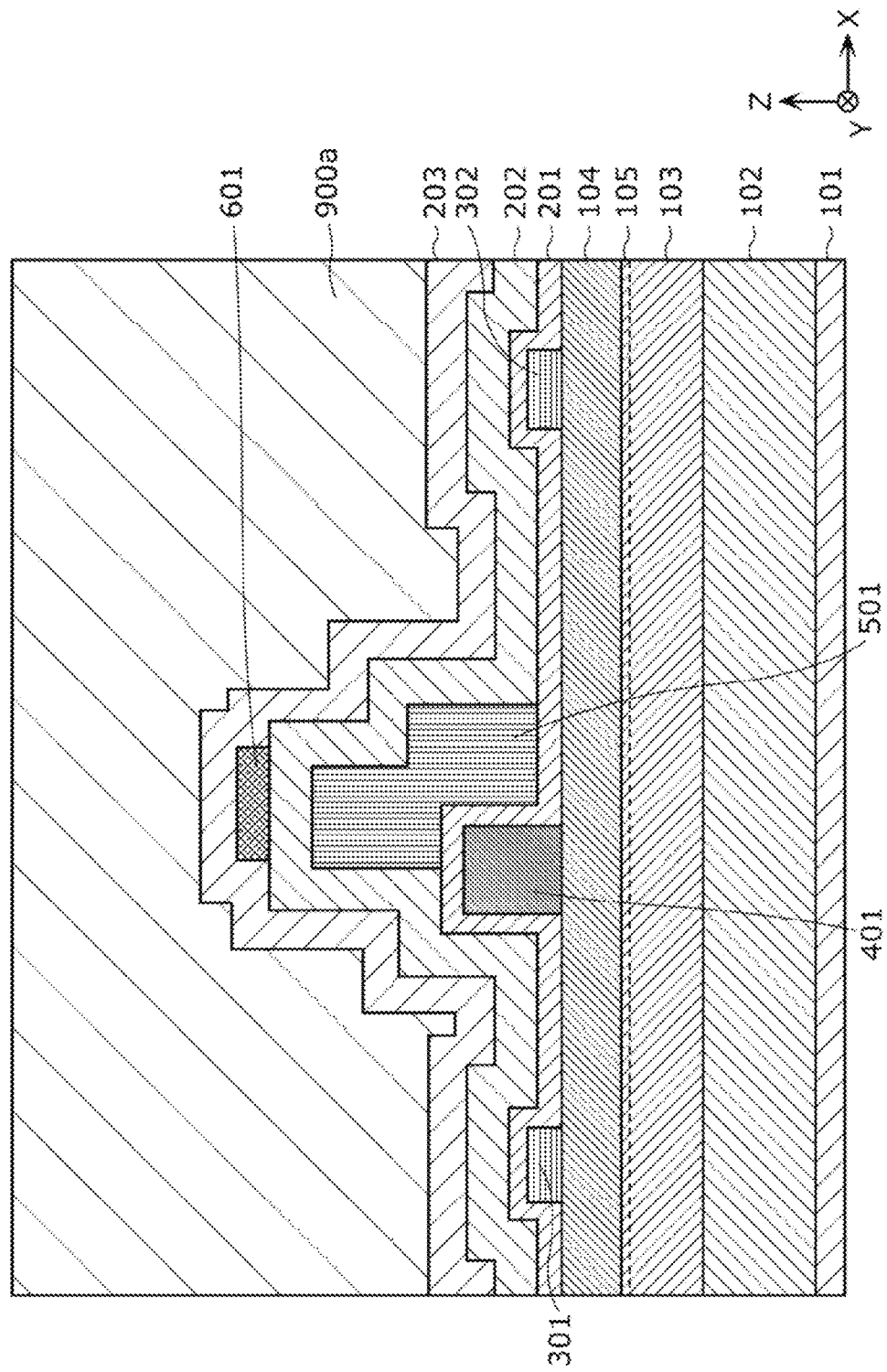
FIG. 18A is the eighth cross-sectional view corresponding to line IIa-IIa in FIG. 1, for explaining the method of fabricating the semiconductor device for high-frequency amplification according to Embodiment 1.
Figure 18B:
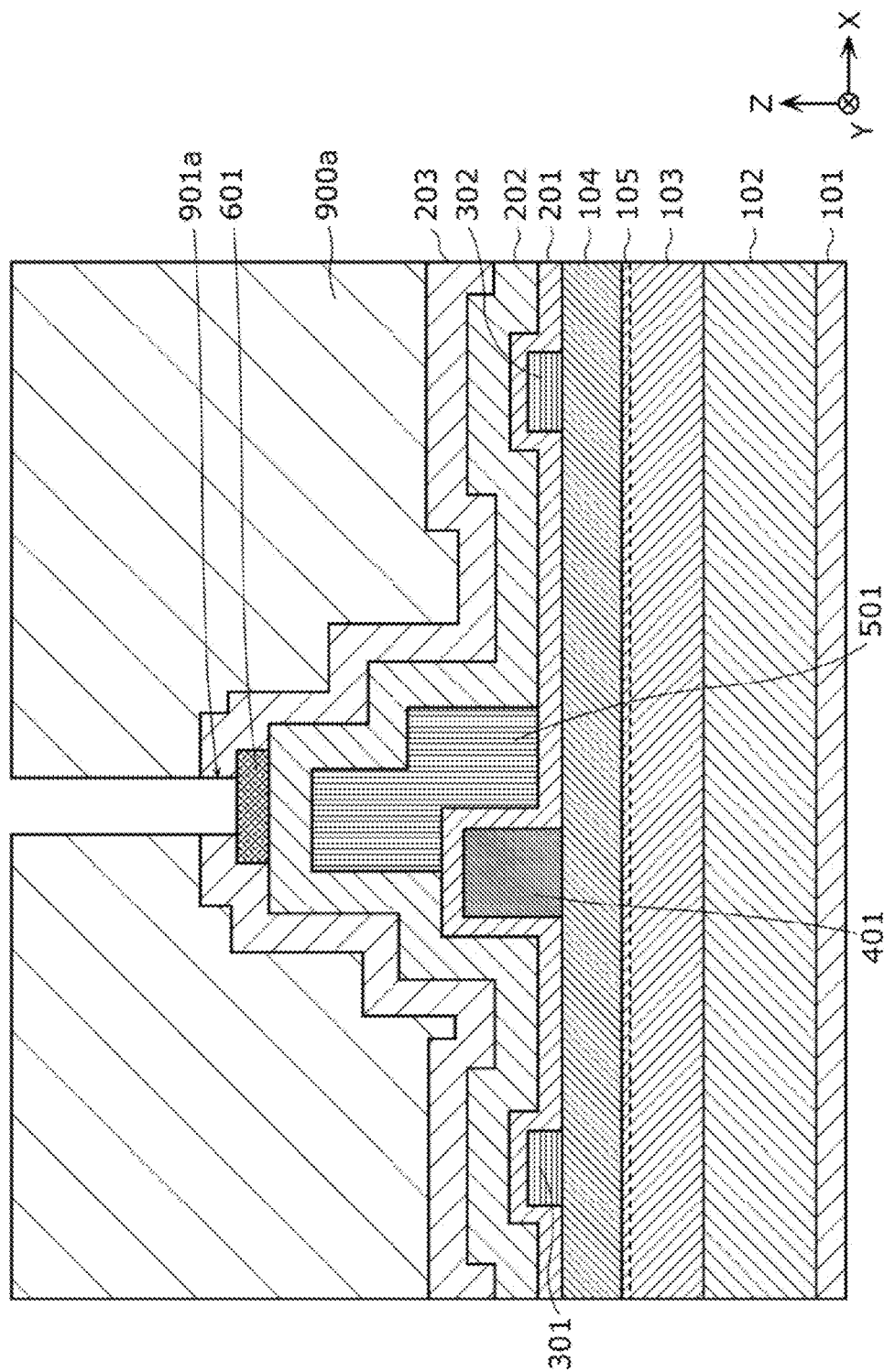
FIG. 18B is the ninth cross-sectional view corresponding to line IIb-IIb in FIG. 1, for explaining the method of fabricating the semiconductor device for high-frequency amplification according to Embodiment 1.

After photoresist 600 is removed with an organic solvent, as illustrated in FIGS. 18A and 18B, as third insulating layer 203, SiN is formed with a thickness of 200 nm above second insulating layer 202 and resistor 601 by the plasma CVD method. Photoresist 900a having opening 901a for connection to the resistor is formed above third insulating layer 203, and then a portion of third insulating layer 203 is removed using the opening of photoresist 900a by dry etching. It should be noted that as illustrated in FIG. 18A, third insulating layer 203 is not removed in the portion where second interconnect layer 901 is not to be formed.

Figure 19A:
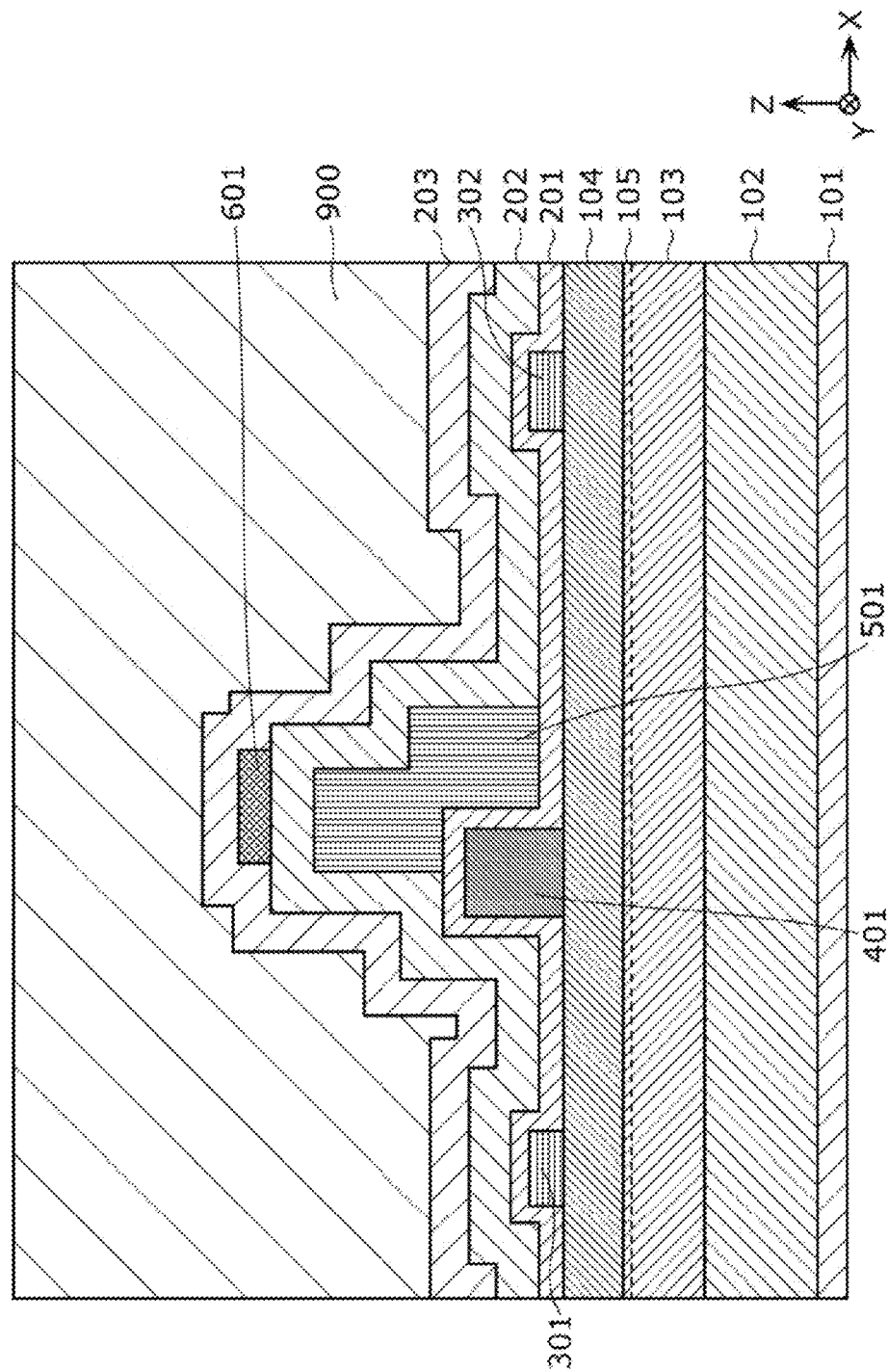
FIG. 19A is the tenth cross-sectional view corresponding to line IIa-IIa in FIG. 1, for explaining the method of fabricating the semiconductor device for high-frequency amplification according to Embodiment 1.
Figure 19B:
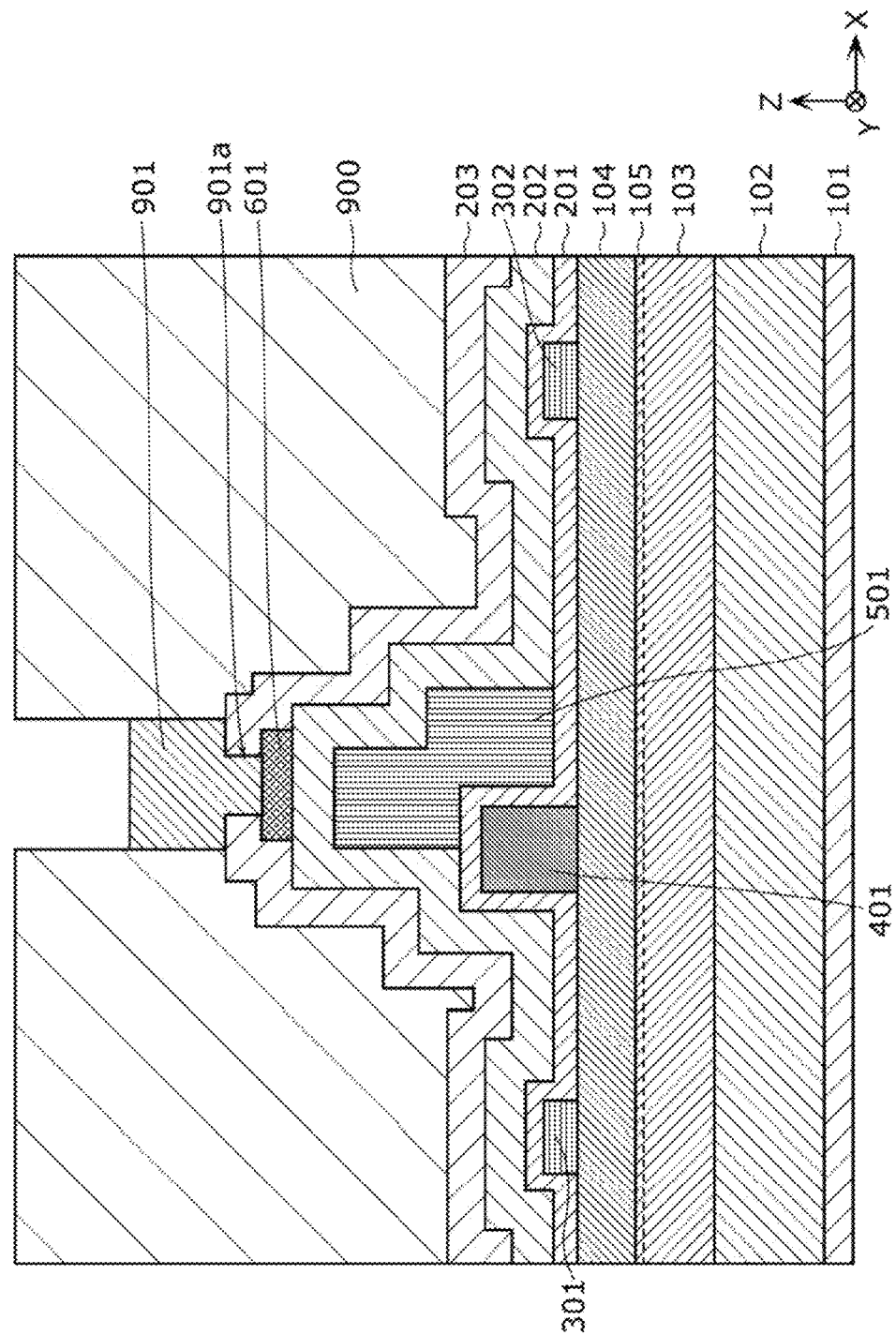
FIG. 19B is the eleventh cross-sectional view corresponding to line IIb-IIb in FIG. 1, for explaining the method of fabricating the semiconductor device for high-frequency amplification according to Embodiment 1.

After photoresist 900a is removed by ashing, as illustrated in FIGS. 19A and 19B, photoresist 900 having an opening for a second interconnect layer 901 area is formed above third insulating layer 203 and opening 901a for connection to the resistor, and Ti and Au are sequentially deposited with each having a thickness of 50 nm in the opening of photoresist 900 by vapor deposition. Then, Au is formed with a thickness of 2.0 μm by plating, and photoresist 900 is removed with an organic solvent, thereby forming second interconnect layer 901.

Figure 20A:
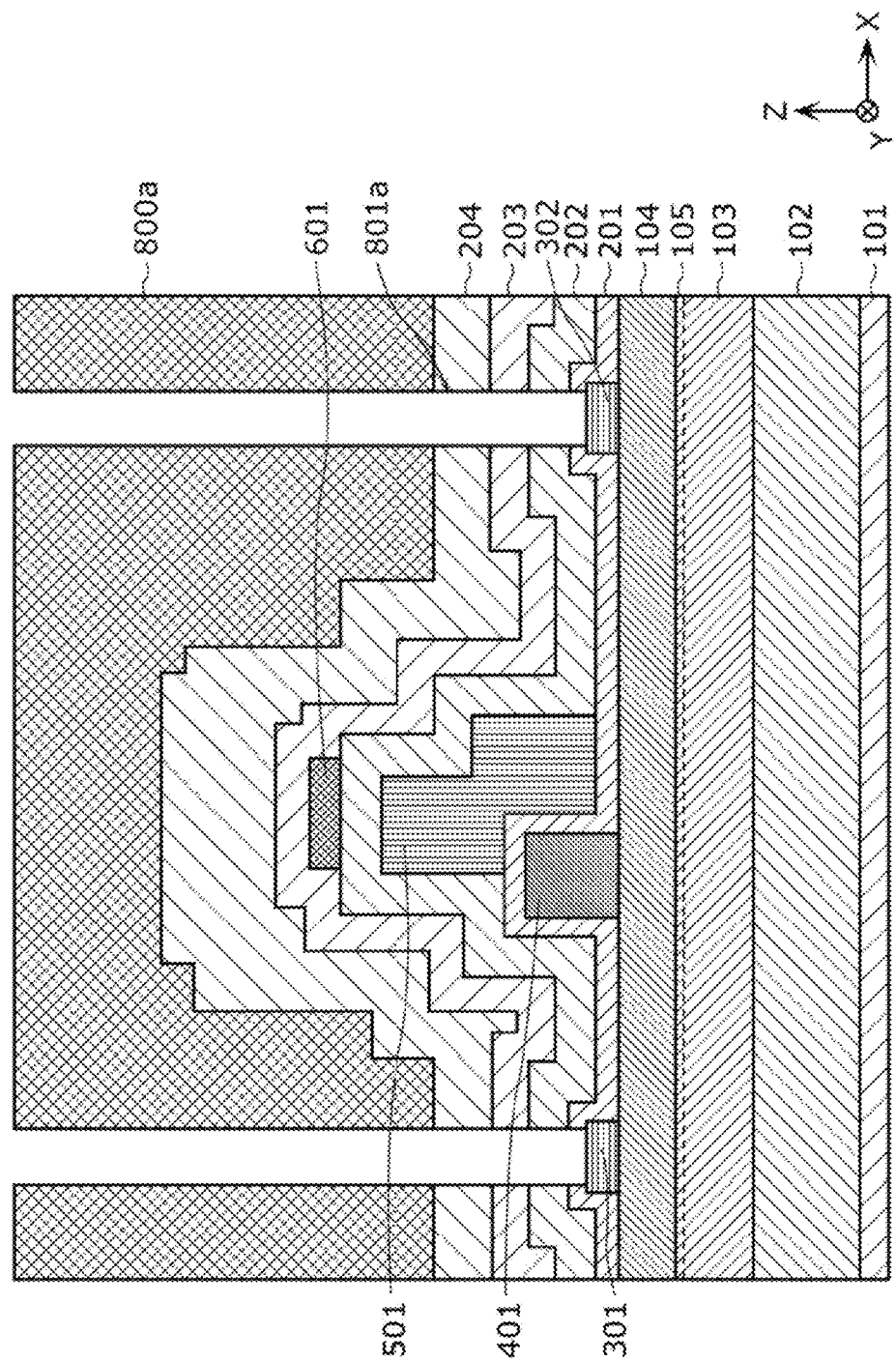
FIG. 20A is the twelfth cross-sectional view corresponding to line IIa-IIa in FIG. 1, for explaining the method of fabricating the semiconductor device for high-frequency amplification according to Embodiment 1.
Figure 20B:
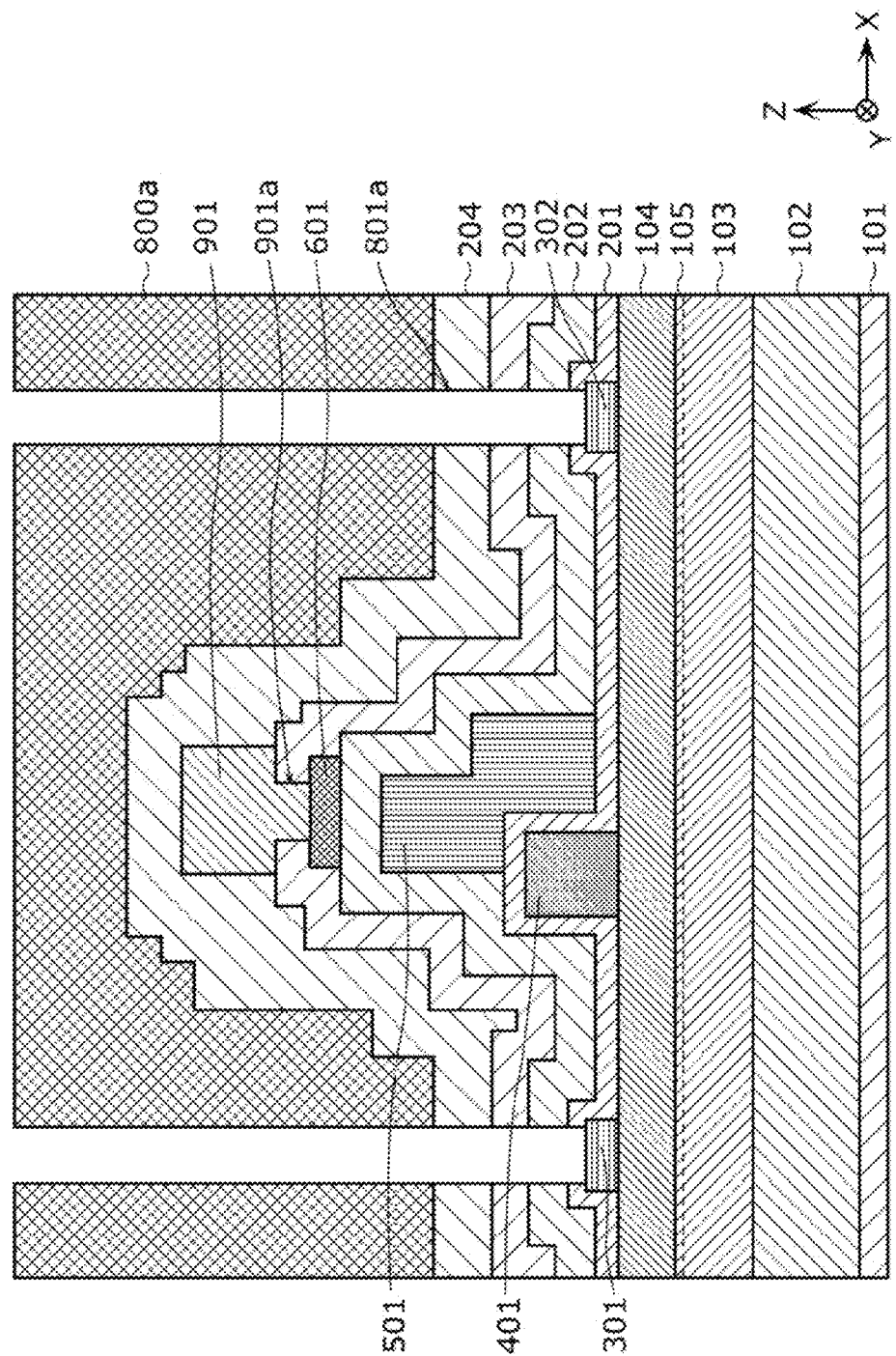
FIG. 20B is the thirteenth cross-sectional view corresponding to line IIb-IIb in FIG. 1, for explaining the method of fabricating the semiconductor device for high-frequency amplification according to Embodiment 1.

Then, as illustrated in FIGS. 20A and 20B, as fourth insulating layer 204, SiN is formed with a thickness of 200 nm above third insulating layer 203 and second interconnect layer 901 by the plasma CVD method. Photoresist 800a having openings for areas for openings 801a for connection to the source and drain electrodes is formed. Then, with the use of the openings of photoresist 800a, openings are formed in fourth insulating layer 204, third insulating layer 203, second insulating layer 202, and first insulating layer 201 by dry etching.

Figure 21A:
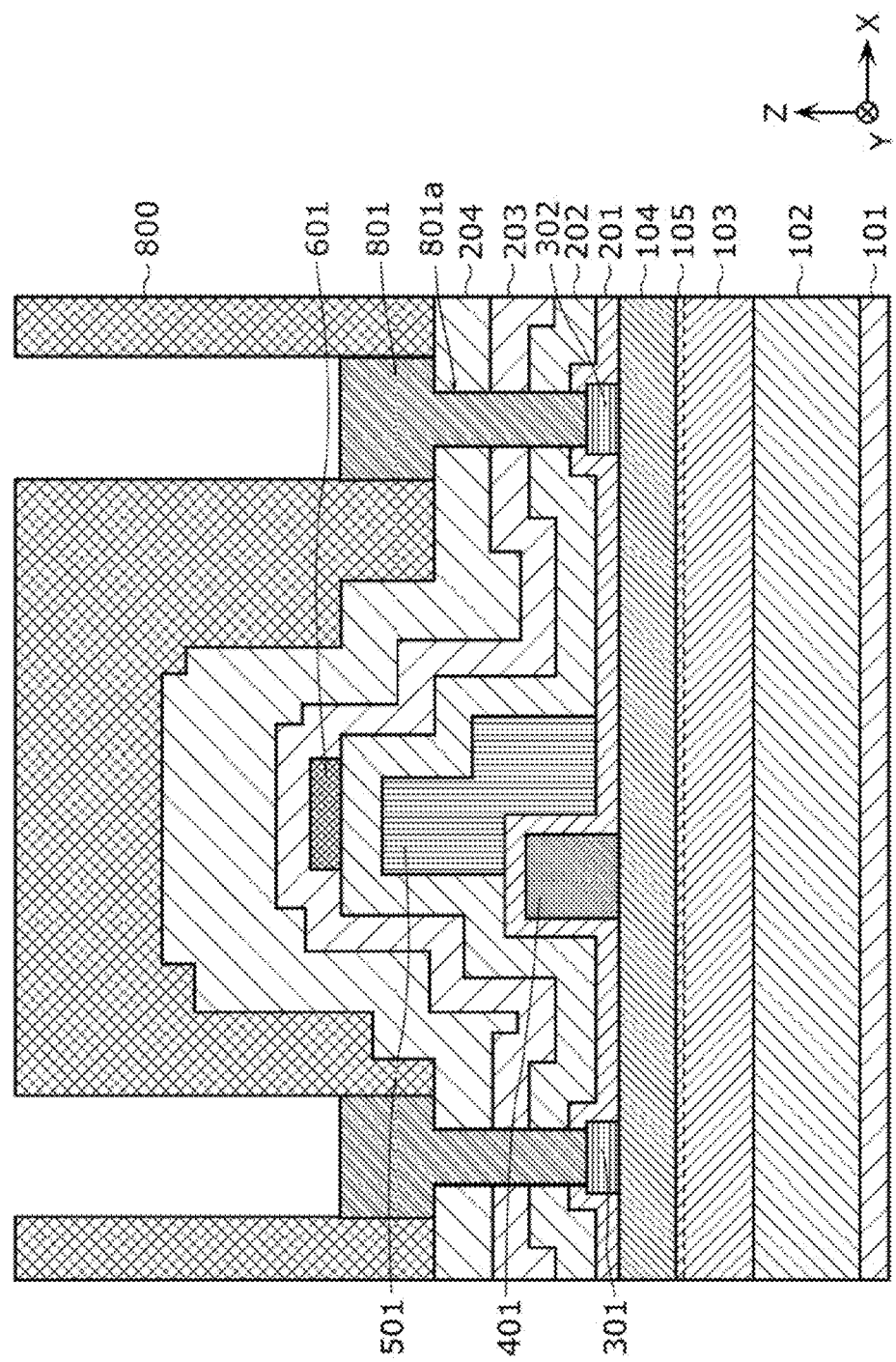
FIG. 21A is the fourteenth cross-sectional view corresponding to line IIa-IIa in FIG. 1, for explaining the method of fabricating the semiconductor device for high-frequency amplification according to Embodiment 1.
Figure 21B:
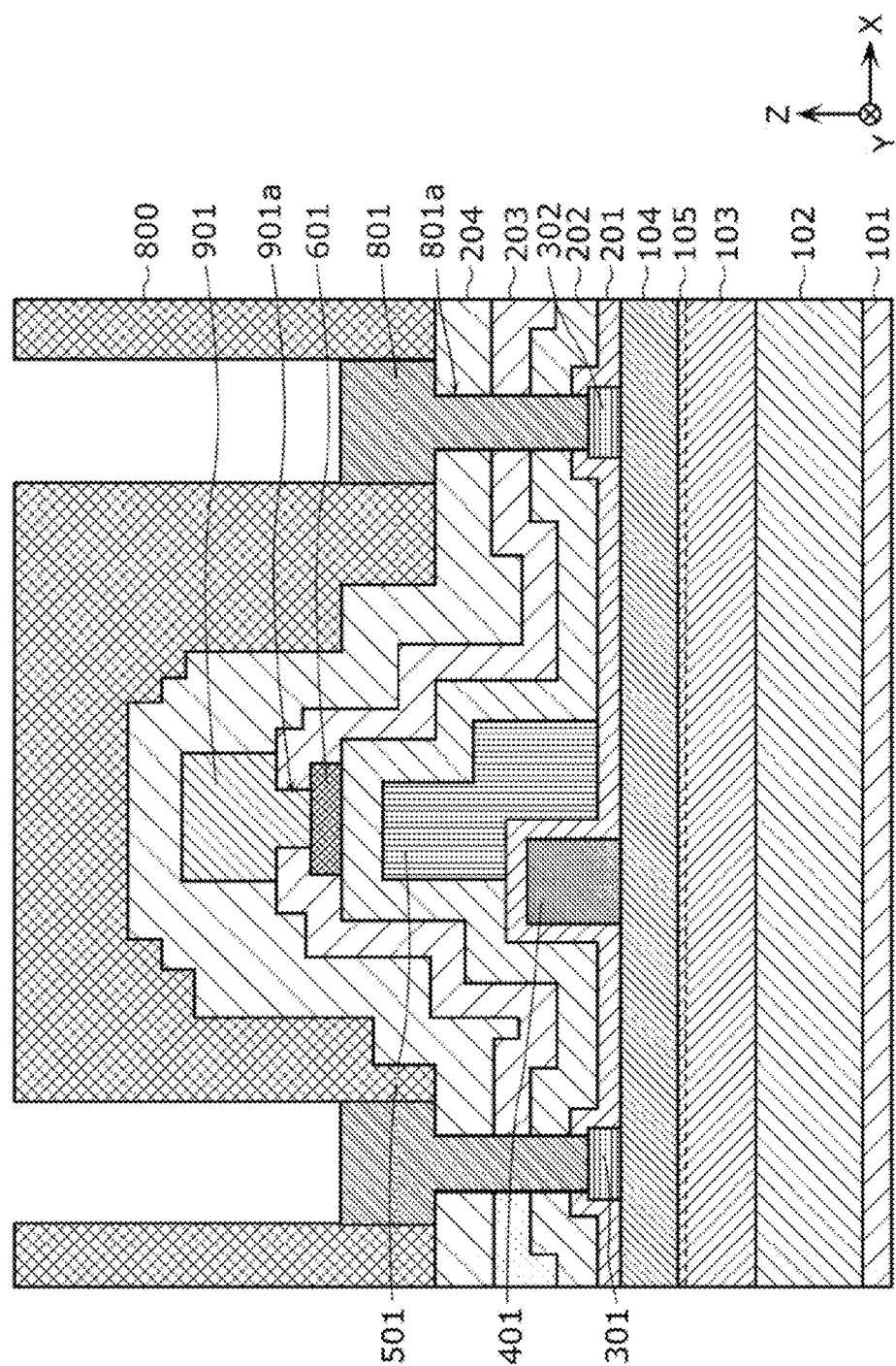
FIG. 21B is the fifteenth cross-sectional view corresponding to line IIb-IIb in FIG. 1, for explaining the method of fabricating the semiconductor device for high-frequency amplification according to Embodiment 1.

After photoresist 800a is removed by ashing, as illustrated in FIGS. 21A and 21B, photoresist 800 having openings for first interconnect layer 801 areas is formed above fourth insulating layer 204 and openings 801a for connection to the source and drain electrodes, and Ti and Au are sequentially deposited with each having a thickness of 50 nm in the openings of photoresist 800 by vapor deposition. Then, Au is formed with a thickness of 3.0 μm by plating, thereby forming first interconnect layer 801. In addition, photoresist 800 also has openings at the positions corresponding to first resistor terminal 805 and second resistor terminal 806. In addition to first interconnect layer 801 illustrated in FIGS. 21A and 21B, first resistor terminal 805 and second resistor terminal 806 are formed.

Then, by removing photoresist 800 with an organic solvent, semiconductor device for high-frequency amplification 100 according to Embodiment 1 illustrated in FIGS. 1, 2A, and 2B is formed.

Thus, the semiconductor devices for high-frequency amplification according to one aspect or aspects of the present disclosure are described above on the basis of the embodiments and variations, the present disclosure is not limited to the embodiments and variations. The one aspect or aspects of the present disclosure may include, within the scope of the present disclosure, embodiment(s) obtained by making various changes envisioned by those skilled in the art to each embodiment and embodiment(s) obtained by combining structural elements described in the different embodiments.

For instance, the semiconductor devices for high-frequency amplification according to the embodiments and variations may be used as carrier amplifiers that perform a class AB operation or a class B operation or may be used as peak amplifiers that perform a class C operation. For instance, the semiconductor devices for high-frequency amplification may be used as Doherty amplifiers configured by a combination of a carrier amplifier and a peak amplifier.

In addition, the first terminal pad and the second terminal pad in the embodiments and variations are provided at the uppermost portion of the semiconductor device for high-frequency amplification, and correspond to portions of the uppermost interconnect layers (e.g., first interconnect layer 801 and second interconnect layer 901) which are exposed due to openings formed in an insulating layer (not illustrated) covering the uppermost interconnect layers. In the plan view, the openings have sizes smaller than the shapes of the uppermost interconnect layers including the first terminal pad and the second terminal pad.

In addition, in the embodiments and variations, examples in which the semiconductor device for high-frequency amplification is bonded by face-up bonding, which is bonding to, for example, a packaging substrate with the plane of the first and second terminal pads facing upward (in the opposite direction from the packaging substrate) are described. However, the semiconductor device for high-frequency amplification may be bonded by face-down bonding, which is bonding to, for example, a packaging substrate with the plane of the first and second terminal pads facing downward (facing the packaging substrate).

For instance, for the face-up bonding, a source pad (not illustrated) may be formed, as the first terminal pad, in first interconnect layer 801 having a source electric potential, and the source pad may be connected to a GND pattern on the packaging substrate by, for example, a wire, thereby supplying a source voltage. A back surface metal may be connected to the GND pattern on the packaging substrate, thereby supplying a source voltage.

For instance, for the face-down bonding, the source pad may be formed, as the first terminal pad, in first interconnect layer 801 having a source electric potential, and connected to the GND pattern on the packaging substrate with, for example, solder bumps, thereby supplying a source voltage.

INDUSTRIAL APPLICABILITY

Since having high responsiveness in detection of a temperature change during operation, the semiconductor devices for high-frequency amplification according to the present disclosure are useful in, for example, an amplifier for communication in combination with a temperature detection technique.

REFERENCE SIGNS LIST 100, 100A1, 100A2, 100B1 to 100B9, 100C1 to 100C4, 100D1 to 100D3, 100E1 to 100E3, 200, 200A, 200B semiconductor device for high-frequency amplification (semiconductor device for power amplification)
101 substrate
102 buffer layer
103 first nitride semiconductor layer
104 second nitride semiconductor layer
105 two-dimensional electron gas layer
201 first insulating layer
202 second insulating layer
202a recess
203 third insulating layer
204 fourth insulating layer
300, 400, 500, 600, 800, 800a, 900, 900a photoresist
301 source electrode
302 drain electrode
401 gate electrode
501 source field plate electrode (field plate)
601 resistor
601a opening for connecting resistor and source field plate electrode
602a virtual line (virtual straight line)
602b, 602d, 602e virtual line
603 first resistor
604 second resistor
701 active region
704 non-active region
801 first interconnect layer
801a opening for connection to source and drain electrodes
801b opening for connection to source field plate electrode
801c opening for connection to gate electrode
801d opening for connection to second interconnect layer
801e, 901a opening for connection to resistor
802 source via hole
803 drain terminal (first terminal pad)
804 gate terminal (first terminal pad)
805 first resistor terminal (second terminal pad)
806 second resistor terminal (second terminal pad)
807 third resistor terminal (second terminal pad)
808 fourth resistor terminal (second terminal pad)
901 second interconnect layer
Cx, Cy long dashed short dashed line
L1, L2 length
P1, P2 point
P3 intersection point
R dashed-line region

The invention claimed is:
1. A semiconductor device for power amplification, comprising:
a substrate;
a first nitride semiconductor layer provided above the substrate;
a second nitride semiconductor layer provided above the first nitride semiconductor layer and having a band gap greater than a band gap of the first nitride semiconductor layer;
a two-dimensional electron gas layer provided on a side where the first nitride semiconductor layer is present, relative to an interface between the first nitride semiconductor layer and the second nitride semiconductor layer;
a source electrode and a drain electrode spaced apart from each other above the first nitride semiconductor layer, and each electrically connected to the two-dimensional electron gas layer;
a gate electrode spaced apart from the source electrode and the drain electrode and in contact with the second nitride semiconductor layer; and
a field plate having an end closer to the drain electrode that is positioned between the gate electrode and the drain electrode and having an electric potential identical to an electric potential of the source electrode, wherein
in a plan view of the substrate, the substrate is divided into an active region including the two-dimensional electron gas layer and a non-active region without the two-dimensional electron gas layer,
the active region includes:
a high-electron-mobility transistor including the source electrode, the drain electrode, and the gate electrode; and
a resistor for detecting a temperature provided above the second nitride semiconductor layer, and
the non-active region includes:
a first terminal pad connected to the drain electrode or the gate electrode; and
a second terminal pad connected to the resistor.
2. The semiconductor device for power amplification according to claim 1, wherein
in the plan view, a longitudinal direction of the resistor corresponds to a first direction that is an extending direction of the gate electrode.
3. The semiconductor device for power amplification according to claim 2, wherein:
the field plate is disposed above the second nitride semiconductor layer,
in a cross-sectional view of the substrate, an entirety of the resistor is disposed on a side where the gate electrode is present, relative to a virtual straight line passing through a lowest point of an end of the gate electrode that is closer to the drain electrode and a lowest point of the end of the field plate that is closer to the drain electrode, and
an end of the resistor that is closer to the source electrode is closer to the drain electrode than an end of the source electrode that is closer to the drain electrode is.
4. The semiconductor device for power amplification according to claim 2, wherein
in a second direction orthogonal to the first direction in the plan view, an end of the resistor that is closer to the drain electrode is closer to the source electrode than the end of the field plate that is closer to the drain electrode is.

5. The semiconductor device for power amplification according to claim 2, wherein
in a second direction orthogonal to the first direction in the plan view, an end of the resistor that is closer to the source electrode is closer to the drain electrode than an end of the field plate that is closer to the source electrode is.

6. The semiconductor device for power amplification according to claim 2, wherein
in the plan view, when a length of the active region in a second direction orthogonal to the first direction is defined as L1,
in the second direction, the resistor is disposed in an area within a distance of L1/8 from a center of the active region.

7. The semiconductor device for power amplification according to claim 6, wherein
the resistor includes a first resistor and a second resistor, and
in the second direction in the plan view, the first resistor is disposed in the area within the distance of L1/8 from the center of the active region, and the second resistor is disposed in an area beyond the distance of L1/8 from the center of the active region.

8. The semiconductor device for power amplification according to claim 2, wherein
in the plan view, when a length in the first direction of the active region is defined as L2,
the resistor has a length in the first direction of less than L2/2.

9. The semiconductor device for power amplification according to claim 8, wherein
in the first direction in the plan view, the resistor is disposed in an area within a distance of L2/4 from a center of the active region.

10. The semiconductor device for power amplification according to claim 9, wherein
the resistor includes a first resistor and a second resistor, and
in the first direction in the plan view, the first resistor is disposed in the area within the distance of L2/4 from the center of the active region, and the second resistor is disposed in an area beyond the distance of L2/4 from the center of the active region.

11. The semiconductor device for power amplification according to claim 2, wherein
in the plan view, when a length in the first direction of the active region is defined as L2,
the resistor has a length in the first direction of L2/2 or longer.

12. The semiconductor device for power amplification according to claim 11, wherein
the resistor has a length in the first direction of L2 or longer and extends into the non-active region.

13. The semiconductor device for power amplification according to claim 1, wherein
in the plan view, a longitudinal direction of the resistor corresponds to a second direction orthogonal to a first direction that is an extending direction of the gate electrode.

14. The semiconductor device for power amplification according to claim 13, wherein
in the plan view, when a length of the active region in the first direction is defined as L2,
in the first direction in the plan view, the resistor is disposed in an area within a distance of L2/4 from a center of the active region.

15. The semiconductor device for power amplification according to claim 14, wherein
the resistor includes a first resistor and a second resistor, and
in the first direction in the plan view, the first resistor is disposed in the area within the distance of L2/4 from the center of the active region, and the second resistor is disposed in an area beyond the distance of L2/4 from the center of the active region.

16. The semiconductor device for power amplification according to claim 1, wherein
the resistor includes a plurality of resistors.

17. The semiconductor device for power amplification according to claim 1, wherein
in the plan view,
the first terminal pad is disposed in the non-active region aligned with the active region in an extending direction of the gate electrode, and
the second terminal pad is disposed in the non-active region aligned with the active region in a direction orthogonal to the extending direction.

18. The semiconductor device for power amplification according to claim 1, wherein
one end of the resistor has an electric potential identical to an electric potential of the source electrode.

* * * * *